US 11,316,169 B2

(12) United States Patent
Song et al.

(10) Patent No.: US 11,316,169 B2
(45) Date of Patent: Apr. 26, 2022

(54) METHODS FOR FORMING ELECTROCATALYST STRUCTURES AND ELECTRODES COMPRISING SAME

(71) Applicant: West Virginia University, Morgantown, WV (US)

(72) Inventors: Xueyan Song, Pittsburgh, PA (US); Yun Chen, Pittsburgh, PA (US); Kirk Gerdes, Morgantown, WV (US)

(73) Assignee: West Virginia University, Morgantown, WV (US)

( * ) Notice: Subject to any disclaimer, the term of this patent is extended or adjusted under 35 U.S.C. 154(b) by 273 days.

(21) Appl. No.: 16/439,277

(22) Filed: Jun. 12, 2019

(65) Prior Publication Data
US 2019/0379057 A1    Dec. 12, 2019

Related U.S. Application Data

(60) Provisional application No. 62/683,877, filed on Jun. 12, 2018.

(51) Int. Cl.
*C23C 16/455* (2006.01)
*H01M 4/86* (2006.01)
(Continued)

(52) U.S. Cl.
CPC .......... *H01M 4/8657* (2013.01); *C23C 16/06* (2013.01); *C23C 16/406* (2013.01);
(Continued)

(58) Field of Classification Search
CPC .. C23C 16/06; C23C 16/406; C23C 16/45555
See application file for complete search history.

(56) References Cited

U.S. PATENT DOCUMENTS

| 2008/0182012 A1* | 7/2008 | Fisher | H01M 4/8853 |
| | | | 427/115 |
| 2010/0177462 A1* | 7/2010 | Adzic | B82Y 30/00 |
| | | | 361/502 |

(Continued)

FOREIGN PATENT DOCUMENTS

WO    WO 2018/049065 A1 *   3/2018   ............. B01J 23/40

OTHER PUBLICATIONS

Onn, Tzia Ming, et al., "Atomic Layer Deposition on Porous Materials: Problems with Conventional Approaches to Catalyst and Fuel Cell Electrode Preparation". Inorganics, 2018, 6, 34, pp. 1-20.*

(Continued)

*Primary Examiner* — Bret P Chen

(57) ABSTRACT

Described herein are methods of forming an electrocatalyst structure on an electrode, comprising depositing a first layer on the electrode using atomic layer deposition (ALD), wherein the first layer comprises a plurality of discrete nanoparticles of a first electrocatalyst, and depositing one or more of a second layer on the first layer and the electrode using ALD, wherein the one or more second layer comprises a second electrocatalyst, wherein the first layer and the one or more second layers, collectively, form a multi-layer electrocatalyst structure on the electrode. Also described are electrodes having a multi-layer electrocatalyst structure. This abstract is intended as a scanning tool for purposes of searching in the particular art and is not intended to be limiting of the present disclosure.

14 Claims, 41 Drawing Sheets

(51) Int. Cl.
*H01M 4/88* (2006.01)
*C23C 16/40* (2006.01)
*C23C 16/06* (2006.01)
*H01M 4/90* (2006.01)

(52) U.S. Cl.
CPC ..... *C23C 16/45555* (2013.01); *H01M 4/8621* (2013.01); *H01M 4/8867* (2013.01); *H01M 4/9025* (2013.01); *H01M 4/9058* (2013.01)

(56) References Cited

U.S. PATENT DOCUMENTS

| | | | | |
|---|---|---|---|---|
| 2010/0216632 | A1* | 8/2010 | Adzic | H01M 4/926 502/101 |
| 2011/0143263 | A1* | 6/2011 | Shirvanian | H01M 4/8807 429/523 |
| 2011/0165496 | A1* | 7/2011 | Shirvanian | H01M 4/8642 429/483 |
| 2013/0177838 | A1* | 7/2013 | Wang | B01J 23/52 429/524 |
| 2016/0289852 | A1* | 10/2016 | Cui | C25B 11/075 |
| 2016/0351919 | A1* | 12/2016 | Cash | H01M 8/0245 |
| 2017/0062799 | A1* | 3/2017 | Song | H01M 8/1246 |
| 2017/0309921 | A1* | 10/2017 | Gath | H01M 4/8605 |
| 2019/0013156 | A1* | 1/2019 | Penelas Perez | C25B 11/055 |
| 2019/0109344 | A1* | 4/2019 | Wang | B01J 35/002 |
| 2019/0280309 | A1* | 9/2019 | Steinbach | H01M 8/10 |

OTHER PUBLICATIONS

Cheng, Niancai, et al., "Electrocatalysts by atomic layer deposition for fuel cell applications". Nano Energy (2016) 29, 220-242.*

Cimen, Yasemin, et al., "Atomic Layer Deposition of Ultrathin Nickel Sulfide Films and Preliminary Assessment of Their Performance as Hydrogen Evolution Catalysts". Langmuir, 32(46), Nov. 2016, pp. A-H.*

Anitha, V.C., et al., "Anodic TiO2nanotubes decorated by Pt nanoparticles using ALD:An efficient electrocatalyst for methanol oxidation". Journal of Catalysis 365 (2018) 86-93.*

Grillo, Fabio, et al., "Understanding and Controlling the Aggregative Growth of Platinum Nanoparticles in Atomic Layer Deposition: An Avenue to Size Selection". J. Phys. Chem. Lett. 2017, 8, 975-983.*

Chen, Niancai, et al., "Electrocatalysts by atomic layer deposition for fuel cell applications". Nano Energy (2016) 29, 220-242.*

Ho, Thi Anh, et al., "Metallic Ni3S2 Films Grown by Atomic Layer Deposition as an Efficient and Stable Electrocatalyst for Overall Water Splitting". AC Applied Materials & Interfaces, 2018, 10, 12807-12815.*

Steier, Ludmilla, et al., "Stabilizing organic photocathodes by lowtemperature atomic layer deposition of TiO2". Sustainable Energy & Fuels, 2017, 1, 1915-1920.*

* cited by examiner

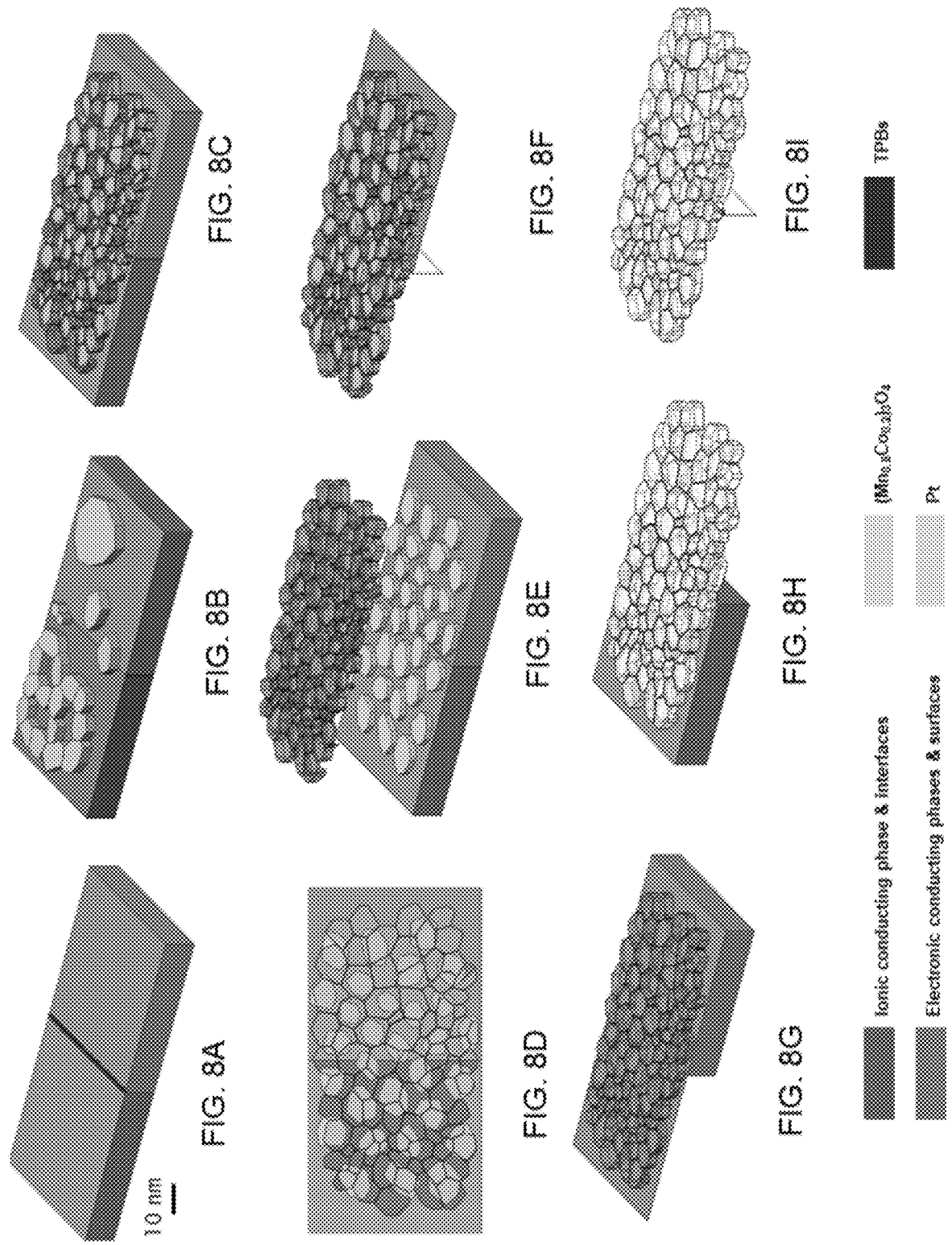

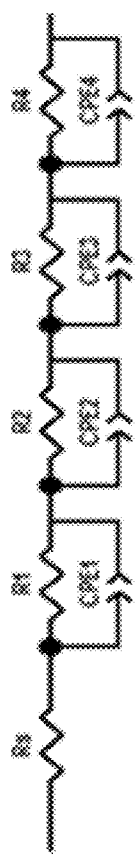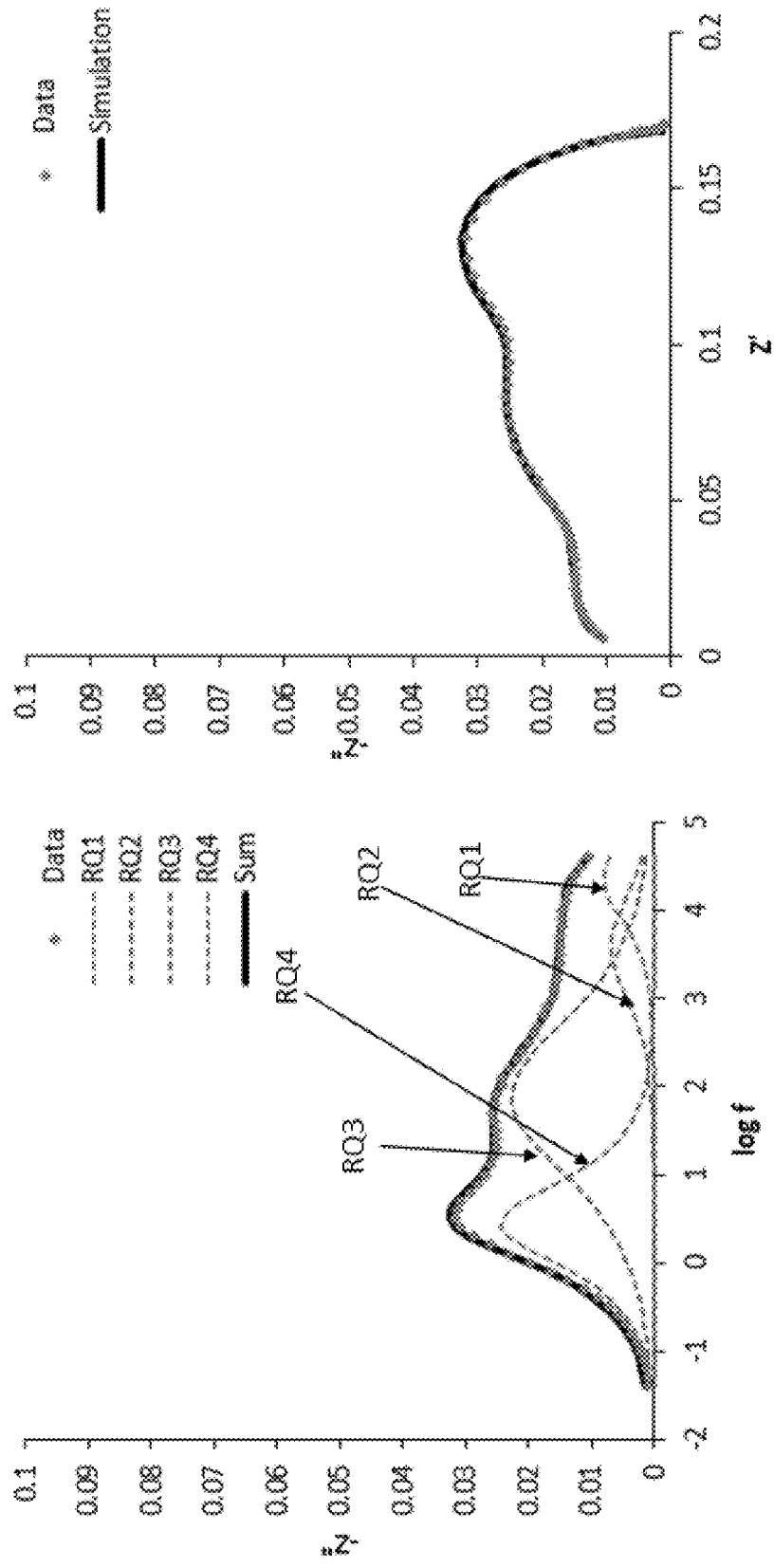
FIG. 15A
FIG. 15B

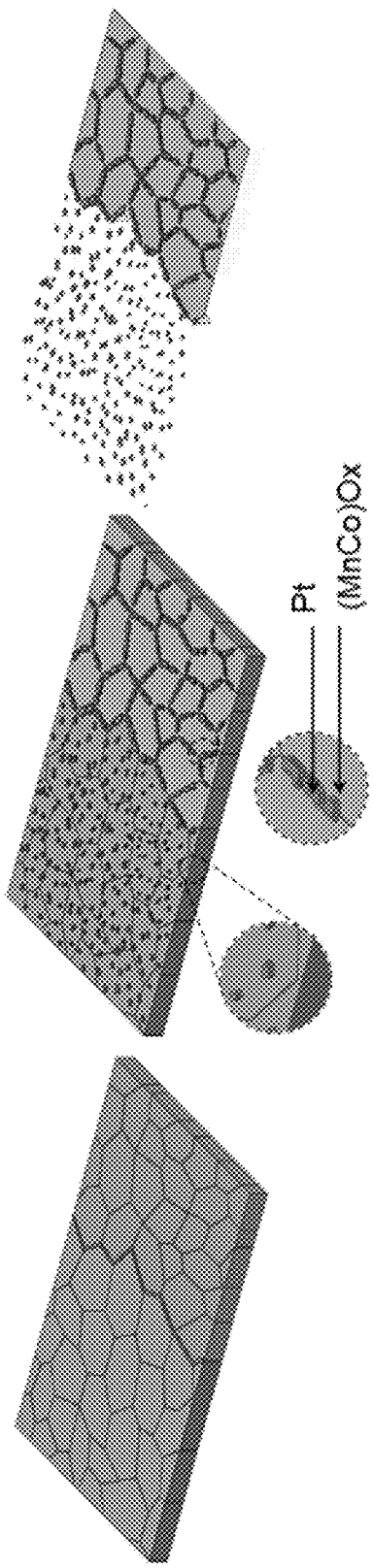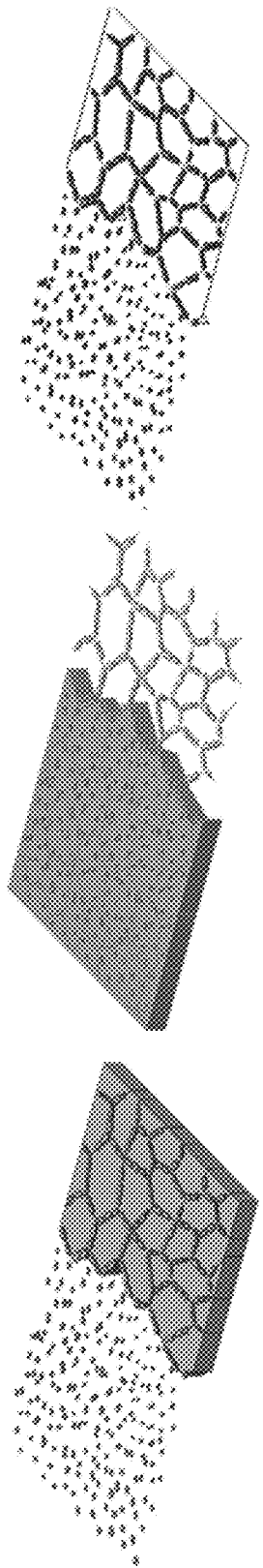
FIG. 21A  FIG. 21B  FIG. 21C  FIG. 21D  FIG. 21E  FIG. 21F

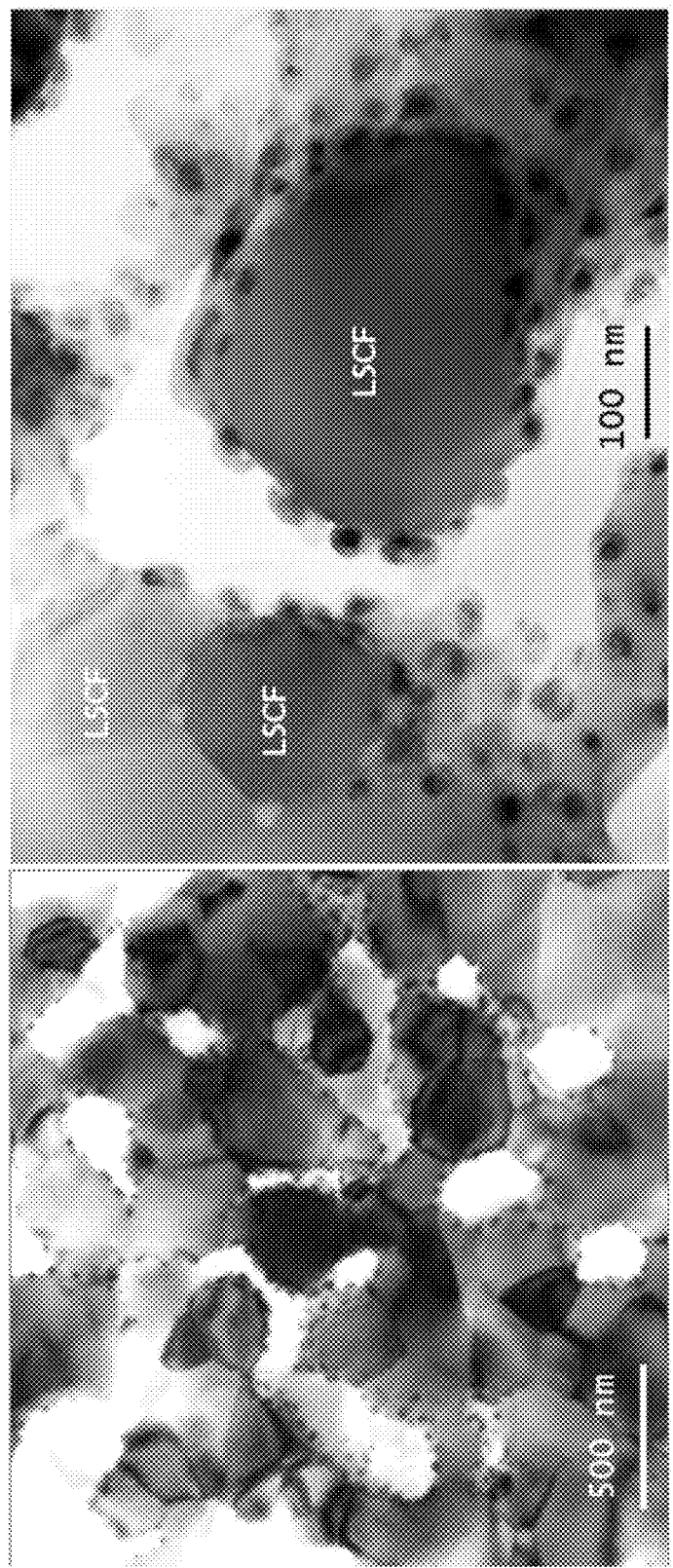

METHODS FOR FORMING ELECTROCATALYST STRUCTURES AND ELECTRODES COMPRISING SAME

CROSS-REFERENCE TO RELATED APPLICATIONS

This application claims the benefit of U.S. Provisional Application No. 62/683,877, filed on Jun. 12, 2018, which is incorporated herein by reference in its entirety.

STATEMENT REGARDING FEDERALLY SPONSORED RESEARCH

This disclosure was made with U.S. Government support under grant numbers DE-FE0023386 and DE-FE 0031251, awarded by the U.S. Department of Energy, and under grant number NSF-DMR 1254594, awarded by the National Science Foundation. The U.S. government has certain rights in the disclosure.

BACKGROUND

Ceramic fuel cells have gained increasing attention due to their environmental benign, high energy conversion efficiency and excellent fuel flexibility for power generation (Ref. Nos. 1-9). In comparison with the emerging proton conductor fuel cells (Ref. Nos. 10-12) that are still in the early stage of research and facing various challenges to be commercially viable, Solid Oxide Fuel Cells (SOFCs) (Ref. Nos. 104-107) are nowadays commercially available with applications including stationary power supply and advanced hybrid fuel cell and engine systems that have the potential of achieving ultra-high efficiency of greater than 70%. (Ref. Nos. 108-109) Mature materials systems developed for Solid Oxide Fuel Cells (SOFCs) consisting yttria-stabilized zirconia (YSZ) electrolyte are proven to be stable over several thousand hours of operation, and commercially available. (Ref. Nos. 13-17) However, efforts are ongoing to further improve the current SOFC technology, e.g., to improve power density, long-term stability and overall cost competitiveness as compared to other power generation technologies. (Ref. No. 18).

The typical power density of a YSZ-based commercially-available SOFC is currently reported to be in the range of about 0.2-0.8 W/cm$^2$ depending on the cell configuration (either electrolyte supported or anode supported), cathode materials, and the cell operation conditions. (Ref. Nos. 15-16, 19-20) One of the major issues for impeding SOFC power density is the cathode resistance. (Ref. No. 21) The high activation energy for oxygen reduction reaction (ORR) in the cathode causes most of voltage loss in the state-of-the-art SOFCs. (Ref. Nos. 22-26)

Although research of new materials with higher electrocatalytic performance is actively progressing, (Ref. Nos. 27-29) the strict properties requirement on the cathode materials cannot be easily satisfied. For their practical applications in the SOFC stacks, a new cathode material should simultaneously possess chemical compatibility and matching thermal expansion coefficient with the electrolyte, high electrocatalytic activities, high ionic and electrical conductivities, and simultaneous extreme stabilities at high temperatures (650-850° C.) for extended period of electrochemical operations.

Parallel to the effort of developing novel cathode materials, modifying the internal surfaces of the cathodes to improve the cell performance is also ongoing. For example, modification of the internal surface of the well-developed lanthanum strontium manganite (LSM)/YSZ or mixed ionic and electronic conducting lanthanum strontium cobalt ferrite (LSCF)/samarium doped ceria (SDC) cathode using solution based infiltration of various electrocatalyst appears to be the most reliable approach to improve the cell performance. For SOFC cathode that are engineered to be porous to create internal surface area for accessing the reactant gas, the backbone of the electrode is mainly responsible for the transport process, while the internal surface is where the electrochemical reactions occur and serve as the pathway for reactant species ($O^{2-}$ and $e^-$) exchange and catalytic reactions. (Ref. Nos. 30-34)

During the past 15 years, a deeper understanding has been developed for the solution-based infiltration of various electrocatalysts. (Ref. Nos. 18, 35-41, 116-118) Nevertheless, the solution-based infiltration is unable to produce conformal and uniform coating layer that is desired to maximize the catalytic activity on porous electrode from the as-made SOFCs. For solution-based infiltration of catalysts with random distribution on the backbone surface, the degradation associated with the coarsening of nano-particles and loss of surface area and surface catalytic activity is potentially acute and problematic. (Ref. No. 18) Especially, due to the lack of the ability to control the nanostructure of infiltrated catalyst which is additively placed on the internal surface of the backbone, the cell performance enhancement through solution-based infiltration is limited to about 30% for commercial cells. (Ref. No. 40) Further performance improvement for the well-developed SOFC through modifying the internal surface of porous cathode and introducing more active additive catalysts bears immediate impact for commercial application. Nevertheless, it requires novel infiltration techniques to effectively and economically introduce the high density active electrocatalyst.

Amongst the various electrocatalysts, precious metal platinum (Pt) remains to be one of the most efficient oxygen reduction catalysts employed for various fuel cells operated at different temperatures, however the high cost of Pt prevents its large-scale applications. In recent years, chemical vapor based Atomic Layer Deposition (ALD) (Ref. Nos. 110-115) has been demonstrated to be able to create a conformal and uniform surface coating layer of the electrocatalyst with thickness down to the atomic scale. Using such an approach could help minimize loading of catalyst into the cathode of as-fabricated cells to further improve the SOFC performance. (Ref. No. 119) For example, when the ALD layer is about 5 nm in thickness and contains discrete Pt grains of about 3 nm dimension, the loading of Pt is estimated to be about $1.5 \times 10^{-3}$ mg/cm$^2$, which is significantly lower than the target loading of <0.1 mg/cm$^2$ that needs to be achieved for proton exchange membrane fuel cells (Ref. No. 120) in automotive applications. (Ref. No. 121)

However, for SOFC operated at high temperatures of 750° C. or higher, once the ALD mono-layer of unary Pt is applied to the LSM/YSZ cathode of cells, it has been observed that the power density enhancement induced by ALD coating is limited to be ~140%. (Ref. No. 119) Due to the electrochemical operation, Pt in the ALD layer undergoes immediate agglomeration, e.g., as-deposited particles having a size of about 3 nm agglomerate during operation to provide particles having about 70 nm in dimensions, resulting in loss of catalytic surface area. (Ref. No. 119)

For the LSM/YSZ cathode, Pt appear to be agglomerate at the LSM/YSZ/air interface or the triple phase boundaries (TPBs) where the electrochemical reactions are principally taking place. Pinning the Pt catalyst so that it remains nano-sized and with uniform distribution on the ORR active sites is desirable to further boost the cell performance while minimizing the Pt loading in the ALD layer. Conventional means for pinning Pt require the simultaneous implantation of high density TPBs and manipulation of both the mass and charge transfer through the infiltrated materials placed on the internal surface of the backbone, since LSM does not exhibit high oxygen ionic conductivity for oxygen ions moving through, while YSZ does not possess electrocatalytic capabilities. Furthermore, conventional methods for adding TPBs require the intimate implantation of an ionic conductor on the electrocatalytic LSM surface directly, and/or the addition of electrocatalyst on ionic conducting YSZ surface precisely. For those additive TPBs to be effective, the newly implanted TPBs must be dense, e.g., with spacing of <50 nm apart to form percolating network during polarization. Such selective implantation of ionic conductor and electrocatalyst on LSM and YSZ surfaces separately, and simultaneous introduction of high-density TPBs have been almost impossible to achieve through various solution-based infiltration methods.

Despite advances in SOFC research, there is still a desire to continue to improve the performance of SOFCs such as by optimizing the electrocatalyst deposition and utilization. These needs and other needs are satisfied by the present disclosure.

SUMMARY

In accordance with the purpose(s) of the disclosure, as embodied and broadly described herein, the disclosure, in one aspect, relates to a method of forming an electrocatalyst structure on an electrode, comprising: depositing a first layer on the electrode using atomic layer deposition (ALD), wherein the first layer comprises a plurality of discrete nanoparticles of a first electrocatalyst; and depositing one or more of a second layer on the first layer and the electrode using ALD, wherein the each of the one or more second layers independently comprises a second electrocatalyst; wherein the first layer and the one or more second layers collectively form a deposited electrocatalyst structure on the electrode. Optionally, the disclosed methods further comprise subjecting the electrode to electrochemical operation at a temperature equal to or greater than about 650° C., resulting in the transformation of the deposited electrocatalyst structure to an operated electrocatalyst structure.

Disclosed also is electrode comprising a first electrode substrate, an electrocatalyst nanostructure disposed on the first electrode substrate and comprising: a first layer disposed on at least one surface of the first electrode substrate, and comprising a plurality of discrete nanoparticles of a first electrocatalyst; and one or more of a second layer disposed superjacent the first layer and the first electrode substrate, wherein each of the one or more second layer independently comprising a second electrocatalyst.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE FIGURES

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 2A shows terminal voltage and power density as a function of current density for four test cells at 750° C. FIG. 2B shows Nyquist plots of four cells at a constant current of 0.3 A/cm$^2$. FIG. 2C shows Bode plots of four cells at a constant current of 0.3 A/cm$^2$. FIG. 2D shows corresponding deconvolution spectra of the impedance data that collected from four cells. Two major arcs with the frequency ranging at 1-4 Hz and 10-200 Hz are indicated by $P_1$ and $P_2$, respectively.

FIG. 4A shows bi-model distribution of the Pt particles with the bigger Pt particles exclusively at the original TPBs. FIG. 4B shows small Pt particles on YSZ surface, and in a plan-view region of an original TPB which is circled. FIG. 4C shows small Pt particles and discrete $(Mn_{0.8}Co_{0.2})_3O_4$ particles on the YSZ surface. FIG. 4D shows larger island shaped $(Mn_{0.8}Co_{0.2})_3O_4$ grains on LSM surface. FIG. 4E shows faceted Pt particles kept well defined orientation relationship with YSZ grain. FIG. 4F shows small Pt embedded at the interface of LSM/$(Mn_{0.8}Co_{0.2})_3O_4$ particles, that is close to the original TPB. In all foregoing images, the surface of the architecture is indicated by the dash lines.

FIG. 6A shows the $(Mn_{0.8}Co_{0.2})_3O_4$ grains and Pt particles are simultaneously preserved on both the YSZ and LSM grain surface after operation. FIG. 6B shows small Pt particles with dense and continuous $(Mn_{0.8}Co_{0.2})_3O_4$ nanoionics on LSM surface. FIG. 6C shows grain boundaries of the $(Mn_{0.8}Co_{0.2})_3O_4$ layer is high in density, and the size of the $(Mn_{0.8}Co_{0.2})_3O_4$ grains and Pt particles are ~10 nm.

FIGS. 8A-8I show schematic representations of the surface architecture on Cell #1, Cell #2, and Cell #3, in accordance with Example 1. FIG. 8A shows a schematic of a baseline YSZ/LSM Cell #1, showing ionic conducting phase, electronic conducting phase, and original TPB. FIG. 8B shows architecture of (MnCo)Ox/Pt multi-layer in exemplary Cell #2. FIG. 8C shows architecture of $(Mn_{0.8}Co_{0.2})O_x$/Pt multi-layer in exemplary Cell #3. FIG. 8D shows a top view of ALD layer of exemplary Cell #3. FIG. 8E shows superjacent (MnCo)Ox nanoionics and subjacent Pt layer respectively in exemplary Cell #3. FIG. 8F shows the distribution of electrocatalyst, in exemplary Cell #3. FIG. 8G shows the distribution ionic conductor & ionic conducting interfaces in exemplary Cell #3. FIG. 8H shows the distribution of ionic conductor & ionic conducting interfaces, in exemplary Cell #3. FIG. 8I shows the distribution of TPBs in exemplary Cell #3.

FIG. 9A shows data pertaining to the total and ionic conductivity of $(Mn_{0.8}Co_{0.2})_3O_4$ and of YSZ (which possesses only ionic conductivity). FIG. 9B shows the total conductivity of the bulk $(Mn_{0.8}Co_{0.2})_3O_4$ samples. FIG. 9C shows the ionic conductivity of bulk $(Mn_{0.8}Co_{0.2})_3O_4$ and of YSZ.

FIG. 10A shows a perspective view from above of the exemplary electrode with the as-deposited ALD layer having an ultra-thin 2 nm $CoO_x$ capping layer covering the 3 nm Pt discrete Pt nanoparticles; and FIG. 10B shows a cross-sectional side view along a long axis of the electrode shown in FIG. 10A.

FIG. 11A shows terminal voltage as a function of current density for the cells at 750° C. FIG. 11B shows Nyquist plots of four cells at a constant current of 0.3 A/cm². FIG. 11C shows Bode plots of cells at a constant current density of 0.3 A/cm². FIG. 11D shows corresponding deconvolution spectra of the impedance data collected from two cells. Two major arcs with the frequency ranging at 1-5 Hz and 10-200 Hz are indicated by $P_1$ and $P_2$, respectively.

FIG. 12A shows RQ contribution plots with the equivalent circuit model used for simulation of impedance data; and FIG. 12B shows Nyquist plot of the impedance data and the processed fitting data.

FIG. 13A shows RQ contribution plots with the equivalent circuit model used for simulation of impedance data; and FIG. 13B shows Nyquist plots of the impedance data and the processed fitting data.

FIG. 14A shows RQ contribution plots with the equivalent circuit model used for simulation of impedance data; and FIG. 14B shows Nyquist plots of the impedance data and the processed fitting data.

FIGS. 15A and 15B show Impedance of exemplary Cell #2 at 96 h, in accordance with Example 2. FIG. 15A shows RQ contribution plots with the equivalent circuit model used for simulation of impedance data; and FIG. 15B shows Nyquist plot of the impedance data and the processed fitting data.

FIG. 16A shows RQ contribution plots with the equivalent circuit model used for simulation of impedance data; and FIG. 16B shows Nyquist plot of the impedance data and the processed fitting data.

FIG. 17A) shows bi-model distribution of the particles with the bigger particles exclusively at the original TPBs. FIG. 17B shows small Pt and (MnCo)Ox grains on YSZ surface, and LSM grain is free of secondary phase grains. FIG. 17C shows small and discrete Pt and (MnCo)Ox particles on the YSZ surface. FIG. 17D shows overlapping (MnCo)Ox and Pt grains on the YSZ surface.

In FIG. 19A, EDS points (1), (2) and (3) demonstrating the chemistry of Pt/(MnCo)Ox coupling on the YSZ surface, and EDS points (4), (5) and (6) demonstrating the YSZ grains are free of Co and with a minor and fixed level of Mn. In FIG. 19B EDS points (7), (8) and (9) demonstrating the Pt are only present at the LSM/LSM grain boundaries. In. FIG. 19C, cross-section view of the LSM/LSM surface grain boundaries showing the strip-like Pt is coupled by the Co-enrichment (shown in the EDS points 13-17).

FIG. 20A shows the surface of the LSM grain boundaries is decorated with the nano-particles. FIG. 20B shows a cross-section of the LSM grain boundary with the secondary particles sitting at the LSM/LSM grain boundaries. FIG. 20C shows the enlarged portion of the (MnCo)$O_x$ grains and the adjacent Pt nano-grains from FIG. 20B.

FIGS. 21A-21F show schematic representations of the surface architecture of Cell #1 and Cell #2 after operation, in accordance with Example 2. FIG. 21A shows a baseline LSM/YSZ interface and the original TPB. FIG. 21B shows Cell #2 with Pt/Mn—Co—O pair uniformly distributed on YSZ surface, and along the LSM/LSM grain boundaries. FIG. 21C shows distribution of active catalyst for ORR in Cell #2. FIG. 21D shows distribution of electronic conductor in Cell #2. FIG. 21E shows distribution of ionic conductor & ionic conducting interfaces in Cell #2. FIG. 21F shows distribution of effective TPBs in Cell #2.

FIG. 23A shows a perspective view from above of the exemplary electrode with the as-deposited ALD layer having a thicker 10 nm $CoO_x$ capping layer covering the 3 nm Pt discrete Pt nanoparticles; and FIG. 23B shows a cross-sectional side view along a long axis of the electrode shown in FIG. 23A.

FIGS. 30A-30C show TEM images of exemplary LSCF/SDC cathode ALD-coated with a layer of Pt, and superjacent CoOx layer, shown after electrochemical operation, with Core-shell structures present strict uniformity over the entire cathode, in accordance with Example 4.

Figure 1:
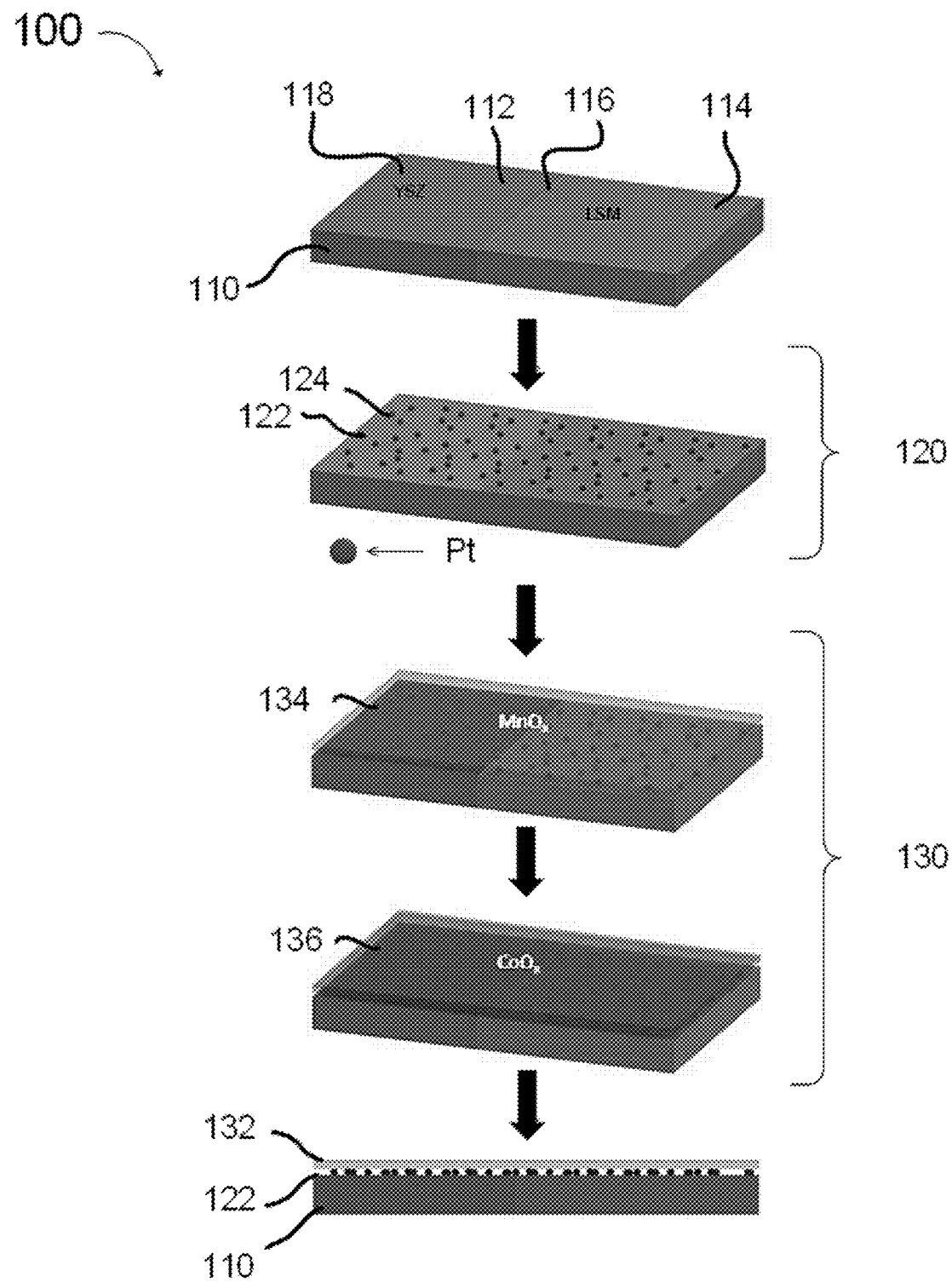
FIG. 1 shows a schematic representation of an exemplary ALD deposition process, in accordance with Example 1.

Additional advantages of the disclosure will be set forth in part in the description which follows, and in part will be obvious from the description, or can be learned by practice of the disclosure. The advantages of the disclosure will be realized and attained by means of the elements and combinations particularly pointed out in the appended claims. It is to be understood that both the foregoing general description and the following detailed description are exemplary and explanatory only and are not restrictive of the disclosure, as claimed.

DETAILED DESCRIPTION

Generally speaking, exemplary embodiments disclosed herein provide methods for forming electrocatalytic surface nanoionics for accelerating high-temperature electrochemical reactions at the surface of an electrode, and increasing the service longevity in devices such as SOFCs. The electrocatalytic surface nanoionics can be single-layered with single phase, or multi-layered such as a nano-composite with two or more phases. The disclosed methods provide a versatile method for forming the electrocatalytic surface nanoionics, with the number of layers, the thickness of each layer, the chemistry and crystal structure of each layer, and the stacking sequence of layers with different chemistry/thickness, all changeable within the ranges disclosed herein.

Accordingly, the various exemplary embodiments disclosed herein provide methods for providing an electrode, such as an electrode for an SOFC, by using chemical vapor-based ALD to provide a multi-layer electrocatalyst coating on a surface of the electrode. The multi-layer electrocatalyst coating can be a nano-porous heterogeneous multifunctional coating layer on the internal surface of LSM/YSZ backbone or LSCF/SDC backbone. According to the disclosed methods, an exemplary multi-layer electrocatalyst comprises a subjacent layer nanoparticles of a first electrocatalyst (e.g., Pt) and one or more superjacent layers of a second electrocatalyst (e.g., CoOx or (MnCo)Ox). The methods disclosed herein enable the precise control of the thickness of the subjacent and superjacent layers so that upon electrochemical operation, the conformal and nano-porous ALD layer maintains uniformity and incorporates the high-density nano-catalyst for the accelerated ORR. The resulting multi-layer nano electrocatalyst layers cover both the ionic conducting electrolyte and electrical conducting cathode grains and provide additional charge and mass transfer pathways, thereby extending the electrochemical active sites from the original localized triple phase boundaries (TPBs) to the entire internal surface of the porous cathode, and increasing the peak power density of the commercial cell. When the methods are applied to commercially-available SOFC operated at industry relevant conditions, such ALD multi-layer coating of an LSM/YSZ cathode can result in a large reduction of cell polarization resistance by up to 55%, and an enhancement of cell peak power density by 380% at 750° C. In addition, the ALD layers possesses the capability to seal off contamination and suppress the cation surface segregation to enhance the cell longevity.

Many modifications and other embodiments disclosed herein will come to mind to one skilled in the art to which the disclosed compositions and methods pertain having the benefit of the teachings presented in the foregoing descriptions and the associated drawings. Therefore, it is to be understood that the disclosures are not to be limited to the specific embodiments disclosed and that modifications and other embodiments are intended to be included within the scope of the appended claims. The skilled artisan will recognize many variants and adaptations of the aspects described herein. These variants and adaptations are intended to be included in the teachings of this disclosure and to be encompassed by the claims herein.

Although specific terms are employed herein, they are used in a generic and descriptive sense only and not for purposes of limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure.

Any recited method can be carried out in the order of events recited or in any other order that is logically possible. That is, unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided herein can be different from the actual publication dates, which can require independent confirmation.

While aspects of the present disclosure can be described and claimed in a particular statutory class, such as the system statutory class, this is for convenience only and one of skill in the art will understand that each aspect of the present disclosure can be described and claimed in any statutory class.

It is also to be understood that the terminology used herein is for the purpose of describing particular aspects only and is not intended to be limiting. Unless defined otherwise, all technical and scientific terms used herein have the same meaning as commonly understood by one of ordinary skill in the art to which the disclosed compositions and methods belong. It will be further understood that terms, such as those defined in commonly used dictionaries, should be interpreted as having a meaning that is consistent with their meaning in the context of the specification and relevant art and should not be interpreted in an idealized or overly formal sense unless expressly defined herein.

Prior to describing the various aspects of the present disclosure, the following definitions are provided and should be used unless otherwise indicated. Additional terms may be defined elsewhere in the present disclosure.

A. DEFINITIONS

As used herein, "solid oxide fuel cell" or "SOFC" refers to an electrochemical conversion device that produces electricity by oxidizing a fuel. Generally speaking, an SOFC operates as follows: reduction of oxygen molecules into oxygen ions occurs at a cathode; an electrolyte material conducts the negative oxygen ions from the cathode to an anode, where electrochemical oxidation of oxygen ions with hydrogen or carbon monoxide occurs; the electrons then flow through an external circuit and re-enter the cathode.

As used herein, "electrode" includes electric conducting structures (including cathode and/or anode) suitable for electrochemical energy conversion devices, including solid oxide fuel cell (SOFC) and solid oxide electrolyzer cell (SOEC) as well as a protonic conductor.

As used herein, "comprising" is to be interpreted as specifying the presence of the stated features, integers, steps, or components as referred to, but does not preclude the presence or addition of one or more features, integers, steps, or components, or groups thereof. Moreover, each of the terms "by", "comprising," "comprises", "comprised of," "including," "includes," "included," "involving," "involves," "involved," and "such as" are used in their open, non-limiting sense and may be used interchangeably. Further, the term "comprising" is intended to include examples and aspects encompassed by the terms "consisting essentially of" and "consisting of." Similarly, the term "consisting essentially of" is intended to include examples encompassed by the term "consisting of".

As used in the specification and the appended claims, the singular forms "a," "an" and "the" include plural referents unless the context clearly dictates otherwise. Thus, for example, reference to "a metal oxide" or "a catalyst," includes, but is not limited to, two or more such metal oxides or catalysts, respectively.

It should be noted that ratios, concentrations, amounts, and other numerical data can be expressed herein in a range format. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. Ranges can be expressed herein as from "about" one particular value, and/or to "about" another particular value. Similarly, when values are expressed as approximations, by use of the antecedent "about," it will be understood that the particular value forms a further aspect. For example, if the value "about 10" is disclosed, then "10" is also disclosed.

When a range is expressed, a further aspect includes from the one particular value and/or to the other particular value. For example, where the stated range includes one or both of the limits, ranges excluding either or both of those included limits are also included in the disclosure, e.g. the phrase "x to y" includes the range from 'x' to 'y' as well as the range greater than 'x' and less than 'y'. The range can also be expressed as an upper limit, e.g. 'about x, y, z, or less' and should be interpreted to include the specific ranges of 'about x', 'about y', and 'about z' as well as the ranges of 'less than x', less than y', and 'less than z'. Likewise, the phrase 'about x, y, z, or greater' should be interpreted to include the specific ranges of 'about x', 'about y', and 'about z' as well as the ranges of 'greater than x', greater than y', and 'greater than z'. In addition, the phrase "about 'x' to 'y'", where 'x' and 'y' are numerical values, includes "about 'x' to about 'y'".

It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a numerical range of "about 0.1% to 5%" should be interpreted to include not only the explicitly recited values of about 0.1% to about 5%, but also include individual values (e.g., about 1%, about 2%, about 3%, and about 4%) and the sub-ranges (e.g., about 0.5% to about 1.1%; about 5% to about 2.4%; about 0.5% to about 3.2%, and about 0.5% to about 4.4%, and other possible sub-ranges) within the indicated range.

As used herein, the terms "about," "approximate," "at or about," and "substantially" mean that the amount or value in question can be the exact value or a value that provides equivalent results or effects as recited in the claims or taught herein. That is, it is understood that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art such that equivalent results or effects are obtained. In some circumstances, the value that provides equivalent results or effects cannot be reasonably determined. In such cases, it is generally understood, as used herein, that "about" and "at or about" mean the nominal value indicated ±10% variation unless otherwise indicated or inferred. In general, an amount, size, formulation, parameter or other quantity or characteristic is "about," "approximate," or "at or about" whether or not expressly stated to be such. It is understood that where "about," "approximate," or "at or about" is used before a quantitative value, the parameter also includes the specific quantitative value itself, unless specifically stated otherwise.

As used herein, the terms "optional" or "optionally" means that the subsequently described event or circumstance can or cannot occur, and that the description includes instances where said event or circumstance occurs and instances where it does not.

Unless otherwise specified, temperatures referred to herein are based on atmospheric pressure (i.e. one atmosphere).

B. METHODS

In one aspect, the disclosure relates to a method of forming a multi-layer electrocatalyst nanostructure on an electrode using atomic layer deposition (ALD). More specifically, in one aspect, the disclosed method includes using ALD to deposit a first layer comprising a plurality of discrete nanoparticles of a first electrocatalyst on a surface of the electrode, and depositing one or more of a second layer comprising a second electrocatalyst superjacent the electrode and the first layer.

Generally speaking, atomic layer deposition is a subclass of chemical vapor deposition and encompasses a thin-film deposition technique based on the sequential use of a gas phase chemical process. During atomic layer deposition a film is grown on a substrate by exposing its surface to alternate gaseous species, typically referred to as precursors. The precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction. By varying the number of cycles it is possible to grow materials uniformly and with high precision on arbitrarily complex and large substrates. Through the repeated exposure to separate precursors, a thin film is slowly deposited on a target surface. The chemistry of any particular layer can be specified or modified by selecting the precursors, the oxidant, the processing temperature, the processing pressure, or a combination thereof, each of which can be automated and controlled with a control system. ALD is considered one deposition method with great potential for producing very thin, conformal films with control of the thickness and composition of the films possible at the atomic level.

According to various aspects, the ALD technique comprises introducing a precursor and an oxidant to the subjacent layer or surface, and allowing the precursor to react with the subjacent layer or surface, forming a thin film layer thereon. The precursor can be selected from any suitable precursor that will provide the desired electrocatalyst layer. Exemplary precursors include, for example: Bis(pentamethylcyclopentadienyl)barium; Bis(n-propyltetramethylcyclopentadienyl)barium; Cerium(III) trifluoroacetylacetonate hydrate; Tris(cyclopentadienyl)cerium(III); Tris(i-propylcyclopentadienyl)cerium(III); Bis(N-t-butyl-N'-ethylpropanimidamidato)cobalt(II); Bis(N, N'-di-i-propylacetamidinato)cobalt(II); Bis(1,4-di-t-butyl-1,3-diazabutadienyl)cobalt(II) Co(DAD)2; Bis(cyclopentadienyl)cobalt(II); Bis(N, N'-di-i-propylacetamidinato)cobalt(II); Bis(dimethylamino-2-propoxy)copper(II); Copper(II) hexafluoroacetylacetonate hydrate; Copper(II) trifluoroacetylacetonate; Cyclopentadienyl(triethylphosphine)copper(I); Bis(pentamethylcyclopentadienyl)iron; Bis(i-propylcyclopentadienyl)iron; Tris(cyclopentadienyl)lanthanum; Tris(N, N'-di-i-propylformamidinato)lanthanum(III); Tris(i-propylcyclopentadienyl)lanthanum; Bis(cyclopentadienyl)manganese; Bis(ethylcyclopentadienyl)manganese; Bis(i-propylcyclopentadienyl)manganese; Bis(cyclopentadienyl)nickel; Bis(ethylcyclopentadienyl)nickel; Bis(pentamethylcyclopentadienyl)nickel; Bis(i-propylcyclopentadienyl)nickel; Allyl(cyclopentadienyl)palladium(II); Bis(2,2,6,6-tetramethyl-3,5-heptanedionato)palladium(II); Palladium(II) hexafluoroacetylacetonate; (Trimethyl)methylcyclopentadienylplatinum(IV); Platinum(II) acetylacetonate; Platinum(II) hexafluoroacetylacetonate; (Trimethyl)cyclopentadienylplatinum(IV); (Trimethyl)methylcyclopentadienylplatinum(IV); Praseodymium(III) hexafluoroacetylacetonate; Tris(cyclopentadienyl)praseodymium; Tris(i-propylcyclopentadienyl)praseodymium; Bis(2,4-dimethylpentadienyl)ruthenium(II); Bis(ethylcyclopentadienyl)ruthenium(II); Tris(cyclopentadienyl)samarium; Bis(2,2,6,6-tetramethyl-3,5-heptanedionato)strontium hydrate; Tetrakis(ethylmethylamino)vanadium(IV); Bis(cyclopentadienyl)vanadium; Tetrakis(ethylmethylamino)titanium; Tetrakis(dimethylamino)titanium(IV); Cyclopentadienyl(cycloheptatrienyl)titanium(II); Tris(N, N'-di-i-propylformamidinato)yttrium(III); Tris(ethylcyclopentadienyl)yttrium; Tetrakis(dimethylamino)zirconium(IV). The oxidant can be selected from any suitable oxidant that will provide the desired electrocatalyst layer. Exemplary oxidants include hydrogen peroxide ($H_2O_2$), Water ($H_2O$), Oxygen ($O_2$) and Ozone ($O_3$).

In one aspect, the disclosed method involves depositing a first layer of Pt catalyst on a target surface of an electrode, wherein the first layer of Pt catalyst comprises a plurality of particles (or grains) having a first particle (or grain) size. The method further comprises depositing one or more of a second layer of a second electrocatalyst superjacent the first Pt layer and the surface of the electrode, to provide one or more second layers having second thickness. In various aspects, the target surface of the electrode may be an internal surface, an external surface, or both. In various aspects, the first layer can provide coverage of the substrate area to the extent of about 5%, 10%, 15%, 20%, 25%, 30%, 35%, 40%, 45%, 50%, 55%, 60%, 65%, 70%, 75%, 80%, 85%, 90%, 95%, 100%, or range of substrate area coverage with an lower and upper limit comprising any of the foregoing values, or a set of values selected from any of the foregoing values. In some aspects, the first layer coverage can be any amount such that a nano-grained network is formed with grain boundaries acting as pathway for oxygen diffusion. There may be some advantage to higher levels of substrate coverage, but this would be balanced against cost (greater amounts of catalyst in the first layer utilized) and benefit (whether the increase in performance were justified by the layer costs) considerations.

Referring to the schematic representation of FIG. 1, we describe further an exemplary method 100 which results in an electrode having a multi-layer coating comprising a first layer of Pt nanoparticles, and a second layer comprising an (MnCo)Ox electrocatalyst. According to the method an electrode 110 is a composite cathode comprising an LSM/YSZ composite material having at least one discrete YSZ region 112, at least one discrete LSM region 114, with a boundary 116 therebetween. While the electrode 110 is shown in this schematic to have just one YSZ region 112 and one LSM region 114, it will be understood that an exemplary electrode may have a plurality of YSZ regions 112 and LSM zones 114, with boundaries 116 formed therebetween. Electrode 110 has a first surface 118, on which the electrocatalyst layer is deposited using the disclosed methods.

Still referring to FIG. 1, in a first step 120, a first electrocatalyst material is deposited onto the first surface 118 of the electrode 110. Using an ALD technique, one or more first precursor materials are introduced and reacted in a cyclical fashion to the first surface 118, resulting in a first layer 122 being formed on the first surface 118. The first layer 122 is deposited uniformly across both the YSZ region 112 and the LSM region 114. In various aspects, the first layer 122 may comprise a plurality of discrete particles 124 of the first electrocatalyst material. However, it will be understood that in some aspects first layer 122 may comprise a substantially continuous layer across the first surface 118 of the electrode 110. The first electrocatalyst material may be any electrocatalyst that provides a necessary or desired catalytic function at the surface of the electrode 110. In some aspects the first electrocatalyst material comprises, consist of, or consist essentially of a Pt catalyst. Exemplary precursor materials to use to form a Pt layer include a (trimethyl)methylcyclopentadienylplatinum(IV) (99%) precursor and deionized water as an oxidant. The ALD technique may include multiple cycles of introduction and reaction of the precursor materials, until the desired particle size or layer thickness of the first layer 122 is achieved.

In a second step 130, a second electrocatalyst material is deposited superjacent the first layer 122 and the first surface 118 of the electrode 110. Using an ALD technique, one or more second precursor materials are introduced and reacted in a cyclical fashion, resulting in a second layer 132 being formed superjacent the first layer 122 and the first surface 118 of the electrode 110. The second layer 132 is deposited uniformly across both the YSZ region 112 and the LSM region 114 of electrode 110. In various aspects, the second layer 132 may comprise one or more substantially continuous layers of the second electrocatalyst material, as illustrated in FIG. 1. However, it will be understood that in some aspects second layer 132 may be discontinuous in one or more regions or zones across the first surface 118 of the electrode 110, and/or the second layer 132 may comprise a plurality of grains or particles. The second electrocatalyst material may be any electrocatalyst material that provides a necessary or desired catalytic function at the surface of the electrode 110. In some aspects, the second layer 132 can comprise, consist of, or consist essentially of a CoOx catalyst, such as $Co_3O_4$. Exemplary precursor materials to use to form a CoOx layer include a bis(cyclopentadienyl) cobalt (II), (min. 98% cobaltocene) to form a Co layer, and ozone as an oxidant. The precursor materials are introduced to the electrode 110 in a cyclical fashion to form a CoOx layer 136. The ALD technique may include multiple cycles of introduction and reaction of the precursor materials, until the desired thickness of the second layer 132 is achieved.

In some aspects the second electrocatalyst material comprises, consist of, or consist essentially of two or more electrocatalyst materials. For example, referring to FIG. 1, the second electrocatalyst material may comprise a (MnCo)Ox catalyst, such as $(Mn_{0.8}Co_{0.2})_3O_4$. Exemplary precursor materials to use to form a (MnCo)Ox layer include a bis(cyclopentadienyl)manganese (98+%) to form an Mn layer, a bis(cyclopentadienyl)cobalt (II), (min. 98% cobaltocene) to form a Co layer, and ozone as an oxidant. The precursor materials are introduced to the electrode 110 in a cyclical fashion to form an MnOx layer 134, and a CoOx layer 136, where the MnOx layer 134 and CoOx layer 136 combined form the second layer 132 comprising (MnCo)Ox. The ALD technique may include multiple cycles of introduction and reaction of the precursor materials, until the desired thickness or particle size of the respective second layer 132 is achieved.

Referring to FIG. 1, the resulting electrode 110 has a multi-layer coating, shown in step 140, comprising a subjacent first layer 120 comprising a plurality of Pt nanoparticles, and a superjacent second layer 130 comprising a (MnCo)Ox electrocatalyst.

According to various aspects, the electrode substrate is porous, and the method results in depositing the first layer and the one or more second layers on an outer surface of the substrate, on an internal surface of one or more pores of the substrate, or a combination thereof.

C. ELECTRODE STRUCTURES

Having described the methods for forming multi-layer electrocatalyst coatings, we now turn to a description of the resulting electrode structures. According to the various embodiments, the disclosed electrocatalyst coatings can be applied to any suitable electrode structure. The electrode is at least electronically conductive, and optionally also ionically conductive. According to various aspects, the electrode comprises a porous substrate. According to the various aspects, the disclosed multi-layer electrocatalyst coating structures can be characterized by two configurations—the multi-layer coating structure has an "as-deposited" configuration that exists after the disclosed methods, and the second configuration is an "operated" configuration that exists after the electrode has been used in a high-temperature electrochemical operation. Each is described in more detail below.

1. As-Deposited Structures

According to certain aspects, the electrode is a cathode. An exemplary cathode may comprise an electronically conductive material such as lanthanum strontium manganite (LSM). LSM is a common cathode material because it is compatible with it has a similar coefficient of thermal expansion to YSZ, which is a common electrolyte for SOFCs. However, LSM is a poor ionic conductor, so the electrochemically active region of an LSM cathode is limited to the triple phase boundary (TPB) which is the boundary between the electrolyte, air and the electrode, i.e., the boundary between adjacent LSM cathode and YSZ electrolyte. Composite cathodes consisting of both LSM and YSZ increase this TPB length within the cathode. An exemplary LSM/YSZ composite cathode comprises discrete regions of LSM and YSZ. Another exemplary cathode may comprise a mixed ionic and electronic conducting material such as lanthanum strontium cobalt ferrite (LSCF). LSCF is another common cathode material because it offers good performance at lower operating temperatures (750° C. and lower). LSCF can be used with zirconia, ceria and lanthanum gallate based electrolytes. According to some aspects, the cathode comprises a composite of LSCF with samarium doped ceria (SDC).

According to certain aspects, at least one external or internal surface of the electrode comprises a multi-layer coating comprising a first layer of a first electrocatalyst, and one or more second layers superjacent the first layer (or subjacent layer), wherein each of the one or more second layers can be the same or different, and each of the one or more second layers independently comprises a second electrocatalyst.

According to various aspects, the first electrocatalyst is any electrocatalyst that provides a necessary or desired catalytic function at the surface of the electrode. For example, when the electrode is a cathode of an SOFC, a desirable first electrocatalyst provides good catalytic activity for the oxygen reduction reaction (ORR). One of the most efficient ORR catalysts is the precious metal platinum (Pt). Other suitable first electrocatalysts include metal, metal alloy and metal oxides comprising one or more noble metals such as ruthenium (Ru), rhodium (Rh), palladium (Pd), silver (Ag), osmium (Os), iridium (Ir), platinum (Pt), gold (Au), and the like.

According to various aspects, the first layer comprises a plurality of nanoparticles comprising the first electrocatalyst. Each of the plurality of nanoparticles may have any necessary or desirable geometry or structure, including but not limited to equiaxed or faceted crystalline structures. Using the methods described herein, the size of the nanoparticles may be precisely controlled to a predetermined grain or particle size. The size of the nanoparticles may be selected to provide one or more desirable properties or balance of properties, e.g., surface area, durability, and/or cost. In certain aspects, the plurality of nanoparticles, as initially deposited by the method, has an average particle size of from about 0.5 nm to about 200 nm, or from about 1 nm to about 100 nm, or from about 2 nm to about 50 nm. In certain aspects, the plurality of nanoparticles has an average particle size of from about 0.5 nm to about 10 nm. In certain aspects, the plurality of nanoparticles, as deposited, has an average particle size of about 4 nm or less, or about 3 nm or less, or 2 nm or less or 1 nm or less.

As initially deposited by the disclosed method, the first layer is distributed substantially evenly across the coated surface of the electrode. In an aspect, the first layer may cover from about 1% to about 100% of the surface of the electrode. In an aspect, the first layer comprises a plurality of nanoparticles as well as a plurality of grain boundaries extending between the nanoparticles, where the grain boundaries provide pathways for oxygen diffusion.

According to various aspects, the second electrocatalyst comprises a material that provides a necessary or desired catalytic function at the surface of the electrode and is an electronic conductor. Exemplary electronic conductors include metal oxides comprising one or more transition metals such as manganese (Mn), cobalt (Co), ruthenium (Ru), iron (Fe), vanadium (V), iridium (Ir), nickel (Ni) and the like. Other exemplary electrocatalysts include perovskite electrocatalysts of the type $(M_1M_2)O_3$, where $M_1$ is selected from La, Ce, Pr, Nd, Sr, or Ba, and $M_2$ is selected from Ti, Cr, Mn, Fe, Co, or Ni. Other exemplary electrocatalysts include spinel type electrocatalysts of the type $(M_1M_2)O_4$, where $M_1$ and $M_2$ are, independently, selected from Mn, Co, Ni, Fe, or a combination or alloy thereof. Other exemplary electronic conductors include perovskite electrocatalysts including, but not limited to, lanthanum strontium manganite (LSM), lanthanum strontium cobalt (LSC), La—Ni—O. In a particular aspect, the second electrocatalyst comprises a transition metal oxide comprising manganese and cobalt metals having formula $(Mn_{1-y}Co_y)_3O_4$, where y is a value from 0.0 to 1.0. In a particular aspect, the second electrocatalyst comprises a manganese-cobalt oxide, $(Mn_{0.8}Co_{0.2})_3O_4$. In a particular aspect the second electrocatalyst comprises a cobalt oxide, $Co_3O_4$.

In various aspects, each of the one or more second layer, as deposited by the disclosed methods, has a relatively uniform thickness across the surface of the underlying electrode and first layer (or subjacent layer). Using the described methods, the thickness of each of the second layers may be precisely controlled to a predetermined thickness. The thickness of each second layer may be selected to provide one or more desirable properties or balance of properties, e.g., durability and/or conductivity. In certain aspects, each of the one or more second layers, as initially deposited by the disclosed method, has an average thickness of from about 1 nm to about 200 nm, or from about 1 nm to about 100 nm, or from about 2 nm to about 50 nm.

2. Operated Structures

In one aspect, upon high temperature electrochemical operation (e.g., 650° C. to 750° C. or higher), the disclosed the multi-layer electrocatalyst coating transforms from its as-deposited structural configuration (or as-deposited state) to an operated structural configuration (or operated state), as described in more details below. The operated structural configuration depends, at least in part, upon the as-deposited composition and structural configuration of the multi-layer electrocatalyst. In other words, modifying one or more of the composition, the thickness, or the structural configuration of the as-deposited multi-layer electrocatalyst coating will result in a corresponding modification to the operated structural configuration.

According to various aspects, after high temperature electrochemical operation, the structure of the multi-layer electrocatalyst coating transforms into an operated structural configuration in which the coating is a nano-porous uniform and conformal heterostructured network with superjacent nanoionics layer covering the subjacent discrete Pt nanograins. In its operated state, the multi-layer electrocatalysts cover both the ionic conducting (e.g., YSZ) surface regions and electrical conducting (e.g., LSM) surface regions. In its operated state the multi-layer electrocatalyst coating provides additional charge and mass transfer pathways, and consequently extends the electrochemical active sites from the original localized TPBs to the entire coated surface of the porous electrode.

In one aspect, in the operated state, each of the one or more second layer forms uniform and conformal nanoionic superjacent layer covering the subjacent layer, such as the subjacent discrete nanoparticles of the first electrocatalyst.

In an aspect, in the operated state, each of the one or more second layers of the multi-layer electrocatalyst comprises a plurality of pores or fissures extending through the thickness of the respective second layer. In an aspect, at least a portion of the pores or fissures extend through the entire thickness of the respective second layer to the surface of the electrode. The pores or fissures in the respective second layer provide additional charge and/or mass transfer pathways. In an aspect, the pores or fissures in the respective second layer increase the electrochemical active sites from the original localized TPBs on the electrode, to effectively the entire coated surface of the electrode. In the operated state, the pores or fissures in each second layer increase the effective TPB of the electrode by at least about 5%, or at least about 10%, or at least about 20% or at least about 30% or at least about 40% or at least about 50%, or at least about 60%, or at least about 70%, or at least about 80%, or at least about 90%, or at least about 100%, or more. In the operated state, the pores or fissures in the combined one or more second layers increase the effective TPB of the electrode by at least about 5%, or at least about 10%, or at least about 20% or at least about 30% or at least about 40% or at least about 50%, or at least about 60%, or at least about 70%, or at least about 80%, or at least about 90%, or at least about 100%, or more.

In an aspect, the density of TPB is such that there is an number average separation between TPBs of less than about 50 nm, less than about 45 nm, less than about 40 nm, less than about 35 nm, less than about 30 nm, less than about 35 nm, less than about 20 nm, less than about 15 nm, less than about 10 nm; or a range of separation have a lower and upper limit comprising values from the foregoing; or any set of separation values selected from the foregoing.

In an aspect, in the operated state, each of the one or more second layer of the multi-layer electrocatalyst comprises a plurality of nanograins of the second electrocatalyst. Adjacent nanograins are bounded by intergranular grain boundaries, which like pores or fissures can provide additional charge and/or mass transfer pathways. In an aspect, the intergranular boundaries in the respective second layer increase the electrochemical active sites from the original localized TPBs on the electrode, to effectively the entire coated surface of the electrode. In the operated state, the intergranular boundaries in each of the one or more second layers increase the effective TPB of the electrode by at least about 5%, or at least about 10%, or at least about 20% or at least about 30% or at least about 40% or at least about 50%, or at least about 60%, or at least about 70%, or at least about 80%, or at least about 90%, or at least about 100%, or more. In the operated state, the intergranular boundaries in the combined one or more second layers increase the effective TPB of the electrode by at least about 5%, or at least about 10%, or at least about 20% or at least about 30% or at least about 40% or at least about 50%, or at least about 60%, or at least about 70%, or at least about 80%, or at least about 90%, or at least about 100%, or more. In an aspect, each of the one or more second layers comprises a high density of intergranular boundaries exposed to air, which can enhance the ionic conductivity and/or accelerate kinetics of overall surface reactions of the electrode.

In an aspect, in the operated state, the multi-layer electrocatalyst structures provide a plurality of new ionic pathways at the surface of the electrode. For example, in the operated state, where one or more of the nanograins and intergranular grain boundaries of the second electrocatalyst are superjacent to an electronic conductor (e.g., LSM cathode that has little to no ionic conducting capacity), oxygen ions can be conducted along the intergranular boundary, the interface between the nanograin and the electrode surface, between the surface boundaries of adjacent cathode grains, or a combination thereof.

In an aspect, in the operated state, the multi-layer electrocatalyst structures provide a plurality of new TPBs at the pores, fissures, or intergranular boundaries of the multi-layer coating. The plurality of TPBs can accelerate ORR activity at the surface of the electrode. Where the subjacent electrode surface comprises an electrolyte material (e.g., YSZ), the new TPBs provide potential electrochemical activity where no previous electrochemical activity existed. Where the subjacent surface comprises a cathode material, the new TPBs provide additional electrochemical activity.

In an aspect, in the operated state, at least a portion of the plurality of the nanoparticles of the first electrocatalyst migrate and populate at the newly-formed TPBs in the electrocatalyst coating. In contrast, in the absence of the one or more second layers, the dispersed nanoparticles of the first electrocatalyst would tend to agglomerate and migrate to the TPBs of the electrode and the surface boundaries of adjacent grains of the electrode. In the disclosed electrodes, in the operated state, the nanoparticles of the first electrocatalyst remain better dispersed over the surface of the electrode, due to the introduction of the TPBs forming at the pores, fissures and intergranular boundaries of the one or more second layers. At the TPBs, the cathode material, the first electrocatalyst, and the second electrocatalyst can contribute to the ORR simultaneously.

In an aspect, in the operated state, at least a portion of the nanoparticles of the first electrocatalyst is coupled with an adjacent grain of the second electrocatalyst, forming a plurality of coupled grains. In some aspects, the second electrocatalyst grain remains superjacent the nanoparticles of the first electrocatalytic material. In some aspects, a nanograin of second electrocatalyst is disposed adjacent to one or more nanoparticles of first electrocatalytic material. In some aspects, at least a portion of the plurality of coupled grains may be densely and uniformly distributed on a coated surface of the electrode, for example, on an electrolyte surface. In some aspects, at least a portion of the plurality of coupled grains may be more densely populated at the TPBs of the electrode surface, at the surface boundaries of the electrode materials (e.g., LSM/LSM boundaries), or a combination thereof.

In an aspect, in the operated state, at least a portion of the plurality of coupled grains form a core-shell structure, in which the nanoparticle of the first electrocatalyst forms the core, and a grain of the second electrocatalyst forms a shell around the first electrocatalyst. In some further aspects, in the operated state, one or more additional nanoparticles of the first electrocatalyst may form around the outside of core-shell structure.

D. PROPERTIES

In an aspect, the disclosed methods and structures can result in improved performance of the electrode, and of a fuel cell utilizing the electrode. The disclosed electrodes may be used in the electrochemical energy conversion devices, including solid oxide fuel cells (SOFC) and solid oxide electrolyzer cells (SOEC) as well as a protonic conductors.

In an aspect, the disclosed methods and multi-layer electrocatalyst structures can result in an increase in polarization resistance in an electrochemical energy conversion device utilizing the electrocatalyst structure. In an aspect, an SOFC using a cathode comprising the disclosed multi-layer electrocatalyst structure can provide a reduction in cell polarization resistance of greater than about 25%, or greater than about 30%, or greater than about 35%, or greater than about 40%, or greater than about 50%, as compared to that of a comparable SOFC without the multi-layer electrocatalyst structure. In an aspect, an SOFC using a cathode comprising the disclosed multi-layer electrocatalyst structure can provide a reduction in cell polarization resistance of about 53%, as compared to that of a comparable SOFC without the multi-layer electrocatalyst structure.

In an aspect, the disclosed methods and multi-layer electrocatalyst structures can result in an increase in cell peak power density of an electrochemical energy conversion device utilizing the electrocatalyst structure. In an aspect, an SOFC using a cathode comprising the disclosed multi-layer electrocatalyst structure can provide an increase in peak power density of greater than about 200%, or greater than about 250%, or greater than about 300% or greater than about 350%, as compared to that of a comparable SOFC without the multi-layer electrocatalyst structure. In an aspect, an SOFC using a cathode comprising the disclosed multi-layer electrocatalyst structure can provide an increase in power density at 0.8V of up to about 380%, or up to about 370% or up to about 360%, as compared to that of a comparable SOFC without the multi-layer electrocatalyst structure.

E. ADDITIONAL PROPERTIES

In an aspect, the disclosed multi-layer electrocatalyst structures can provide improved resistance to contamination.

Individual SOFC cells need to be connected electrically, in series to form stacks in order to generate the desired power output with high voltage. The individual cells are connected using an interconnect. The interconnect materials typically have high electrical conductivity, negligible ionic conductivity and are chemically and structurally stable under both air and fuel environment. There are two types of interconnect materials commonly used in SOFCs: doped $LaCrO_3$-based ceramic materials and metallic materials. Compared to the ceramic interconnect materials, metal interconnect materials have higher electronic and thermal conductivity, negligible ionic conductivity, good machinability and low cost. However, metal alloys of high temperature oxidation resistance used as interconnect in SOFCs generally contain chromium as an alloying element to form a protective chromium oxide scale ($Cr_2O_3$). At high temperatures volatile Cr species such as $CrO_3$ and $Cr(OH)_2O_2$ are generated over the oxide scale. Volatilization of Cr species strongly depends on the oxygen partial pressure and the water content. In the cathode end, at high temperatures volatile Cr species such as $CrO_3$ and $Cr(OH)_2O_2$ are generated over the oxide scale in oxidizing atmospheres. Such volatile Cr species subsequently poison and react with the cathodes such as LSM and LSCF, and can cause a rapid degradation of the cell performance.

The chromium volatility can be suppressed by modification of the metallic interconnect materials. For example, the interconnect can be surface-modified via application of coating of conductive oxide(s). The coating layer is intended to serve as a barrier to both chromium cation outward and oxygen anion inward diffusion. For ferritic stainless steel interconnect, the $(CrMn)_3O_4$ spinel is usually applied as coating layer. Upon oxidation, a thin $(CrMn)_3O_4$ layer is formed at the interface between steel substrate and the $(CoMn)_3O_4$ coating layer, and effectively prevents Cr migration from the steel substrates to the surface. Thus, the electric conducting $(CoMn)_3O_4$ spinel coating effectively act as a Cr transport barrier to retard rapid $Cr_2O_3$-scale growth and Cr evaporation. However, despite the intense effort of the past decade, there are still occurrence of spallation between coating/metal interfaces and increasing oxidation rate over time.

An alternative and effective technique to mitigate the Cr-poisoning, is the development of cathode materials not only with high electrochemical activity and good stability, but also with excellent tolerance to impurities, particularly volatile Cr species from the chromia-forming metallic interconnect.

For LSM/YSZ composite cathodes, both $(CrMn)_3O_4$ spinel and $Cr_2O_3$ phases have been identified as Cr-poisoning product. The current load and cell operation has dramatic impact on the Cr-poisoning of LSM/YSZ cells. A uniform chromium distribution on LSM/YSZ surface can be observed under OCV conditions, while chromium deposition mainly occurs near the TPB region under a current load. Formation of Cr-containing phases can result in an increase in the activation overpotential, and/or a slight increase in the ohmic resistance. It is theorized that the main factor causing degradation by chromium is not the chemical reaction between LSM and chromium but the electrochemical reaction of chromium oxide at the TPBs. The deposited various chromium oxide may block the diffusion pathways of reactant gas species to the electrode reaction sites, i.e., TPBs, and decrease the local exchange current density. Importantly, the formation of the $(CrMn)_3O_4$ with the Mn coming from LSM can result in the Mn-deficient LSM composition that deteriorates the LSM backbone performance.

For LSCF/SDC composite cathodes, under SOFC operating conditions, the interaction between the LSCF and Fe—Cr alloy mainly results in the formation of $SrCrO_4$. $SrCrO_4$ depositions on the electrode surface primarily hamper the gas transportation in the cathode. On the other hand, no $Co_{3-x}Cr_xO_4$ spinels have been observed on LSCF cathodes in contact with Fe—Cr alloy interconnect.

The mechanism of Cr deposition process described above indicates that an electrode surface coating layer that is inert to Cr inward diffusion to cathode could act as barrier layer to prevent the direct reaction between the Cr with electrode, and enhance the Cr tolerance. For example, for the LSCF/SDC composite electrode, there is evidence that solution based cathode infiltration of chromium inert phases, such as ionic-conducting $Ce_{0.9}Gd_{0.1}O_{2-\delta}$ (GDC), could mitigate the Cr poisoning. The impregnated GDC nano-particles may act as a buffer layer to prevent the direct contact between LSCF and chromium species, improving the cathode tolerance towards Cr deposition.

From the structure point of view, the Cr-tolerant surface coating layer on the SOFC cathode possesses the following characteristics: deeply penetrating into the active layer of the cathode; uniform and conformal on the internal surface of the cathode active layer that possess complex three-dimensional topographies with high aspect ratio; and intimate adhesion and bonding to the cathode surface at atomic scale without spallation.

Magnetron sputtering, sol-gel dip-coating, and electrodeposition techniques are used for applying a protective coating on ferritic stainless steel interconnects. Those deposition techniques involve physical vapor deposition or liquid solutions. However, none of those interconnect coatings are suitable for infiltrating the cathode surface, since they have the limitation of not being deeply penetrating into the cathode active layer or not providing the conformal coating on cathode surface.

In contrast, ALD techniques such as those disclosed herein are chemical vapor deposition techniques that sequentially apply atomic mono-layers to a substrate, typically alternating compounds to produce a locally balanced atomic distribution of the target material. ALD is uniquely suitable for depositing uniform and conformal films on complex three-dimensional topographies with high aspect ratio. The indifference of ALD to substrate shape makes it particularly promising for applications to SOFCs, which possess porous active structure with complex three-dimensional topographies, and with electrode performance strictly depending on the surface properties.

From the function point of view, because of the intimate coating on the active surface of the electrode, the Cr-inert coating layer should not impart the electrochemical reactions taking place on the cathode surface. Ideally, the surface coating layer should possess multifunctional characteristics: highly active towards electrochemical reactions; highly stable upon the long term electrochemical operation at high temperatures; and extremely robust towards Cr poisoning.

In an aspect, the disclosed multi-layer ALD electrocatalyst coating with a first layer comprising a plurality of Pt nanoparticles, and one or more second layers comprising $(MnCo)_3O_4$ provides Cr resistance to a subjacent LSM/YSZ composite cathode. As described above, spinel $(MnCo)_3O_4$ is a well-known interconnecting coating material that seals off the Cr vapor penetration. When such $(MnCo)_3O_4$ layer is applied as the outmost layer of the internal surface of the cathode, upon the Cr vapor attack, the Mn from the coating layer can act as "Cr-getter" on cathode surface and form electrical conducting $(Cr,Mn)_3O_4$ spinel top layer. The formation of $(Cr,Mn)_3O_4$ spinel top layer in the oxide scale can significantly reduce the vaporization of volatile Cr species. Pt does not react with Cr, and it has been reported that addition of a Pt mesh current collector could reduce the amount of Cr deposited on the LSM/YSZ cathode. In terms of Cr-poisoning, the most vulnerable site would be LSM/YSZ TPB region that has reduced oxygen partial pressure upon cell operation, and would be the immediate deposition site for reducing the higher valence state volatile Cr species and further deposition at the TPB. However, for the ALD layer with Pt, Pt tends to populate at the TPB sites immediately upon the cell operation. In other words, on the cathode surface, the TPB sites with the reduced oxygen partial pressure is taken over by the Pt already, and there is reduced site for further Cr deposition. Thus, the potential nucleation sites for Cr are significantly reduced for Cr deposition due to the presence of nano-scale but high density Pt.

In an aspect, the disclosed multi-layer ALD electrocatalyst coating with a first layer comprising a plurality of Pt nanoparticles and one or more second layer comprising $Co_3O_4$ provides Cr resistance to a subjacent LSCF/SDC composite cathode. Overwhelming evidence indicates that the cathode surface Sr segregation plays a critical role in the Cr deposition. Under SOFC operating conditions, the interaction between the LSCF and Fe—Cr alloy mainly results in the formation of $SrCrO_4$. Other hand, no $Co_{3-x}Cr_xO_4$ spinels have been observed on LSCF cathodes in contact with Fe—Cr alloy interconnect. The conformal and uniform second electrocatalyst layer $Co_3O_4$ at the surface of the LSCF/SDC, could be an effective barrier layer for Cr inward diffusion into the LSCF backbone. Pt does not react with Cr. Similar to the LSM/YSZ cathode, described above, when the Pt is disposed on the surface of LSCF/SDC, the potential nucleation sites for Cr are significantly reduced for Cr deposition due to the presence of nano-scale but high density Pt.

In an aspect, the disclosed multi-layer electrocatalyst structures can suppress the cation surface segregation to enhance the cell longevity. LSCF/SDC cathodes suffer from inadequate long-term durability that is caused, at least in part, by backbone microstructure degradation. LSCF/SDC backbones of as-made commercially-available cells are have pores of 100-200 nm in dimension and free of secondary phases. However, when the cell is operated for 3000 h, the original pore region becomes filled with spongy nano-scale Co-enriched particles. It is theorized that this spongy nano-scale material is grown during the long term operation. Such growth of the $(Co_{0.8}Fe_{0.2})_3O_4$ from the original LSCF backbone changes the LSCF grain chemistry, and especially causes the LSCF grain surface to be more Co/Fe deficient in comparison to the LSCF grain interior. With ALD coating layer, such as the conformal metallic $Pt_{0.81}Fe_{0.13}Co_{0.05}$ covering the entire surface of the LSCF grains, the LSCF can have a significant increase in cell durability, since the ALD layer will prevent LSCF grain coarsening induced by cation surface diffusion.

F. REFERENCES

References are cited herein throughout using the format of reference number(s) enclosed by parentheses corresponding to one or more of the following numbered references. For example, citation of references numbers 1 and 2 immediately herein below would be indicated in the disclosure as (Ref. Nos. 1 and 2).

Ref No. 1. A. Atkinson, S. Barnett, R. J. Gorte, J. T. S. Irvine, A. J. McEvoy, M. Mogensen, S. C. Singhal and J. Vohs, Nat. Mater., 2004, 3, 17-27.

Ref No. 2. S. Zongping, S. M. Haile, A. Jeongmin, P. D. Ronney, Z. Zhongliang and S. A. Barnett, Nature, 2005, 435, 795-798.

Ref No. 3. J. C. Ruiz-Morales, J. Canales-Vazquez, C. Savaniu, D. Marrero-Lopez, W. Zhou and J. T. S. Irvine, Nature, 2006, 439, 568-571.

Ref No. 4. J. Suntivich, H. A. Gasteiger, N. Yabuuchi, H. Nakanishi, J. B. Goodenough and Y. Shao-Horn, Nat. Chem., 2011, 3, 546-550.

Ref No. 5. J.-h. Myung, D. Neagu, D. N. Miller and J. T. Irvine, Nature, 2016, 537, 528.

Ref No. 6. Y. Zhou, X. Guan, H. Zhou, K. Ramadoss, S. Adam, H. Liu, S. Lee, J. Shi, M. Tsuchiya and D. D. Fong, Nature, 2016, 534, 231.

Ref No. 7. V. R. Stamenkovic, D. Strmcnik, P. P. Lopes and N. M. Markovic, Nat. mater., 2017, 16, 57.

Ref No. 8. S. Sengodan, S. Choi, A. Jun, T. H. Shin, Y.-W. Ju, H. Y. Jeong, J. Shin, J. T. Irvine and G. Kim, Nat. mater., 2015, 14, 205.

Ref No. 9. Z. Gao, E. C. Miller and S. A. Barnett, Adv. Funct. Mater., 2014, 24, 5703-5709.

Ref No. 10. S. Choi, C. J. Kucharczyk, Y. Liang, X. Zhang, I. Takeuchi, H.-I. Ji and S. M. Haile, Nat. Energy, 2018, 3, 202-210.

Ref No. 11. C. Duan, R. J. Kee, H. Zhu, C. Karakaya, Y. Chen, S. Ricote, A. Jarry, E. J. Crumlin, D. Hook and R. Braun, Nature, 2018, 557, 217.

Ref No. 12. C. Duan, J. Tong, M. Shang, S. Nikodemski, M. Sanders, S. Ricote, A.
Almansoori and R. O'Hayre, Science, 2015, 349, 1321-1326.

Ref No. 13. S. De Souza, S. J. Visco and L. C. De Jonghe, Solid State Ionics, 1997, 98, 57-61.

Ref No. 14. A. V. Virkar, J. Chen, C. W. Tanner and J.-W. Kim, Solid State Ionics, 2000, 131, 189-198.

Ref No. 15. K. Kendall and M. Kendall, High-temperature solid oxide fuel cells for the 21st century: fundamentals, design and applications, Elsevier, 2015.

Ref No. 16. M. Boaro and A. S. Arica, Advances in medium and high temperature solid oxide fuel cell technology, Springer, 2017.

Ref No. 17. N. Mahato, A. Banerjee, A. Gupta, S. Omar and K. Balani, Progress in Materials Science, 2015, 72, 141-337.

Ref No. 18. J. Nielsen, A. H. Persson, T. T. Muhl and K. Brodersen, J. Electrochem. Soc., 2018, 165, F90-F96.

Ref No. 19. E. D. Wachsman and K. T. Lee, Science, 2011, 334, 935-939.

Ref No. 20. S. Lee, N. Miller and K. Gerdes, J. Electrochem. Soc., 2012, 159, F301-F308.

Ref No. 21. D. Ding, X. Li, S. Y. Lai, K. Gerdes and M. Liu, Energ Environ Sci, 2014, 7, 552-575.

Ref No. 22. G. M. Rupp, A. K. Opitz, A. Nenning, A. Limbeck and J. Fleig, Nat. Mater., 2017, 16, 640.

Ref No. 23. S. B. Adler, Chem. Rev., 2004, 104, 4791-4843.

Ref No. 24. M. Liu, M. E. Lynch, K. Blinn, F. M. Alamgir and Y. Choi, Mater Today, 2011, 14, 534-546.

Ref No. 25. E. D. Wachsman and K. T. Lee, Science, 2011, 334, 935-939.

Ref No. 26. J. Irvine, R. Gorte, S. Barnett, J. Vohs, T. Ishihara, V. Birss, A. Call, B. Yildiz, J. Hartvigsen, L. Hu, S. P. Jiang, C. Ni, M. Han and M. Mogensen, Faraday Discussions, 2015, 182, 511-517.

Ref No. 27. K. T. Lee and E. D. Wachsman, MRS Bulletin, 2014, 39, 783-791.

Ref No. 28. J.-H. Kim and A. Manthiram, J. Mater. Chem. A, 2015, 3, 24195-24210.

Ref No. 29. Z. Shao and S. M. Haile, Nature, 2004, 431, 170-173.

Ref No. 30. J. T. Irvine, D. Neagu, M. C. Verbraeken, C. Chatzichristodoulou, C. Graves and M. B. Mogensen, Nature Energy, 2016, 1, 15014.

Ref No. 31. N. Sata, K. Eberman, K. Eberl and J. Maier, Nature, 2000, 408, 946-949.

Ref No. 32. G. S. Rohrer, M. Affatigato, M. Backhaus, R. K. Bordia, H. M. Chan, S. Curtarolo, A. Demkov, J. N. Eckstein, K. T. Faber and J. E. Garay, J. Am. Ceram. Soc., 2012, 95, 3699-3712.

Ref No. 33. X. Y. Song, G. Daniels, D. M. Feldmann, A. Gurevich and D. Larbalestier, Nat. Mater., 2005, 4, 470-475.

Ref No. 34. S. Cho, C. Yun, S. Tappertzhofen, A. Kursumovic, S. Lee, P. Lu, Q. Jia, M. Fan, J. Jian and H. Wang, Nat. Commun., 2016, 7, 12373.

Ref No. 35. C.-C. Chao, J. S. Park, X. Tian, J. H. Shim, T. M. Gür and F. B. Prinz, ACS Nano, 2013, 7, 2186-2191.

Ref No. 36. J. M. Vohs and R. J. Gorte, Adv. Mater., 2009, 21, 943-956.

Ref No. 37. M. Shah, P. W. Voorhees and S. A. Barnett, Solid State Ionics, 2011, 187, 64-67.

Ref No. 38. C. Knöfel, H.-J. Wang, K. T. S. Thydén and M. Mogensen, Solid State Ionics, 2011, 195, 36-42.

Ref No. 39. H. Chen, Z. Guo, L. A. Zhang, Y. Li, F. Li, Y. Zhang, Y. Chen, X. Wang, B. Yu, J.-m. Shi, J. Liu, C. Yang, S. Cheng, Y. Chen and M. Liu, ACS Appl. Mater. Interfaces, 2018, 10, 39785-39793.

Ref No. 40. S. Lee, N. Miller and K. Gerdes, J. Electrochem. Soc., 2012, 159, F301-F308.

Ref No. 41. X. Song, S. Lee, Y. Chen and K. Gerdes, Solid State Ionics, 2015, 278, 91-97

Ref No. 42. Finklea, H.; Chen, X.; Gerdes, K.; Pakalapati, S.; Celik, I. Analysis of SOFCs using reference electrodes. Journal of The Electrochemical Society 2013, 160 (9), F1055-F1066.

Ref No. 43. Schichlein, H.; Muller, A. C.; Voigts, M.; Krugel, A.; Ivers-Tiffee, E. Deconvolution of electrochemical impedance spectra for the identification of electrode reaction mechanisms in solid oxide fuel cells. J. Appl. Electrochem. 2002, 32 (8), 875-882

Ref No. 44. Escudero, M.; Aguadero, A.; Alonso, J. A.; Daza, L. A kinetic study of oxygen reduction reaction on La2NiO4 cathodes by means of impedance spectroscopy. Journal of electroanalytical chemistry 2007, 611 (1-2), 107-116.

Ref No. 45. Jørgensen, M. J.; Mogensen, M. Impedance of solid oxide fuel cell LSM/YSZ composite cathodes. Journal of The Electrochemical Society 2001, 148 (5), A433-A442.

Ref No. 46. Leonide, A.; Ruger, B.; Weber, A.; Meulenberg, W. A.; Ivers-Tiffee, E. Impedance Study of Alternative (La,Sr)FeO3-delta and (La,Sr)(Co,Fe)O3-delta MIEC Cathode Compositions. Journal of the Electrochemical Society 2010, 157 (2), B234-B239.

Ref No. 47. Sonn, V.; Leonide, A.; Ivers-Tiffee, E. Combined deconvolution and CNLS fitting approach applied on the impedance response of technical NY 8YSZ cermet electrodes. Journal of The Electrochemical Society 2008, 155 (7), B675-B679.

Ref No. 48. Y. Chen, K. Gerdes and X. Song, Scientific Reports, 2016, 6, 32997.

Ref No. 49. P. I. Cowin, C. T. G. Petit, R. Lan, J. T. S. Irvine and S. Tao, Adv. Energy Mater., 2011, 1, 314-332.

Ref No. 50. W. G. Wang, Y.-L. Liu, R. Barfod, S. B. Schougaard, P. Gordes, S. Ramousse, P. Y. Hendriksen and M. Mogensen, Electrochem. Solid State Lett., 2005, 8, 619-621.

Ref No. 51. H. Shimada, T. Yamaguchi, H. Sumi, K. Nomura, Y. Yamaguchi and Y. Fujishiro, J. Power Sources, 2017, 341, 280-284.

Ref No. 52. N. Imanishi, R. Ohno, K. Murata, A. Hirano, Y. Takeda, O. Yamamoto and K. Yamahara, Fuel Cells, 2009, 9, 215-221.

Ref No. 53. W. G. Wang, Y.-L. Liu, R. Barfod, S. B. Schougaard, P. Gordes, S. Ramousse, P. Y. Hendriksen and M. Mogensen, Electrochem. Solid State Lett., 2005, 8, 619-621

Ref No. 54. J. R. Wilson and S. A. Barnett, Electrochem. Solid State Lett., 2008, 11, B181-B185.

Ref No. 55. J. Liu and S. A. Barnett, Solid State Ionics, 2003, 158, 11-16.

Ref No. 56. J. G. Lee, M.-G. Park, K. H. Ryu, R. H. Song, S. J. Park, S. H. Min, S.-H. Hyun, C. S. Kim, D. R. Shin and Y. G. Shul, ECS Transactions, 2013, 57, 2947-2952.

Ref No. 57. Q. Ma, J. Ma, S. Zhou, R. Yan, J. Gao and G. Meng, J. Power Sources, 2007, 164, 86-89.

Ref No. 58. D. Storjohann, J. Daggett, N. P. Sullivan, H. Zhu, R. J. Kee, S. Menzer and D. Beeaff, J. Power Sources, 2009, 193, 706-712.

Ref No. 59. A. Leonide, B. Ruger, A. Weber, W. A. Meulenberg and E. Ivers-Tiffee, J. Electrochem. Soc., 2010, 157, B234-B239.

Ref No. 60. M. Kornely, N. Menzler, A. Weber and E. Ivers-Tiffee, Fuel Cells, 2013, 13, 506-510.

Ref No. 61. V. Sonn, A. Leonide and E. Ivers-Tiffee, J. Electrochem. Soc., 2008, 155, B675-B679.

Ref No. 62. B. Liu, H. Muroyama, T. Matsui, K. Tomida, T. Kabata and K. Eguchi, J. Electrochem. Soc., 2010, 157, B1858-B1864.

Ref No. 63. R. Barfod, M. Mogensen, T. Klemensø, A. Hagen, Y.-L. Liu and P. V. Hendriksen, J. Electrochem. Soc., 2007, 154, B371-B378.

Ref No. 64. S. M. Shin, B. Y. Yoon, J. H. Kim and J. M. Bae, Int. J. Hydrog. Energy, 2013, 38, 8954-8964.

Ref No. 65. Y. Xiong, K. Yamaji, H. Kishimoto, M. E. Brito, T. Horita and H. Yokokawa, Electrochem. Solid State Lett., 2009, 12, B31-B33.

Ref No. 66. S. P. Simner, M. D. Anderson, L. R. Pederson and J. W. Stevenson, J. Electrochem. Soc., 2005, 152, A1851-A1859.

Ref No. 67. M. Backhaus-Ricoult, Solid State Ionics, 2006, 177, 2195-2200.

Ref No. 68. M. Backhaus-Ricoult, K. Adib, T. S. Clair, B. Luerssen, L. Gregoratti and A. Barinov, Solid State Ionics, 2008, 179, 891-895.

Ref No. 69. J. Nielsen and M. Mogensen, Solid State Ionics, 2011, 189, 74-81.

Ref No. 70. H. Liu, X. Zhu, M. Cheng, Y. Cong and W. Yang, Chem. Commun., 2011, 47, 2378-2380.

Ref No. 71. Z. A. Munir, D. V. Quach and M. Ohyanagi, J. Am. Ceram. Soc., 2011, 94, 1-19.

Ref No. 72. J. H. Shim, S. Kang, S.-W. Cha, W. Lee, Y. B. Kim, J. S. Park, T. M. Gur, F. B. Prinz, C.-C. Chao and J. An, J. Mater. Chem. A, 2013, 1, 12695-12705.

Ref No. 73. J. An, J. H. Shim, Y.-B. Kim, J. S. Park, W. Lee, T. M. Gür and F. B. Prinz, MRS Bulletin, 2014, 39, 798-804.

Ref No. 74. J. M. Polfus, B. Yildiz and H. L. Tuller, Phys. Chem. Chem. Phys., 2018, 20, 19142-19150.

Ref No. 75. J. Maier, Chem. Mater., 2014, 26, 348-360.

Ref No. 76. S. Lee and J. L. MacManus-Driscoll, APL Mater., 2017, 5, 042304.

Ref No. 77. T. Mayeshiba and D. Morgan, Phys. Chem. Chem. Phys., 2014, 17, 2715-2721.

Ref No. 78. Maier, J. (2002). Nano-sized mixed conductors (Aspects of nano-ionics. Part III). Solid State Ionics, 148(3-4), 367-374.

Ref No. 79. Sata, N., Eberman, K., Eberl, K., & Maier, J. (2000). Mesoscopic fast ion conduction in nanometre-scale planar heterostructures. Nature, 408(6815), 946-949. doi:10.1038/35050047

Ref No. 80. Maier, J. (2005). Nanoionics: ion transport and electrochemical storage in confined systems. Nature Materials, 4(11), 805-815. doi:10.1038/nmat1513

Ref No. 81. Wachsman, E. D., & Lee, K. T. (2011). Lowering the Temperature of Solid Oxide Fuel Cells. Science, 334(6058), 935-939. doi:10.1126/science.1204090

Ref No. 82. J. Mizusaki, T. Saito and H. Tagawa, J. Electrochem. Soc., 1996, 143, 3065-3073.

Ref No. 83. M. Kuznecov, P. Otschik, P. Obenaus, K. Eichler and W. Schaffrath, Solid State Ionics, 2003, 157, 371-378.

Ref No. 84. S. Jiang and J. Love, Solid State Ionics, 2003, 158, 45-53.

Ref No. 85. Z. Cai, M. Kubicek, J. Fleig and B. Yildiz, Chem Mater, 2012, 24, 1116-1127.

Ref No. 86. Y. Chen, W. Jung, Z. Cai, J. J. Kim, H. L. Tuller and B. Yildiz, Energy Environ. Sci., 2012, 5, 7979-7988.

Ref No. 87. Zhao, K.; Xu, Q.; Huang, D.-P.; Chen, M.; Kim, B.-H. Microstructure and electrochemical properties of porous La2NiO4+δ electrodes spin-coated on Ce0.8Sm0.2O1.9 electrolyte. Ionics 2012, 18 (1-2), 75-83.

Ref No. 88. Gore, C. M.; White, J. O.; Wachsman, E. D.; Thangadurai, V. Effect of composition and microstructure on electrical properties and CO2 stability of donor-doped, proton conducting BaCe1-(x+y)ZrxNbyO3. Journal of Materials Chemistry A 2014, 2 (7), 2363-2373.

Ref No. 89. Kawada, T.; Suzuki, J.; Sase, M.; Kaimai, A.; Yashiro, K.; Nigara, Y.; Mizusaki, J.; Kawamura, K.; Yugami, H. Determination of oxygen vacancy concentration in a thin film of La0.6Sr0.4CoO3-δ by an electrochemical method. Journal of The Electrochemical Society 2002, 149 (7), E252-E259.

Ref No. 90. Jiang, S. P.; Zhang, J. P.; Zheng, X. G., A comparative investigation of chromium deposition at air electrodes of solid oxide fuel cells. J. Eur. Ceram. Soc. 2002, 22 (3), 361-373.

Ref No. 91. Yokokawa H, Horita T, Sakai N, Yamaji K, Brito M E, Xiong Y P, et al. Thermodynamic considerations on Cr poisoning in SOFC cathodes. Solid State Ionics 2006; 177:3193e8

Ref No. 92. Schuler J A, Wuillemin Z, Wyser A H, Comminges C, Steiner N Y, Van herle J. Cr-poisoning in (La,Sr)(Co,Fe)O3 cathodes after 10,000 h SOFC stack testing. J Power Sources 2012; 211:177e83

Ref No. 93. Simner S P, Anderson M D, Engelhard M H, Stevenson J W. Degradation Mechanisms of La—Sr—Co—Fe—O3 SOFC Cathodes. Electrochemical and Solid-State Letters. 2006; 9(10):A478-A81

Ref No. 94. T. M. Onn, R. Kungas, P. Fornasiero, K. Huang and R. J. Gorte, Inorganics, 2018, 6, 34.

Ref No. 95. B. J. O'Neill, D. H. Jackson, J. Lee, C. Canlas, P. C. Stair, C. L. Marshall, J. W. Elam, T. F. Kuech, J. A. Dumesic and G. W. Huber, ACS Catalysis, 2015, 5, 1804-1825.

Ref No. 96. S. M. George, Chem. Rev., 2010, 110, 111-131.

Ref No. 97. J. S. Park, Y. B. Kim, J. An, J. H. Shim, T. M. Gür and F. B. Prinz, Thin Solid Films, 2013, 539, 166-169.

Ref No. 98. C.-C. Chao, M. Motoyama and F. B. Prinz, Adv. Energy Mater., 2012, 2, 651-654.

Ref No. 99. X. Jiang, T. M. Gur, F. B. Prinz and S. F. Bent, Chem. Mater., 2010, 22, 3024-3032.

Ref No. 100. J. H. Shim, X. Jiang, S. F. Bent and F. B. Prinz, J. Electrochem. Soc., 2010, 157, B793-B797.

Ref No. 101. Y. Chen, A. Hinerman, L. Liang, K. Gerdes, S. P. Navia, J. Prucz and X. Song, J. Power Sources, 2018, 405, 45-50.

Ref No. 102. T. Onn, R. Kungas, P. Fornasiero, K. Huang and R. Gorte, Inorganics, 2018, 6, 34.

Ref No. 103. Chen, Y., Gerdes, K., & Song, X. (2016). Nanoionics and Nanocatalysts: Conformal Mesoporous Surface Scaffold for Cathode of Solid Oxide Fuel Cells. Scientific Reports, 6, 32997. doi:10.1038/srep32997.

Ref No. 104. Steele, B. C. H.; Heinzel, A. Materials for Fuel-Cell Technologies. Nature 2011, 414, 345-352.

Ref No. 105. Lee, K. T.; Wachsman, E. D. Role of Nanostructures on SOFC Performance at Reduced Temperatures. MRS Bull. 2014, 39, 783-791.

Ref No. 106. Ding, D.; Li, X.; Lai, S. Y.; Gerdes, K.; Liu, M. Enhancing SOFC Cathode Performance by Surface Modification through Infiltration. Energy Environ. Sci. 2014, 7, 552-575.

Ref No. 107. Li, X.; Blinn, K.; Chen, D.; Liu, M. In Situ and Surface-Enhanced Raman Spectroscopy Study of Electrode Materials in Solid Oxide Fuel Cells. Electrochem. Energy Rev. 2018, 1, 433-59.

Ref No. 108. Singhal, S. C. Solid Oxide Fuel Cells for Stationary, Mobile, and Military Applications. Solid State Ionics 2002, 152, 405-410.

Ref No. 109. Advanced Research Projects Agency—Energy. https://arpa-e.energy.gov/?q=workshop/fuel-cell-and-heat-engine-hybrid-chp-systems (accessed Aug. 27, 2018).

Ref No. 110. George, S. M. Atomic Layer Deposition: An Overview. *Chem. Rev.* 2010, 110, 111-131.

Ref No. 111. Miikkulainen, V.; Leskela, M.; Ritala, M.; Puurunen, R. L. Crystallinity of Inorganic Films Grown by Atomic Layer Deposition: Overview and General Trends. *J. Appl. Phys.* 2013, 113, 021301.

Ref No. 112. Chao, C.-C.; Motoyama, M.; Prinz, F. B. Nanostructured Platinum Catalysts by Atomic-Layer Deposition for Solid-Oxide Fuel Cells. *Adv. Energy Mater.* 2012, 2, 651-654.

Ref No. 113. Jiang, X.; Gur, T. M.; Prinz, F. B.; Bent, S. F. Atomic Layer Deposition (ALD) Co-Deposited Pt—Ru Binary and Pt Skin Catalysts for Concentrated Methanol Oxidation. *Chem. Mater.* 2010, 22, 3024-3032.

Ref No. 114. O'Neill, B. J.; Jackson, D. H.; Lee, J.; Canlas, C.; Stair, P. C.; Marshall, C. L.; Elam, J. W.; Kuech, T. F.; Dumesic, J. A.; Huber, G. W. Catalyst Design with Atomic Layer Deposition. *ACS Catal.* 2015, 5, 1804-1825.

Ref No. 115. Choi, H. J.; Bae, K.; Grieshammer, S.; Han, G. D.; Park, S. W.; Kim, J. W.; Jang, D. Y.; Koo, J.; Son, J. W.; Martin, M. Surface Tuning of Solid Oxide Fuel Cell Cathode by Atomic Layer Deposition. *Adv. Energy Mater.* 2018, 8, 1802506.

Ref No. 116. Irvine, J. T. S.; Neagu, D.; Verbraeken, M. C.; Chatzichristodoulou, C.; Graves, C.; Mogensen, M. Evolution of The Electrochemical Interface in High-Temperature Fuel Cells and Electrolysers, *Nat. Energy* 2016, 1, 15014.

Ref No. 117. Vohs, J. M.; Gorte, R. High-Performance SOFC Cathodes Prepared by Infiltration, *Adv. Mater.* 2009, 21, 943-956.

Ref No. 118. Lee, S.; Miller, N.; Abernathy, H.; Gerdes, K.; Manivannan, A. Effect of Sr-doped LaCoO3 and LaZrO3 Infiltration on the Performance of SDC-LSCF Cathode. *J. Electrochem. Soc.* 2011, 158, B735-B742.

Ref No. 119. Chen, Y.; Gerdes, K.; Song, X. Nanoionics and Nanocatalysts: Conformal Mesoporous Surface Scaffold for Cathode of Solid Oxide Fuel Cells. *Sci. Rep.* 2016, 6, 32997.

Ref No. 120. Tian, N.; Lu, B.-A.; Yang, X.-D.; Huang, R.; Jiang, Y.-X.; Zhou, Z.-Y.; Sun, S.-G. Rational Design and Synthesis of Low-Temperature Fuel Cell Electrocatalysts. *Electrochem. Energy Rev.* 2018, 1, 54-83.

Ref No. 121. Debe, M. K. Electrocatalyst Approaches and Challenges for Automotive Fuel Cells. *Nature* 2012, 486, 43-51.

Ref No. 122. Chen, D.; Huang, C.; Ran, R.; Park, H. J.; Kwak, C.; Shao, Z. New $Ba_{0.5}Sr_{0.5}Co_{0.8}Fe_{0.2}O_{3-\delta}+Co_3O_4$ Composite Electrode for IT-SOFCs with Improved Electrical Conductivity and Catalytic Activity. *Electrochem. Commun.* 2011, 13, 197-199.

Ref No. 123. Zhang, Z.; Wang, J.; Chen, Y.; Tan, S.; Shao, Z.; Chen, D. In Situ Formation of A 3D Core-Shell and Triple-Conducting Oxygen Reduction Reaction Electrode for Proton-Conducting SOFCs. *J. Power Sources* 2018, 385, 76-83.

Ref No. 124. Chen, Y.; Hinerman, A.; Liang, L.; Gerdes, K.; Navia, S. P.; Prucz, J.; Song, X. Conformal Coating of Cobalt Oxide on Solid Oxide Fuel Cell Cathode and Resultant Continuously Increased Oxygen Reduction Reaction Kinetics Upon Operation. *J. Power Sources* 2018, 405, 45-50.

Ref No. 125. Bai, Y.; Liu, M.; Ding, D.; Blinn, K.; Qin, W.; Liu, J.; Liu, M. Electrical and Electrocatalytic Properties of a $La_{0.8}Sr_{0.2}Co_{0.17}Mn_{0.83}O_{3-\delta}$ Cathode for Intermediate-Temperature Solid Oxide Fuel Cells. *J. Power Sources* 2012, 205, 80-85.

Ref No. 126. Baumann, F. S.; Fleig, J.; Habermeier, H.-U.; Maier, J. Impedance Spectroscopic Study on Well-Defined $(La,Sr)(Co,Fe)O_{3-\delta}$ Model Electrodes. *Solid State Ionics* 2006, 177, 1071-1081.

G. ASPECTS

The following listing of exemplary aspects supports and is supported by the disclosure provided herein.

Aspect 1.

A method of forming an electrocatalyst structure on an electrode, comprising: depositing a first layer on the electrode using atomic layer deposition (ALD), wherein the first layer comprises a plurality of discrete nanoparticles of a first electrocatalyst; and depositing one or more of a second layer on the first layer and the electrode using ALD, wherein the each of the one or more second layers independently comprises a second electrocatalyst; wherein the first layer and the one or more second layers collectively form a deposited electrocatalyst structure on the electrode.

Aspect 2.

The method of the previous aspect, wherein the first electrocatalyst comprises a catalyst for oxygen reduction reaction (ORR).

Aspect 3.

The method of any one of the previous aspects, wherein the first electrocatalyst comprises a noble metal.

Aspect 4.

The method of any one of the previous aspects, wherein the first electrocatalyst comprises platinum (Pt).

Aspect 5.

The method of any one of the previous aspects, wherein the discrete nanoparticles of the deposited electrocatalyst structure have an average particle size of less than about 200 nanometers in the largest dimension Aspect 6.

The method of any one of the previous aspects, wherein the second electrocatalyst comprises an electronically conducting material that has catalytic activity for ORR.

Aspect 7.

The method of any one of the previous aspects, wherein the second electrocatalyst comprises a metal oxide comprising one or more transition metals.

Aspect 8.

The method of any one of the previous aspects, wherein the second electrocatalyst comprises a metal oxide comprising manganese cobalt, or both, having the formula $(Mn_{1-y}Co_y)_3O_4$, wherein y has a value from 0.0 to 1.0.

Aspect 9.

The method of any one of the previous aspects, wherein each of the one or more second layers of the deposited electrocatalyst structure, independently, has a thickness of from about 1 nanometers to about 200 nanometers.

Aspect 10.

The method of any one of the previous aspects, wherein the electrode comprises a porous substrate having at least one internal surface.

Aspect 11.

The method of any one of the previous aspects, wherein at least a portion of the deposited electrocatalyst structure is disposed on an internal surface of the porous substrate.

Aspect 12.

The method of any one of the previous aspects, wherein the method further comprises subjecting the electrode to electrochemical operation at a temperature equal to or greater than about 650° C., resulting in the transformation of the deposited electrocatalyst structure to an operated electrocatalyst structure.

Aspect 13.

The method of any one of the previous aspects, wherein the subjecting the electrode to electrochemical operation results in a plurality of pores or fissures extending through the thickness of the second layer.

Aspect 14.

The method of any one of the previous aspects, wherein the subjecting the electrode to electrochemical operation results in the formation of a plurality of discrete nanograins of the second electrocatalyst separated by intergranular grain boundaries.

Aspect 15.

The method of any one of the previous aspects, wherein the subjecting the electrode to electrochemical operation results in the formation of a plurality of TPBs at the intergranular grain boundaries.

Aspect 16.

The method of any one of the previous aspects, wherein the subjecting the electrode to electrochemical operation results in at least a portion of the plurality of the nanoparticles of the first electrocatalyst populating adjacent one or more of the TPBs at the intergranular grain boundaries.

Aspect 17.

The method of any one of the previous aspects, wherein the subjecting the electrode to electrochemical operation results in the formation of a plurality of coupled grains comprising one of the plurality of nanoparticles of the first electrocatalyst, and a nanograin of the second electrocatalyst.

Aspect 18.

The method of any one of the previous aspects, wherein the subjecting the electrode to electrochemical operation results in the formation of a plurality of core-shell nanostructures, each core-shell nanostructure comprising a core comprising a nanoparticle of the first electrocatalyst, that is at least partially covered by a shell comprising the second electrocatalyst.

Aspect 19.

An electrode comprising a first electrode substrate, and an electrocatalyst nanostructure disposed on the first electrode substrate and comprising: a first layer disposed on at least one surface of the first electrode substrate, and comprising a plurality of discrete nanoparticles of a first electrocatalyst; and one or more of a second layer disposed superjacent the first layer and the first electrode substrate, wherein each of the one or more second layer independently comprising a second electrocatalyst.

Aspect 20.

The electrode of any one of the previous aspects, wherein the first electrocatalyst comprises a catalyst for ORR.

Aspect 21.

The electrode of any one of the previous aspects, wherein the first electrocatalyst comprises a noble metal.

Aspect 22.

The electrode of any one of the previous aspects, wherein the first electrocatalyst is platinum.

Aspect 23.

The electrode of any one of the previous aspects, wherein the plurality of discrete nanoparticles have an average particle size of less than about 200 nanometers in the largest dimension.

Aspect 24.

The electrode of any one of the previous aspects, wherein the plurality of discrete nanoparticles have an average particle size of about 1 nanometers to about 200 nanometers in the largest dimension.

Aspect 25.

The electrode of any one of the previous aspects, wherein the second electrocatalyst comprises an electronically conducting material that has catalytic activity for ORR.

Aspect 26.

The electrode of any one of the previous aspects, wherein the second electrocatalyst comprises a metal oxide comprising one or more transition metals.

Aspect 27.

The electrode of any one of the previous aspects, wherein the second electrocatalyst comprises a metal oxide comprising manganese cobalt, or both, having the formula $(Mn_{1-y}Co_y)_3O_4$, wherein y has a value from 0.0 to 1.0.

Aspect 28.

The electrode of any one of the previous aspects, wherein the second electrocatalyst comprises $(Mn_{0.8}Co_{0.2})_3O_4$ Aspect 29.

The electrode of any one of the previous aspects, wherein each of the one or more second layers independently has a thickness of from about 1 nanometers to about 200 nanometers Aspect 30.

The electrode of any one of the previous aspects, wherein the first electrode substrate comprises a porous substrate.

Aspect 31.

The electrode of any one of the previous aspects, wherein at least a portion of the electrocatalyst nanostructure is disposed on an internal surface of the porous substrate Aspect 32.

The electrode of any one of the previous aspects, wherein the first electrode substrate is a composite comprising at least one electrolyte material and at least one electronically conductive material.

Aspect 33.

The electrode of any one of the previous aspects, wherein the electrolyte material comprises yttrium-stabilized zirconium (YSZ) and the electronically conductive material comprises lanthanum strontium manganite (LSM).

Aspect 34.

The electrode of any one of the previous aspects, wherein the electrolyte material comprises samarium doped ceria (SDC) and the electronically conductive material comprises lanthanum strontium cobalt ferrite (LSCF)

Aspect 35.

The electrode of any one of the previous aspects, wherein the electrode has at least one three phase boundary (TPB) disposed between the electrolyte material and the electronically conductive material.

Aspect 36.

The electrode of any one of the previous aspects, wherein after subjecting the electrode to an electrochemical operation at a temperature of equal to or greater than about 650° C., the electrocatalyst nanostructure is transformed to an operated electrocatalyst nanostructure comprising the first layer and the one or more second layers.

Aspect 37.

The electrode of any one of the previous aspects, wherein each of the one or more second layers of the operated electrocatalyst nanostructure comprises a plurality of discrete nanograins separated by intergranular grain boundaries.

Aspect 38.

The electrode of any one of the previous aspects, wherein the operated electrocatalyst nanostructure comprises a plurality of TPBs at the intergranular grain boundaries.

Aspect 39.

The electrode of any one of the previous aspects, wherein at least a portion of the plurality of the nanoparticles of the first electrocatalyst populate adjacent one or more of the TPBs at the intergranular grain boundaries.

Aspect 40.

The electrode of any one of the previous aspects, wherein the operated electrocatalyst nanostructure comprises a plurality of coupled grains comprising one of the plurality of nanoparticles of the first electrocatalyst, and a nanograin of the second electrocatalyst.

Aspect 41.

The electrode of any one of the previous aspects, wherein the operated electrocatalyst nanostructure comprises a plurality of core-shell nanostructures, each core-shell nanostructure comprising a core comprising a nanoparticle of the first electrocatalyst, that is at least partially covered by a shell comprising the second electrocatalyst.

Aspect 42.

An electrochemical energy conversion device comprising the electrode of any one of the previous aspects.

Aspect 43.

The electrochemical energy conversion device of any one of the previous aspects comprising a solid oxide fuel cell, a solid oxide electrolyzing cell, or a proton conductor.

Aspect 44.

The electrochemical energy conversion device of any one of the previous aspects, wherein the device has a cell polarization resistance of greater than about 25%, as compared to that of a comparable electrochemical energy conversion device without the electrocatalyst nanostructure.

Aspect 45.

The electrochemical energy conversion device of any one of the previous aspects, wherein the device has a an increase in peak power density of greater than about 200%, as compared to that of a comparable electrochemical energy conversion device without the electrocatalyst nanostructure.

Aspect 46.

The electrochemical energy conversion device of any one of the previous aspects, wherein the device has a an increase an increase in power density measured at 0.8V of up to about 380%, as compared to that of a comparable electrochemical energy conversion device without the electrocatalyst nanostructure.

From the foregoing, it will be seen that aspects herein are well adapted to attain all the ends and objects hereinabove set forth together with other advantages which are obvious and which are inherent to the structure.

While specific elements and steps are discussed in connection to one another, it is understood that any element and/or steps provided herein is contemplated as being combinable with any other elements and/or steps regardless of explicit provision of the same while still being within the scope provided herein.

It will be understood that certain features and subcombinations are of utility and may be employed without reference to other features and subcombinations. This is contemplated by and is within the scope of the claims.

Since many possible aspects may be made without departing from the scope thereof, it is to be understood that all matter herein set forth or shown in the accompanying drawings and detailed description is to be interpreted as illustrative and not in a limiting sense.

It is also to be understood that the terminology used herein is for the purpose of describing particular aspects only, and is not intended to be limiting. The skilled artisan will recognize many variants and adaptations of the aspects described herein. These variants and adaptations are intended to be included in the teachings of this disclosure and to be encompassed by the claims herein.

Now having described the aspects of the present disclosure, in general, the following Examples describe some additional aspects of the present disclosure. While aspects of the present disclosure are described in connection with the following examples and the corresponding text and figures, there is no intent to limit aspects of the present disclosure to this description. On the contrary, the intent is to cover all alternatives, modifications, and equivalents included within the spirit and scope of the present disclosure.

H. EXAMPLES

The following examples are put forth so as to provide those of ordinary skill in the art with a complete disclosure and description of how the compounds, compositions, articles, devices and/or methods claimed herein are made and evaluated, and are intended to be purely exemplary of the disclosure and are not intended to limit the scope of what the inventors regard as their disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Materials and Methods

Solid Oxide Fuel Cells.

Commercially-available, anode supported solid oxide button cells fabricated by Materials and Systems Research, Inc. (MSRI, Salt Lake City, Utah) were employed for the following examples. MSRI cells with LSM/YSZ cathodes were composed of five layers as follows, starting from the anode: ~0.9 mm thick Ni/YSZ cermet layer which supports the cell structure; 15 μm thick Ni/YSZ active layer; ~12 μm thick YSZ electrolyte; ~15 μm thick $La_{0.8}Sr_{0.2}MnO_3$/8YSZ active layer; and 50 μm thick, pure LSM current collecting layer. The cell active area (limited by the cathode) is 2 cm². The exposure area of the anode to fuel is about 3.5 cm². For the cells with LSCF/SDC cathodes, a commercially-available anode-supported button cell from MSRI (Salt Lake City, Utah) was provided as a baseline cell with approx. 30 mm in diameter. The 10 μm-thick YSZ electrolyte was supported by an approximately 750 μm-thick Ni—YSZ anode. The 2.0 cm² cathode was, in sequence, composed of a top LSCF current collecting layer (50 μm-thick), a functional layer of SDC-LSCF (10 μm thick), and a dense 1-2 μm-thick SDC buffer layer on the YSZ electrolyte.

ALD Coating.

The ALD coatings were performed in a commercial GEMStar-8 ALD reactor from Arradiance Inc. The precursors used in this study were all commercially-available precursors purchased from Strem Chemicals, Inc. For the Pt layer, (trimethyl)methylcyclopentadienylplatinum(IV), (99%) was used as the Pt precursor and deionized water was used as the oxidant. For $(Mn_{0.8}Co_{0.2})O_x$ layer growth, a bis(cyclopentadienyl)manganese (98+%) was used for the Mn layer, a bis(cyclopentadienyl)cobalt (II), (min. 98% cobaltocene) was used for the Co layer, and ozone was used as an oxidant. For the $CoO_x$ layer growth, bis(cyclopentadienyl)cobalt (II), (min. 98% cobaltocene) was used as Co precursor and ozone was used as oxidant. During the deposition, the (trimethyl)methylcyclopentadienylplatinum, bis(cyclopentadienyl)manganese, and bis(cyclopentadienyl)cobalt containers were maintained at 75° C., 90° C. and 90° C., respectively; and the reactor chamber was set at 300° C. Multiple cycles were performed for each element deposition, leading to a multi-layer ALD coating of Pt first, followed by either $Co_3O_4$ or $(MnCo)_3O_4$ layer, as specified in the examples. This is simple one-step processing of as-received cells, and the change of the chemistry in ALD layer was achieved through computer controlled automatic switching of the precursors. No surface pretreatment was applied to the cells, and no heat-treatment was applied before or after ALD coating either. The cell electrochemical operation was carried out directly after ALD coating.

Performance Tests.

All cell tests were performed on a test stand. Platinum mesh was used for anode and cathode lead connections. The fuel and air stream flow rates were controlled separately using mass flow controllers. Cell testing was performed at 650° C. or 750° C., as specified. During the operation, a 600 mL/min air flow rate and a 600 mL/min fuel flow rate were used. Before any electrochemical measurements, all cells were current-treated for approximately 16 h under a small current density of 0.1 A/cm² to ensure they were activated. After that, all samples were loaded at a constant current of 0.3 A/cm² for desired periods. The cell performance was examined using a TrueData-Load Modular Electronic DC Load which guarantees voltage and current accuracies of 0.03% FS of range selected+/−0.05% of value. The cell impedance spectra were examined using a potentiostat/galvanostat (Solartron 1287A) equipped with a frequency response analyzer (Solartron 1260). All data reported was taken after current treat for comparison. Impedance measurements were carried out using a Solartron 1260 frequency response analyzer in a frequency range from 50 mHz to 100 KHz. The impedance spectra and resistance ($R_s$ and $R_p$) presented are those measured under a DC bias current of 0.3 A/cm². On a Nyquist plot, $R_s$ is determined by the intercept at the higher frequency end and $R_p$ is determined by the distance between two intercepts.

Nanostructural and Crystallographic Examination.

ALD coated cells were sectioned and subjected to nanostructural and crystallographic examination using high resolution (HR) Transmission Electron Microscopy (TEM). All the TEM examinations were conducted in the cathode active layer. TEM samples were prepared by mechanical polishing and ion milling in a liquid-nitrogen cooled holder. Electron diffraction, diffraction contrast and HRTEM imaging were performed using a JEM-2100 operated at 200 kV. Chemical analysis was carried out under TEM using energy dispersive X-ray Spectroscopy (EDS).

Impedance Deconvolution and Equivalent Simulation.

The impedance deconvolution were performed based on the well-developed and excised protocols by different researchers. (Ref. Nos. 42-47) The devolution steps include: (a) processing the out-of-phase impedance Z″ to remove inductance and to extrapolate the Z″ data to very high and very low frequencies; (b) applying the Fast Fourier Transform (FFT) to the Z″ vs frequency data set; (c) dividing each element of the Z″ transform by the equivalent FFT element of the hyperbolic secant function; (d) filtering the dividend to remove high frequency noise; and (e) performing the inverse FFT to produce the deconvolution spectrum. From the deconvolution spectra, the number of arc-forming elements was identified. The following iterative steps were followed for obtaining the appropriate equivalent circuit and their best fit parameters: (a) Prior to fitting the equivalent circuit to the impedance data, the impedance of the equivalent circuit was calculated; (b) the parameters were adjusted to get an approximate match while making sure that the peak frequencies obtained from the deconvolution spectra were preserved; (c) Then ZView® software was used to obtain the least squares fit of the equivalent parameters to the data.

2. Example 1. Electrode with Multi-Layer ALD Coating

In this example, the performance of two exemplary ALD-coated fuel cells were evaluated and compared to two baseline control cells. This example demonstrates a simple approach of introducing the nano-porous heterogeneous multifunctional coating layer on the internal surface of LSM/YSZ backbone using chemical vapor-based ALD. (Ref. Nos. 94-102)

Commercially-available anode-supported solid oxide fuel cells with LSM/YSZ cathodes (Cell #1) and LSCF/SDC cathodes (Cell #4) were provided as baseline control cells. Some commercially-available anode-supported cells with LSM/YSZ cathodes were subjected to ALD coating, using methods described above to provide sample cells. For this example, the as-deposited ALD multi-layer consisted of a subjacent Pt layer with discrete ~3 nm Pt particles (Ref. No. 48) and a superjacent $(Mn_{0.8}Co_{0.2})_3O_4$ layer with thickness of either 5 nm (Cell #2) or 15 nm (Cell #3). A schematic showing the as-deposited ALD layers is provided in FIG. 1.

a. Electrochemical Performance Results

The performance of two exemplary ALD coated cells (Cell #2, and Cell #3) along with two baseline cells having LSM/YSZ (Cell #1) and LSCF/SDC cathode (Cell #4) were evaluated through electrochemical operation carried out at 750° C. in $H_2$ and air for anode and cathode respectively. The cell performances are shown in FIG. 2 and listed in Table 1-1.

TABLE 1-1

Power density and resistance at 750° C. for the cells with cathodes having different surface architecture.

| Cell | Backbone Surface architecture | $R_{total}$ ($\Omega$ cm²) | $R_s$ ($\Omega$ cm²) | $R_p$ ($\Omega$ cm²) | Peak P (W/cm²) | P at 0.8 V (W/cm²) | Peak power Enhancement factor to Cell #1 | Peak power Enhancement factor to Cell #4 |
|---|---|---|---|---|---|---|---|---|
| #1 | LSM/YSZ Baseline | 0.619 | 0.045 | 0.574 | 0.44 | 0.28 | 1 | / |
| #2 | Pt & 5 nm $(MnCo)O_x$ | 0.343 | 0.043 | 0.300 | 1.32 | 0.95 | 3.4 | 1.5 |
| #3 | Pt & 15 nm $(MnCo)O_x$ | 0.324 | 0.051 | 0.273 | 1.53 | 1.06 | 3.8 | 1.7 |
| #4 | LSCF/SDC Baseline | 0.350 | 0.110 | 0.239 | 0.95 | 0.63 | / | 1 |

For the baseline Cell #1 and Cell #4, the peak power density was 0.44 W/cm$^2$ and 0.95 W/cm$^2$, respectively, at 750° C. Such peak power densities of these commercial cells with YSZ electrolyte are consistent with the highest power density values reported for various lab-made cells with similar cell architecture. (Ref. Nos. 49-50) Significant power density increase (in FIG. 2A) was observed from the ALD coated cells. At 0 h operation, in comparison with the Cell #1, 340% and 380% increases in power densities at 0.8 V are achieved for the Cell #2 and Cell #3, respectively. Cell #3 had the peak power density of 1.53 W/cm$^2$ at 750° C., which is 347% of that from Cell #1. The SOFCs performance are strictly dependent on the individual cell architecture including, for example, the type and thickness of the electrolyte, and the thickness and structure of the Ni/YSZ anode. The commercial cells possess strict reproducible performance from cell to cell. This reproducibility is essential to evaluate the effectiveness of ALD coating. Even compared to the commercial baseline cell, with the thick YSZ electrolyte (15 micron in thickness) and the thick Ni/YSZ anode, the power density of 1.53 W/cm$^2$ from ALD coated Cell #3 was significantly higher than that of YSZ based SOFCs with LSM/YSZ cathode and similar cell architecture reported during the past 15 years. (Ref. Nos. 51-58) Meanwhile, to the best of our knowledge, such 347% peak power density increase is the highest performance enhancement ever reported for state-of-the-art commercial SOFCs modified with various infiltration techniques. Due to the negligible amount of ALD materials coated on to the cathode of the exemplary cells, the 347% increase was simultaneously achieved in terms of both power density and specific power.

Figure 2A:
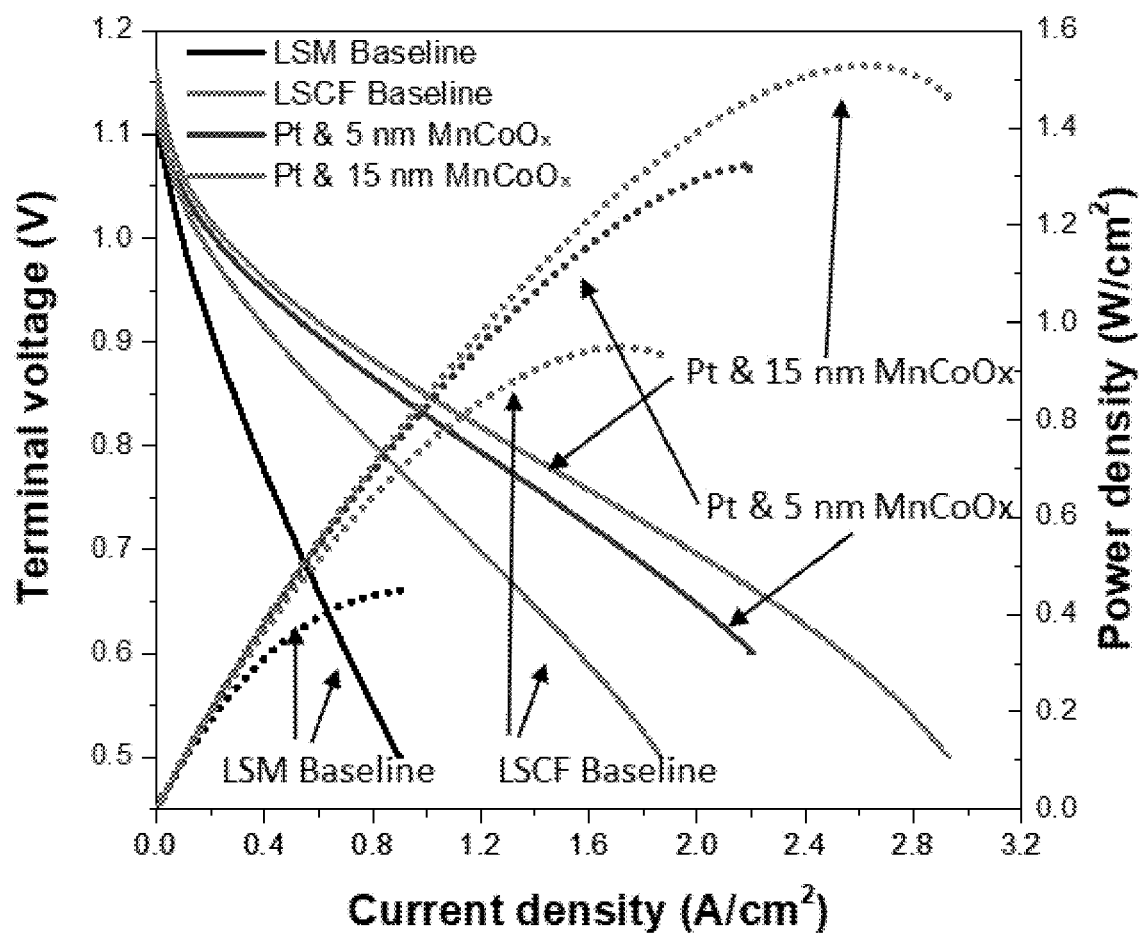
FIGS. 2A-2D show electrochemical performance and impedance data for Cell #1 LSM baseline cell, Cell #2 LSM cell with Pt and 5 nm $(Mn_{0.8}Co_{0.2})_3O_4$ layer, Cell #3 the LSM cell with Pt and 15 nm $(Mn_{0.8}Co_{0.2})_3O_4$ layer, and Cell #4 the LSCF baseline cell, in accordance with Example 1.

Furthermore, at 0.8 V, the power density of the exemplary ALD coated LSM/YSZ Cell #3 was 170% greater than the commercial cell with mixed conducting LSCF/SDC cathode (Cell #4) operated under the same conditions, as shown in FIG. 2A and Table 1-1.

Figure 3A:
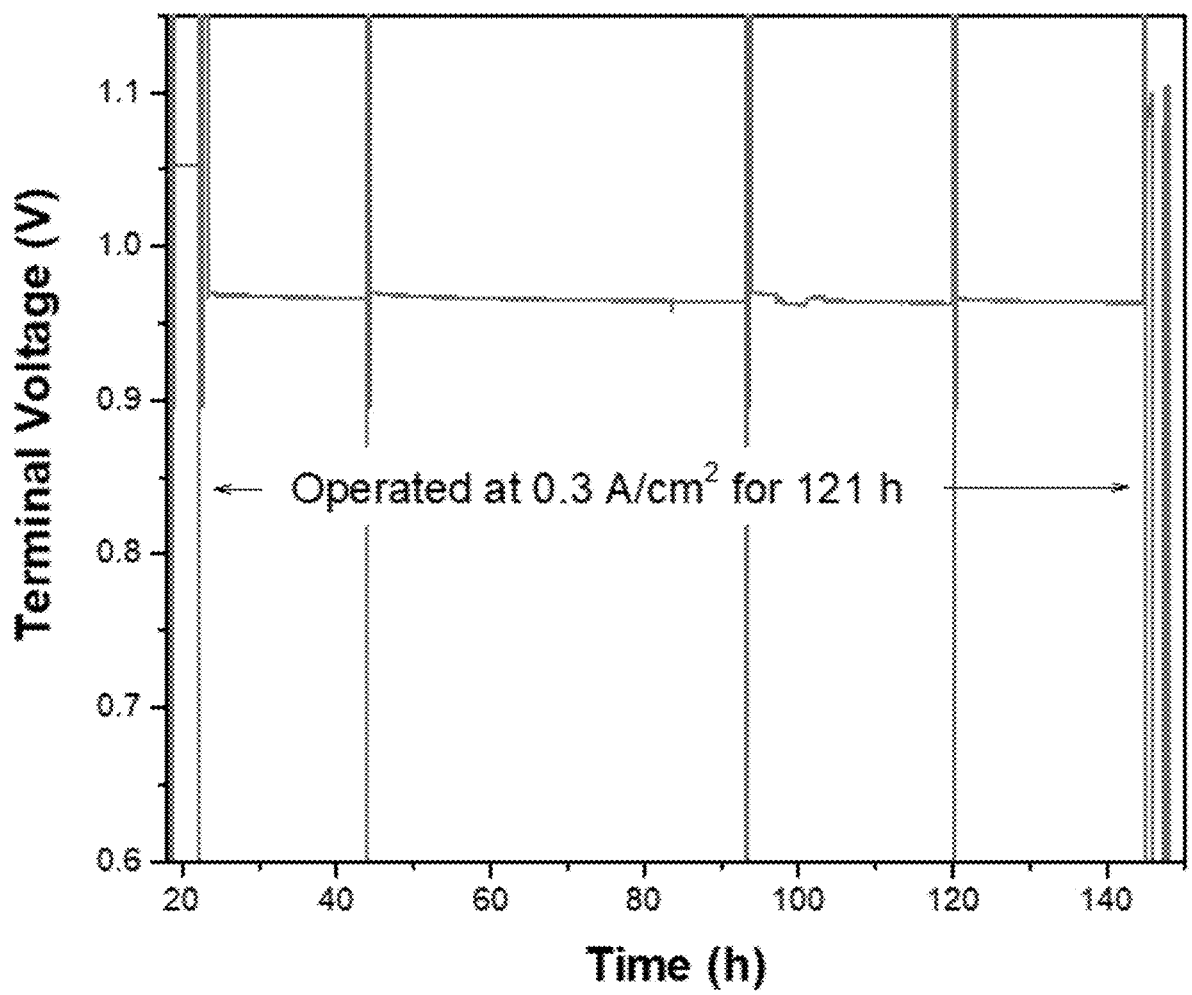
FIG. 3A shows terminal voltage of Cell #3 with Pt and 15 nm $(Mn_{0.8}Co_{0.2})_3O_4$ layer as a function of operating time at a constant current density of 0.3 A/cm$^2$ at 750° C., in accordance with Example 1.
Figure 3B:
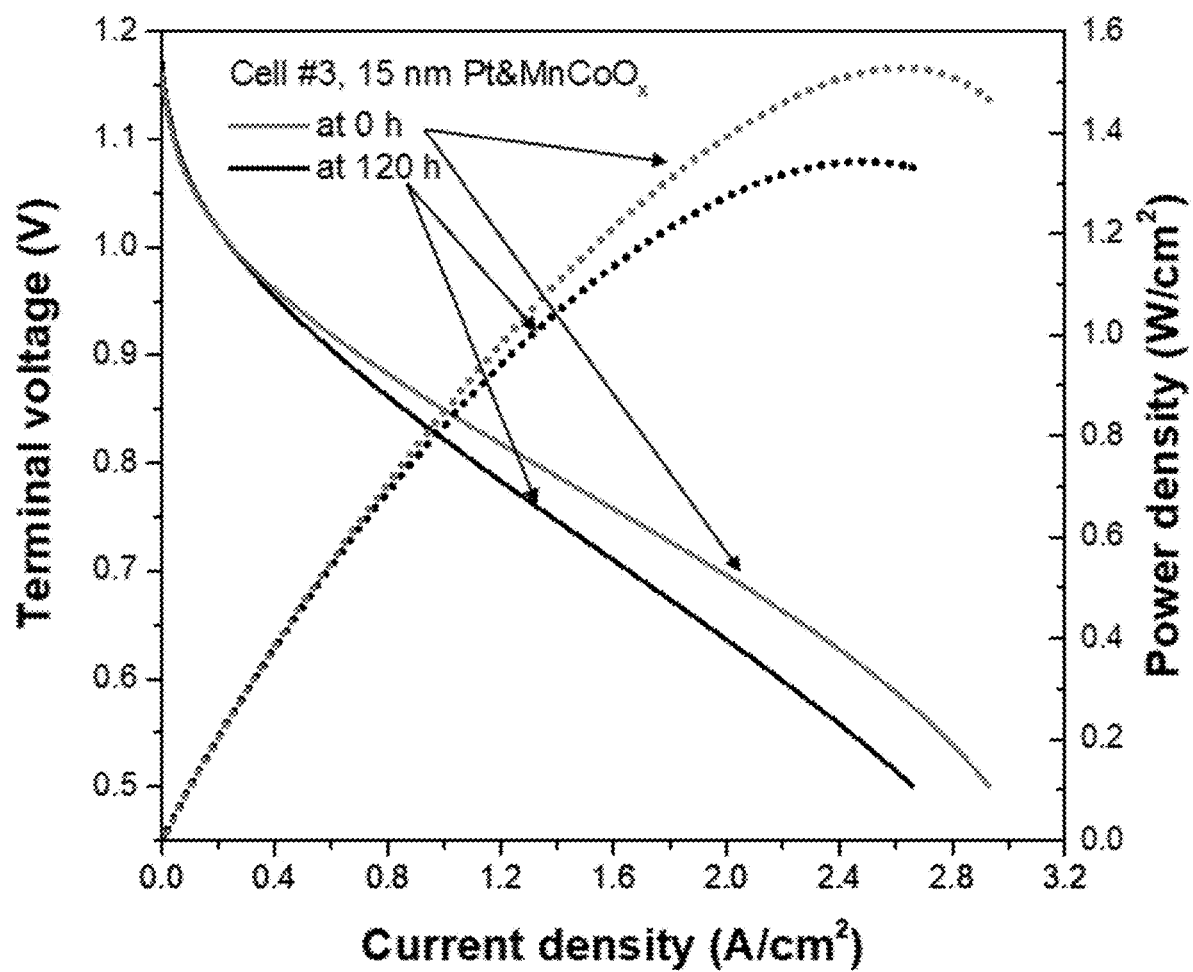
FIG. 3B shows terminal voltage and power density as a function of current density for Cell #3 at 0 h and 120 h operation in accordance with Example 1.

The best performing Cell #3 exhibited a slight decrease of power density over the first 24 h operation, reaching stable performance enhancement afterward (shown in FIG. 3a). After 120 h operation, Cell #3 remained at 305% of the peak power density of that from Cell #1 (in FIG. 3b) and exhibited the peak power density of 1.34 W/cm$^2$, which is still comparable to the best reported state-of-the-art SOFCs with either YSZ or SDC based electrolyte.

Figure 2B:
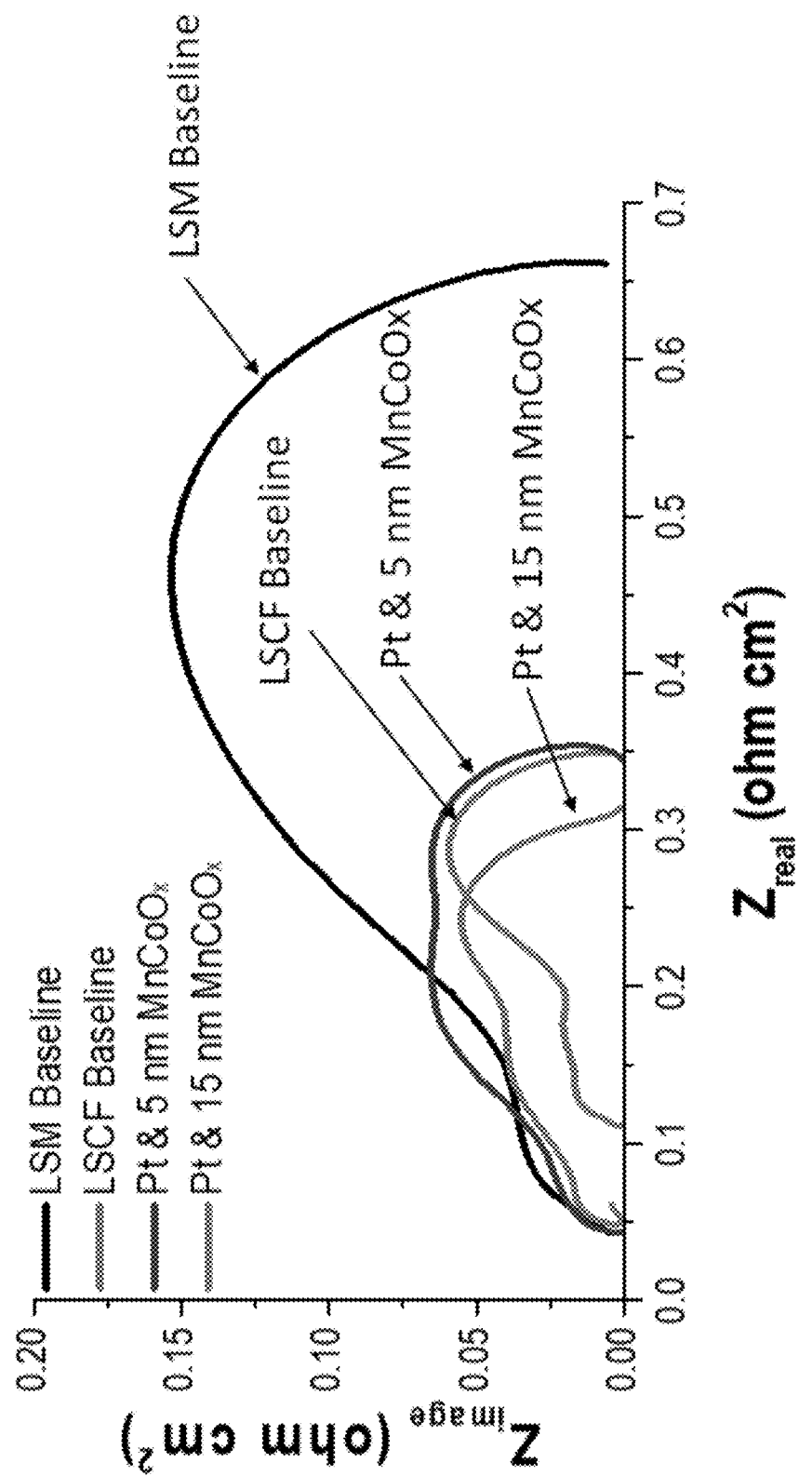
Figure 2C:
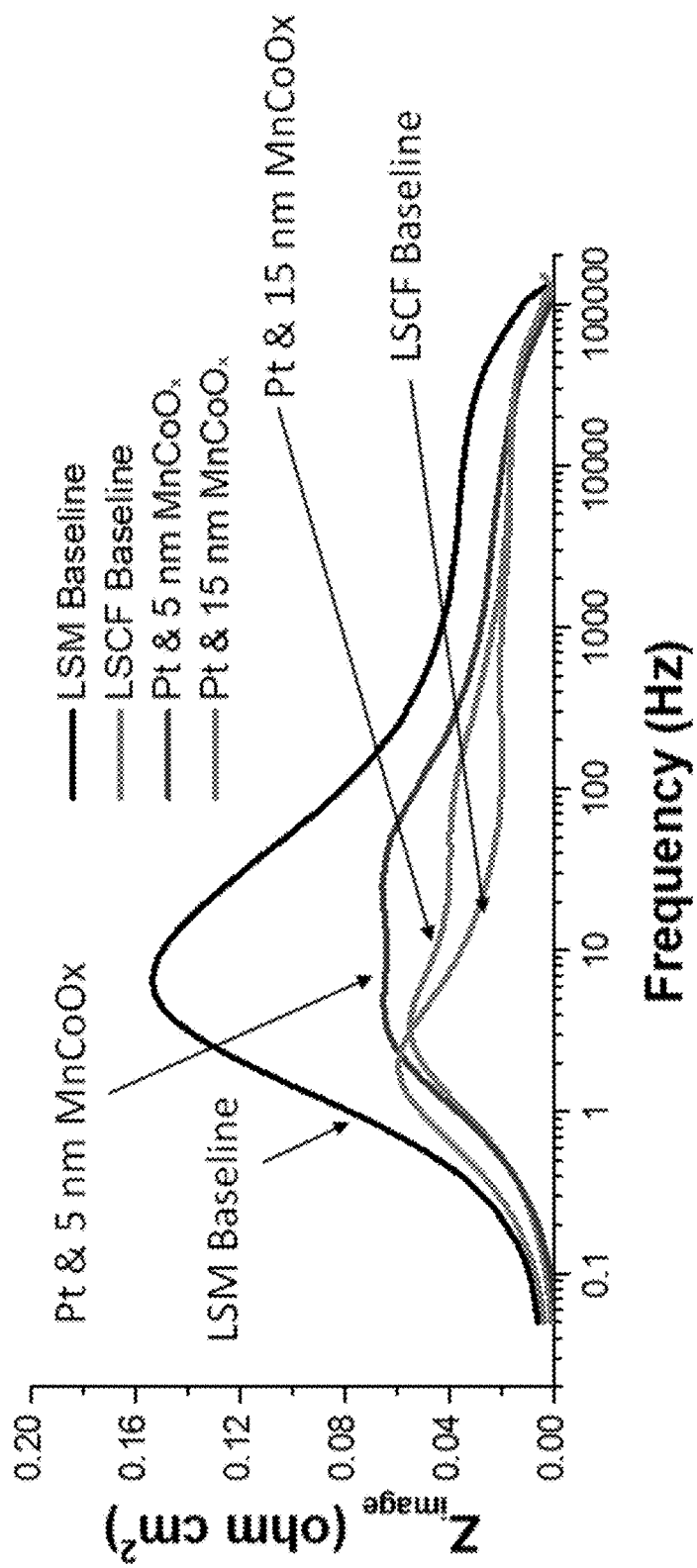

The power density enhancement of the exemplary ALD coated cells in this Example is accompanied by the substantially decreased polarization resistance $R_p$, with almost unchanged ohmic resistance $R_s$, as shown in the Nyquist and Bode plots in FIGS. 2B-C, and Table 1-1. $R_p$ of Cell #3 was smaller than that of Cell #2. Furthermore, Cell #3 featured comparable $R_p$ but much smaller $R_s$ as compared to the Cell #4 with LSCF/SDC cathode.

Figure 2D:
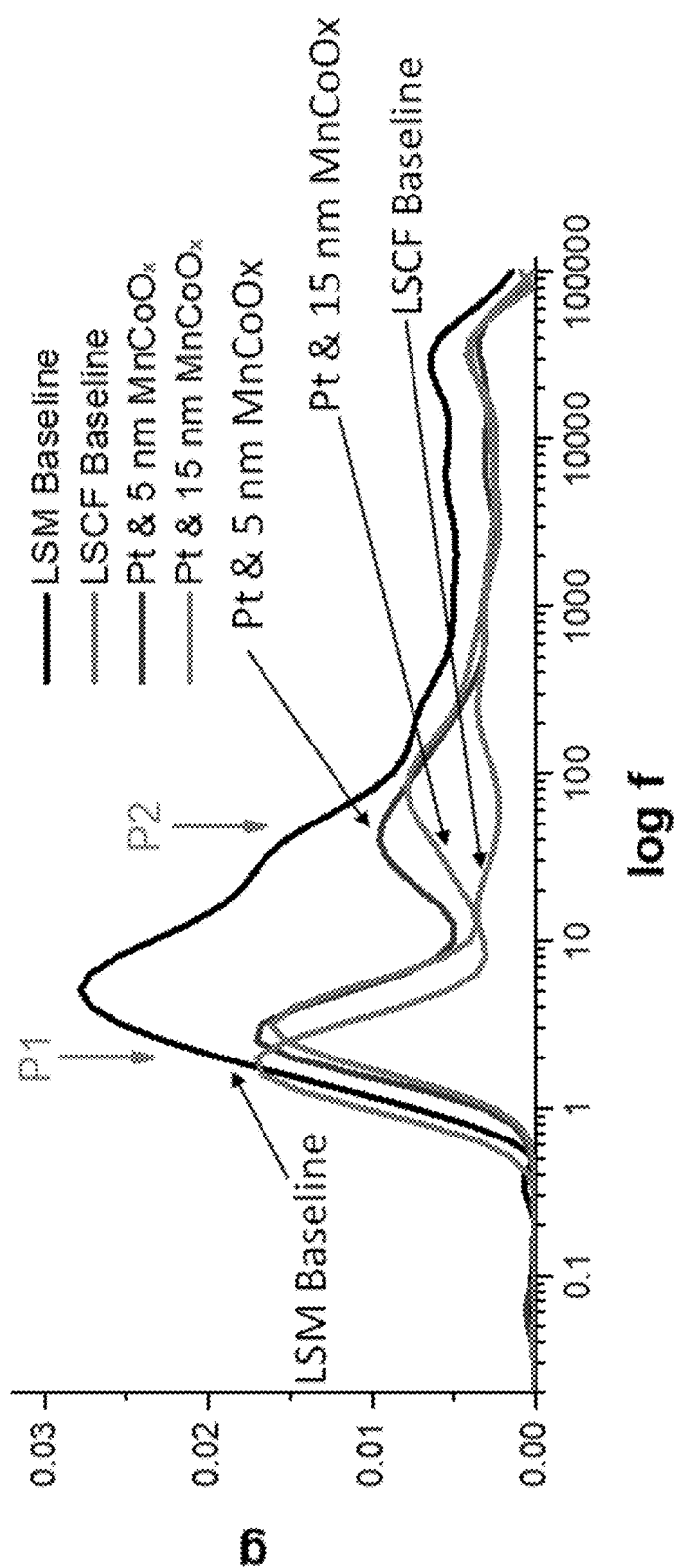

To identify the physical origin of the reduced resistance, the dynamic constant in the impedance data was accessed by evaluating the relaxation times and relaxation amplitude of the impedance-related processes using deconvolution. (Ref. Nos. 59-63) Through deconvolution, the distribution of relaxation times (DRT) resolves an impedance spectrum into a higher resolution plot that allows the identification of individual processes, as shown in FIG. 2d. The LSM/YSZ baseline cell exhibited two arcs P1 and P2, with the frequency ranging at 1-4 Hz and 10-200 Hz, respectively, that are largely overlapping each other. By contrast, the exemplary ALD coated cells exhibited two distinct arcs P1 and P2 with much-lower amplitude. Since the four cells possessed identical anode structures and operated under identical conditions, the lowered P1 arc of 1-4 Hz is attributable to changing of gas diffusion and dramatically lower ORR resistance in the cathode. (Ref. No. 62) P1 from Cell #3 was even lower than that of the baseline Cell #4 indicating higher catalytic activity towards ORR than that Cell #4 with LSCF/SDC cathode. For the arc P2 at ~70 Hz, the DRTs from Cells #2 and #3 were lower than that of the baseline Cell #1. It is well agreed in the literature that the physical origin of the arcs that arise at ~70 Hz are primarily due to oxygen transport along the surface and through the bulk in the cathode and YSZ electrolyte. (Ref. Nos. 59-63) The reduced amplitude of the arc P2 suggests the overall oxygen transport resistance was reduced in Cell #2 and Cell #3, in comparison with that of baseline Cell #1, but higher than that of the baseline Cell #4. In the frequency range higher than 200 Hz, the DRTs from Cell #3 and LSCF baseline Cell #4 showed similar amplitude signifying that oxygen transfer resistance at the cathode surface in Cell #3 is close to that of the LSCF/SDC cell (Cell #4).

The above deconvolution analysis revealed that the ORR kinetics and the related electron charge and oxygen mass transfer pathways have been significantly altered in Cell #2 and Cell #3 induced by ALD coating. For SOFC, the ORR and oxygen ion transport kinetics are largely affected by the nanostructure of electrode active surfaces that are directly interacting with the reactant gas species. The nanostructure and chemistry of the ALD coated Cell #2 and #3 were therefore subjected to the TEM imaging and analysis.

Representative TEM images (FIG. 4) from Cell #2 illustrate the LSM/YSZ surface structure with Pt and $(Mn_{0.8}Co_{0.2})_3O_4$ nano-grains. Pt particles presented bi-model distribution with the large Pt particles (up to about 100 nm) exclusively distributed at the original TPB regions (FIGS. 4A-B), while the very small Pt particles (about 10 nm) appeared at both the TPBs and on the YSZ surface (FIGS. 4C-F). Pt particles possessed strongly bonded interfaces with YSZ surface, some of the Pt particles were faceted and developed a well-defined crystal orientation relationship with YSZ grain as shown in FIG. 4E. The $(Mn_{0.8}Co_{0.2})_3O_4$ nano-grains on YSZ surface were rectangular shaped with the shorter dimension of about 5-7 nm and elongated along the YSZ grain surface (FIGS. 4C, 4E, 4F). By contrast, most of the LSM grain surface was free of Pt, as shown in FIG. 4B and FIG. 5. Occasionally, in the region that is adjacent to the original TPB region, sparsely distributed Pt grains appeared to be embedded at the interface between the $(Mn_{0.8}Co_{0.2})_3O_4$ and LSM (FIG. 4F). Overall, Pt emerged as selective wetting on YSZ grain surface and not on the LSM surface. Also, $(Mn_{0.8}Co_{0.2})_3O_4$ grains on LSM were irregularly shaped with a much larger dimension of about 30-50 nm (FIGS. 4D and 4E) as compared to about 10 nm $(Mn_{0.8}Co_{0.2})_3O_4$ grains on the YSZ surface.

This phenomenon of non-uniform wetting from Pt particles was eliminated in Cell #3 with 15 nm thick $(Mn_{0.8}Co_{0.2})_3O_4$ layer. After electrochemical operation for 120 h, Cell #3 exhibited a conformal and uniform ALD layer with subjacent Pt and superjacent $(Mn_{0.8}Co_{0.2})_3O_4$ (FIG. 6A). Remarkably, the $(Mn_{0.8}Co_{0.2})_3O_4$ grains and Pt particles were all about 10 nm in dimension, and the Pt particles were simultaneously pinned on both the YSZ and LSM grain surface. Some of the Pt particles were faceted (FIG. 6B), featuring a strongly bonded intimate interface with the LSM grain surface. The $(Mn_{0.8}Co_{0.2})_3O_4$ superjacent layer presented about 10 nm single layered nanograins with high-density grain boundaries (FIG. 6C). The exemplary ALD layer also featured nano-pores (FIG. 7), allowing gas penetration.

b. Synergistic Interaction Between the Electrochemical Operation and Promotion of Nanostructured Surface Architecture.

Referring to FIGS. 8A-I, schematics are provided of the cathode internal surface from as-received commercial cells (FIG. 8A) and the exemplary ALD coated cells. FIG. 8B illustrates the observed distributions of nano-grained Pt and $(Mn_{0.8}Co_{0.2})_3O_4$ on cathode backbone in Cell #2, except for large particles of Pt having dimension of about 100 nm, which are too large to fit into the schematic.

Figure 4A:
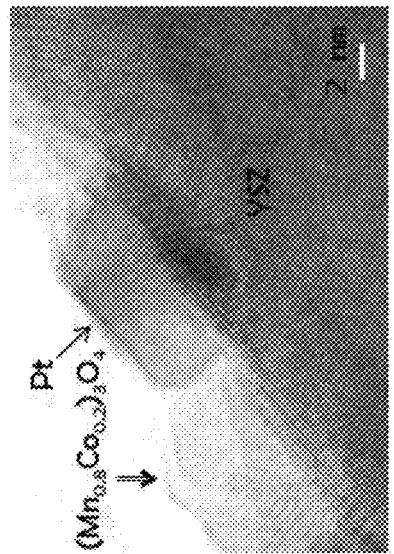
FIGS. 4A-4F show representative TEM images of exemplary Cell #2 having ALD coating with Pt layer and superjacent 5 nm thick $(Mn_{0.8}Co_{0.2})_3O_4$ layer, in accordance with Example 1.
Figure 4C:
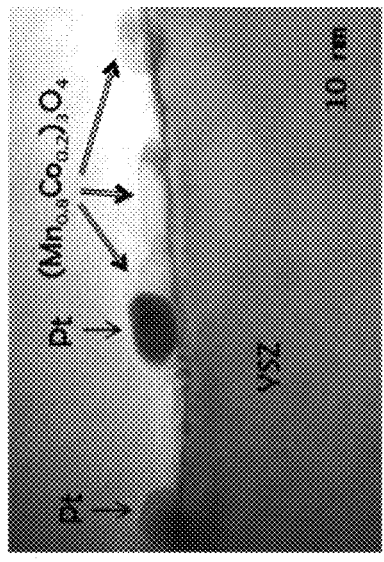
Figure 4E:
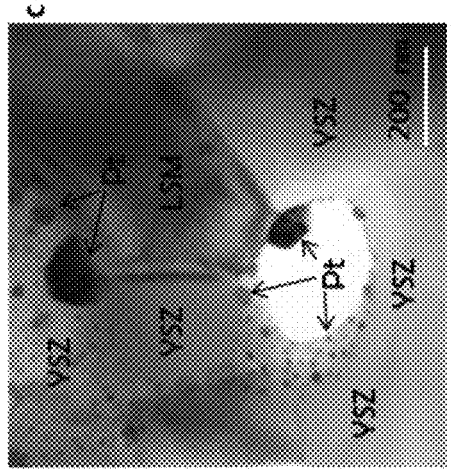
Figure 4B:
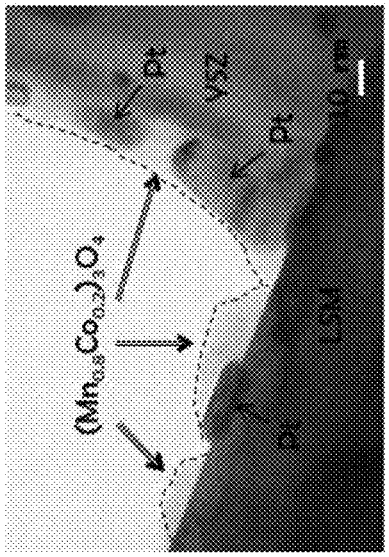
Figure 4D:
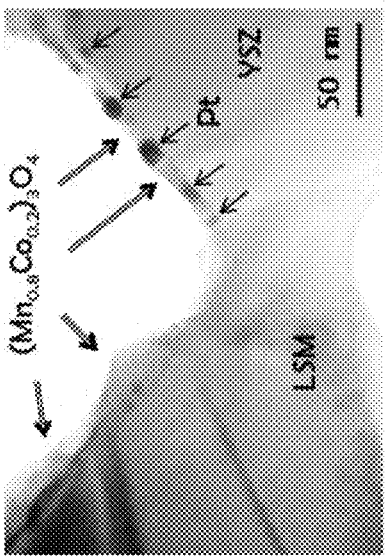
Figure 4F:
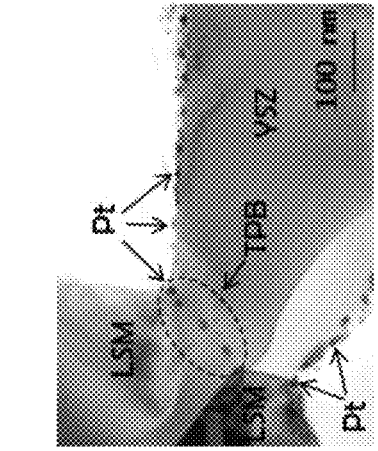
Figure 5:
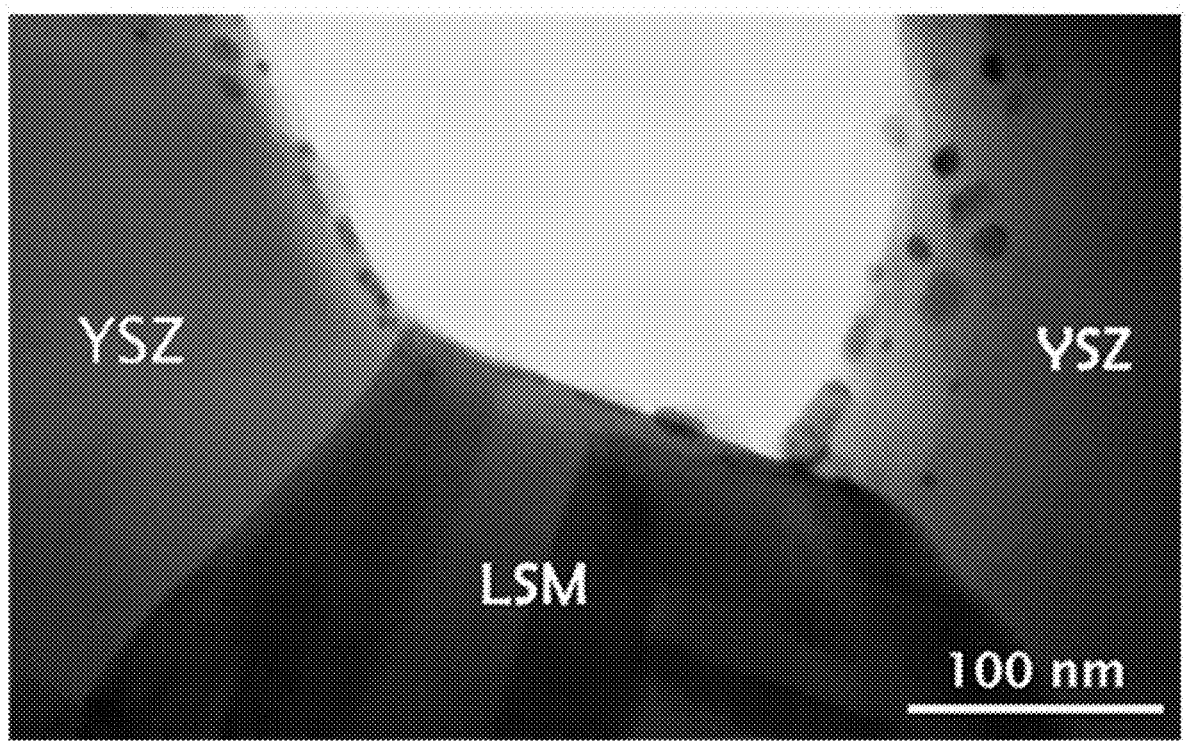
FIG. 5 shows a TEM image providing an enlarged view of FIG. 4F showing that surface of LSM surface of Cell #2 is mostly free of Pt particles.

As shown in FIG. 4A, in Cell #2, after cell operation, some large Pt particles (about 100 nm in dimension) accumulated at the original TPB region. As initially deposited, the Pt in the ALD layer was about 3 nm crystal sphere. (Ref. No. 48) The presence of 100 nm Pt particles after cell operation indicates that nano-sized Pt not adjacent to the TPBs may undergo migration processing that is probably driven by the oxygen partial pressure changes during the electrochemical reactions. According to the diagram of $PtO_2$ partial pressure as a function of oxygen partial pressure, (Ref. No. 64) without current load, Pt tends to be oxidized and vaporized as gas species in air at high temperatures. (Ref. No. 65) Once the cathodic polarization is applied, the thermodynamic equilibrium partial pressure of $PtO_2$ is sharply altered at TPBs due to the change of local oxygen partial pressure. This will result in the reduction of oxidized Pt to metallic Pt at the TPBs, (Ref. No. 64) likely through the following reaction (Ref. No. 66).

$$PtO_{2(g)} + 4e' + 2V_O^{\cdot\cdot} \rightarrow Pt_{(s)} + 2O_O^{x}$$

where the Pt oxide is reduced by acquiring 4 electrons, and ionized oxygen subsequently moves away via ionic conductor at TPBs.

Except for the large Pt particles (about 100 nm), much smaller Pt particles (about 10 nm) were also observed uniformly distributed on all YSZ grain surfaces, whereas the well-defined crystal orientation relationship between the Pt and YSZ (FIG. 4E) indicated the re-assembly Pt on YSZ surface. Since the Pt is presumably deposited solely at the TPB region where the oxygen partial pressure is lowered, the uniform distribution of the 10 nm Pt on YSZ surface indicates the ALD layer enabled newly formed TPBs on YSZ surface and the YSZ surface possessed both the ionic conductivity and electrical conductivity.

Such mixed conductivity on the YSZ surface and newly formed TPB in Cell #2 can be related to the addition of $(Mn_{0.8}Co_{0.2})_3O_4$ nano-grains. Firstly, the reduced Mn cations from the original TPBs and the $(Mn_{0.8}Co_{0.2})_3O_4$ layer spread out on the YSZ surface, leading to enhancement of the electrochemical activity as the Mn-enriched YSZ effectively becomes a mixed conductor and active for direct oxygen incorporation. (Ref. Nos. 67-69) Secondly, the $(Mn_{0.8}Co_{0.2})_3O_4$ is an excellent electronic conductor and electrocatalyst (Ref. No. 70) similar to that of the LSM. With the simultaneous contribution of the above factors, the active electrochemical reaction taking place at the newly formed TPBs of $(Mn_{0.8}Co_{0.2})_3O_4$/YSZ/air interface and extended to the entire surface of the YSZ grains and further resulted in the Pt re-assembly at such newly formed TPBs on YSZ surface.

In Cell #2, there was also very small amount of Pt nano-grains (FIGS. 4D and 4F) observed at the LSM/$(Mn_{0.8}Co_{0.2})_3O_4$ interface region of ~50 nm to the LSM/YSZ interface, where the active TPB could be extended to through polarization. Except for that, most of the LSM grain surface is free of nano-Pt implying the lack of the effective TPBs. The $(Mn_{0.8}Co_{0.2})_3O_4$ on LSM surface exhibit much bigger grain size than that on the YSZ surface. Both the aspects of the lack of Pt particles and large grain size of $(Mn_{0.8}Co_{0.2})_3O_4$ were diminished in Cell #3, when the as-deposited $(Mn_{0.8}Co_{0.2})_3O_4$ layer thickness increased to about 15 nm that is thick enough to facilitate the formation of continuous layer and connectivity of the neighboring $(Mn_{0.8}Co_{0.2})_3O_4$ crystal grains.

Figure 6B:
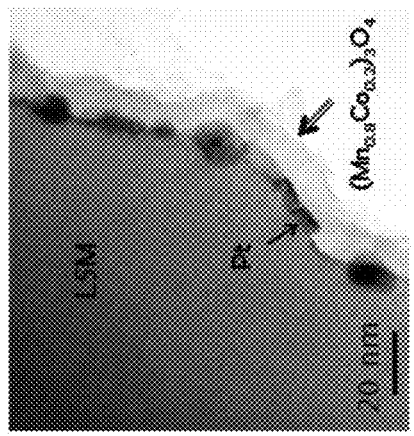
FIGS. 6A-6C show TEM images of the exemplary Cell #3 having ALD coating with Pt layer and superjacent 15 nm thick $(Mn_{0.8}Co_{0.2})_3O_4$ layer, after electrochemical operation, in accordance with Example 1.
Figure 6C:
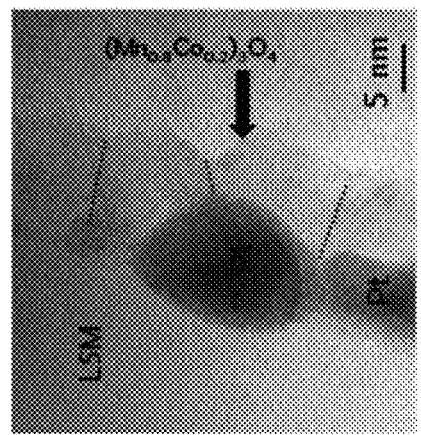
Figure 6A:
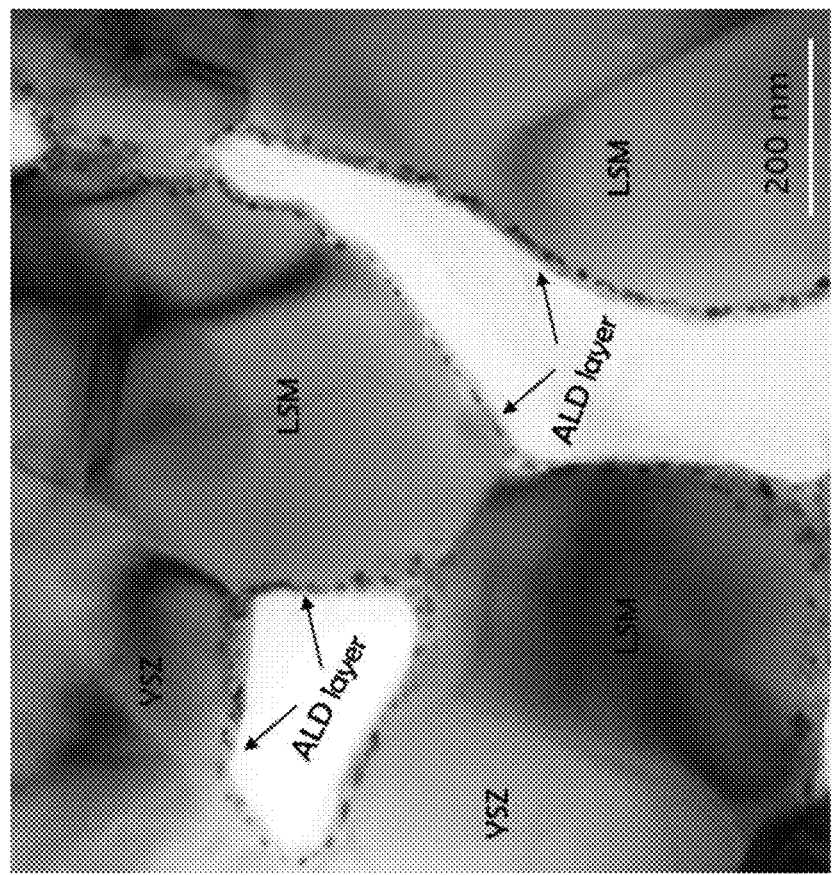
Figure 7:
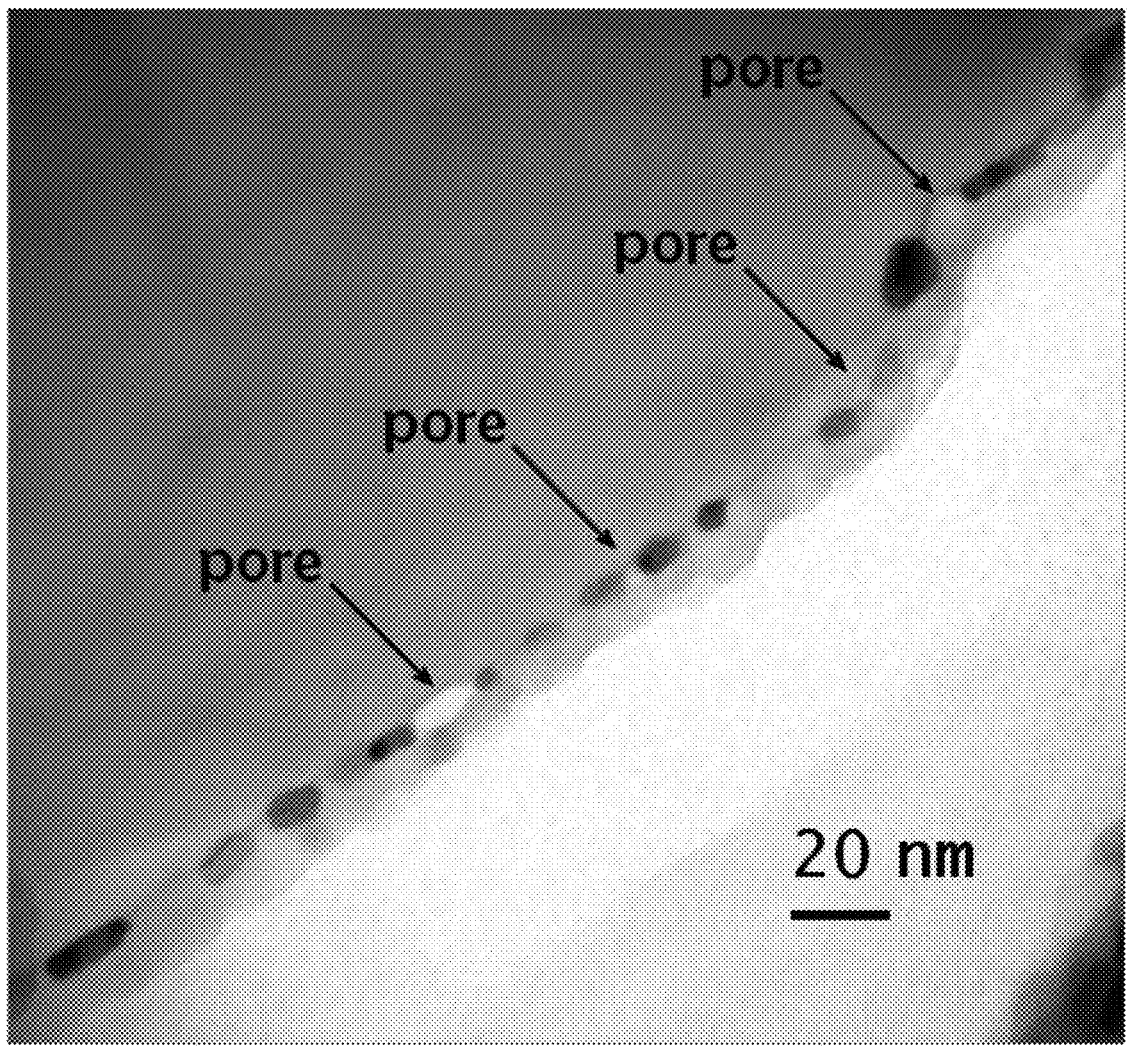
FIG. 7 shows a representative TEM image of exemplary Cell #3 having ALD coating with Pt layer and superjacent 15 nm thick $(Mn_{0.8}Co_{0.2})_3O_4$ layer, after electrochemical operation in accordance with Example 1, showing nanopores are present in the ALD layers.
Figure 9A:
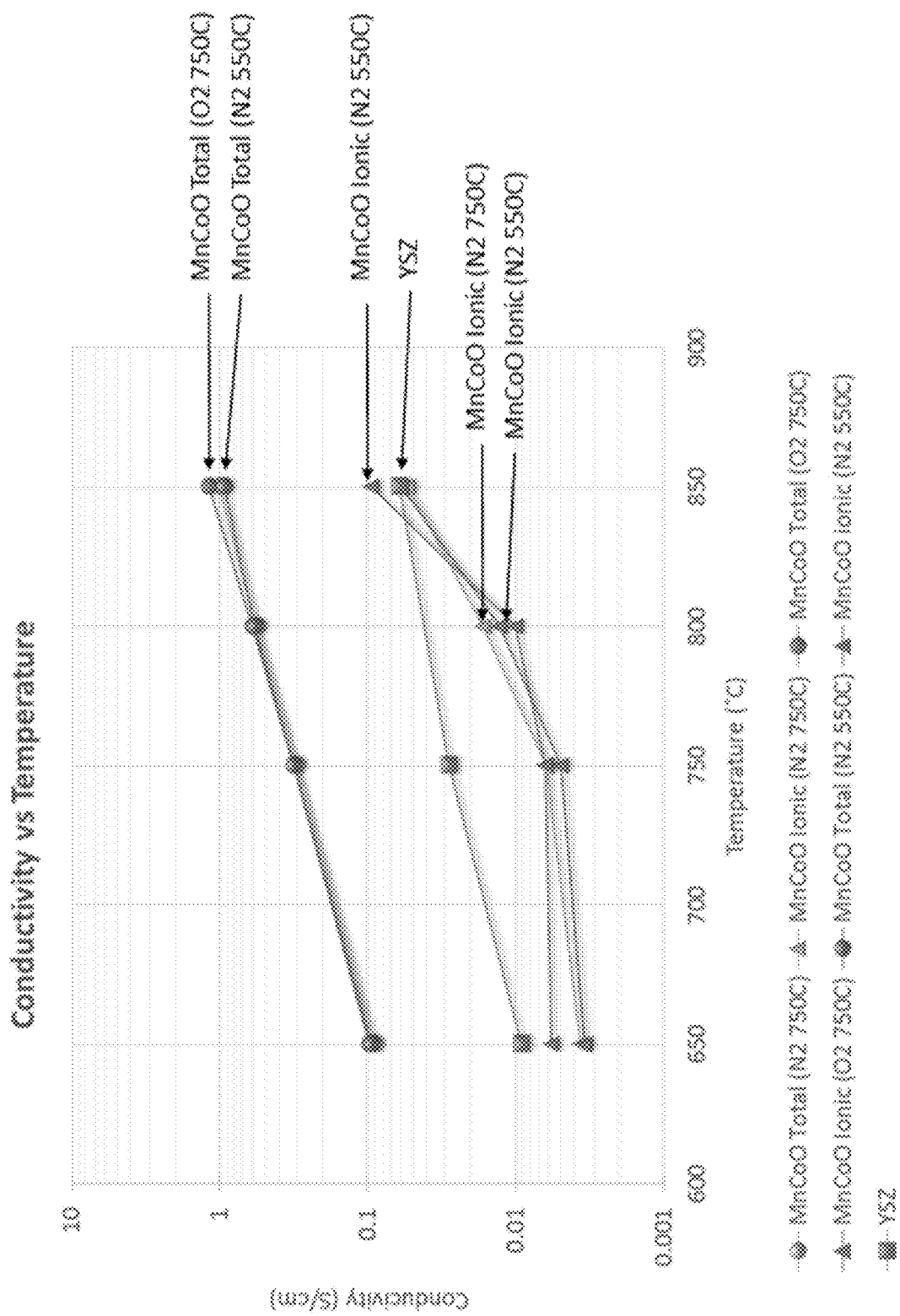
FIGS. 9A-9C show data related to the conductivity of nanograined (with the grain size of about 200 nm) (MnCo)Ox electrocatalyst substrate in bulk form. In order to exclude the conductivity contribution from both the surface grain boundaries and the LSM/$(Mn_{0.8}Co_{0.2})_3O_4$ so as to unambiguously evaluate the intergranular ionic conductivity of the nanostructured $(Mn_{0.8}Co_{0.2})_3O_4$, the single-phase bulk scale $(Mn_{0.8}Co_{0.2})_3O_4$ samples with the grain size of ~200 nm were synthesized and then the electron block was applied during the conductivity measurement.
Figure 9B:
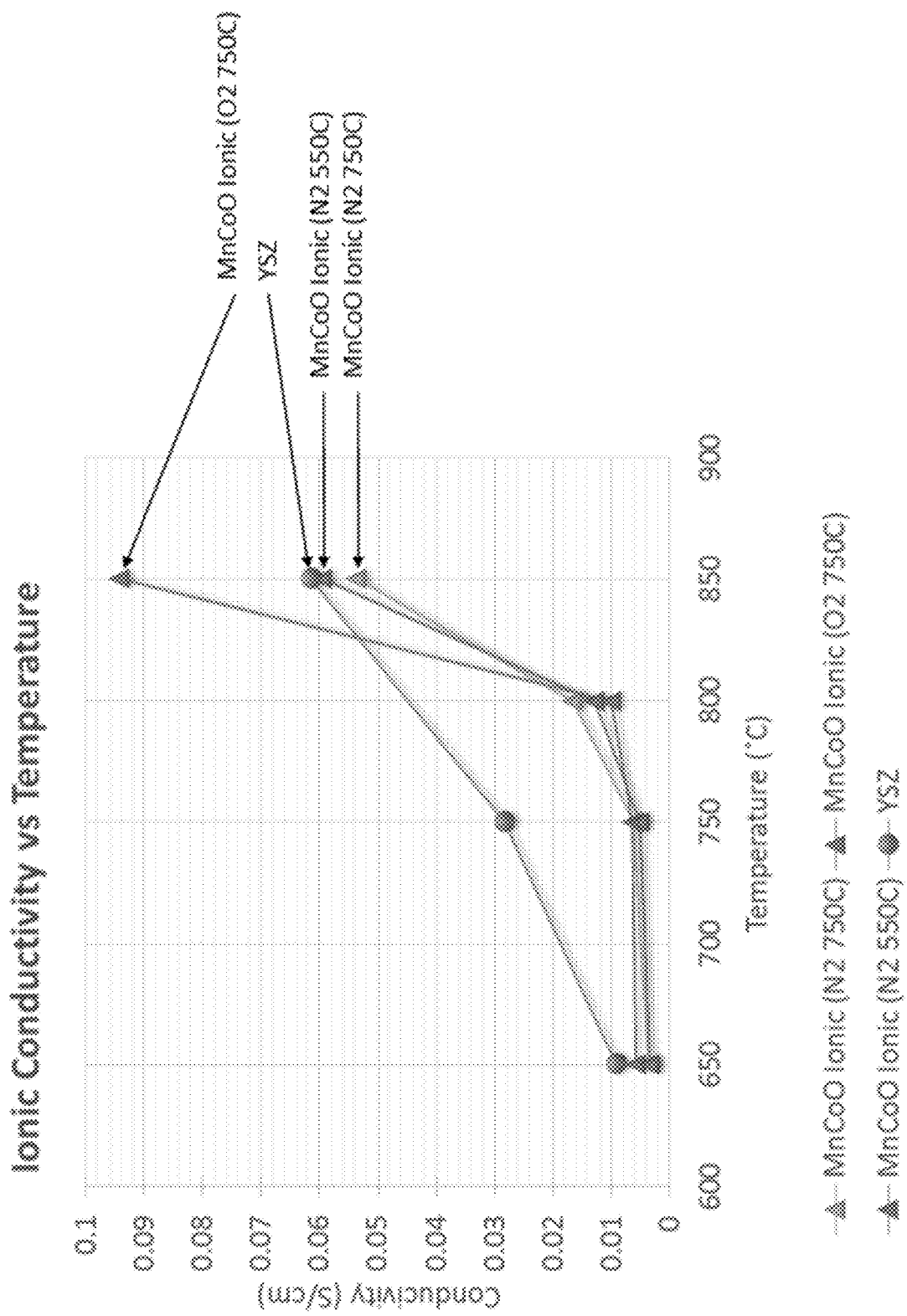
Figure 9C:
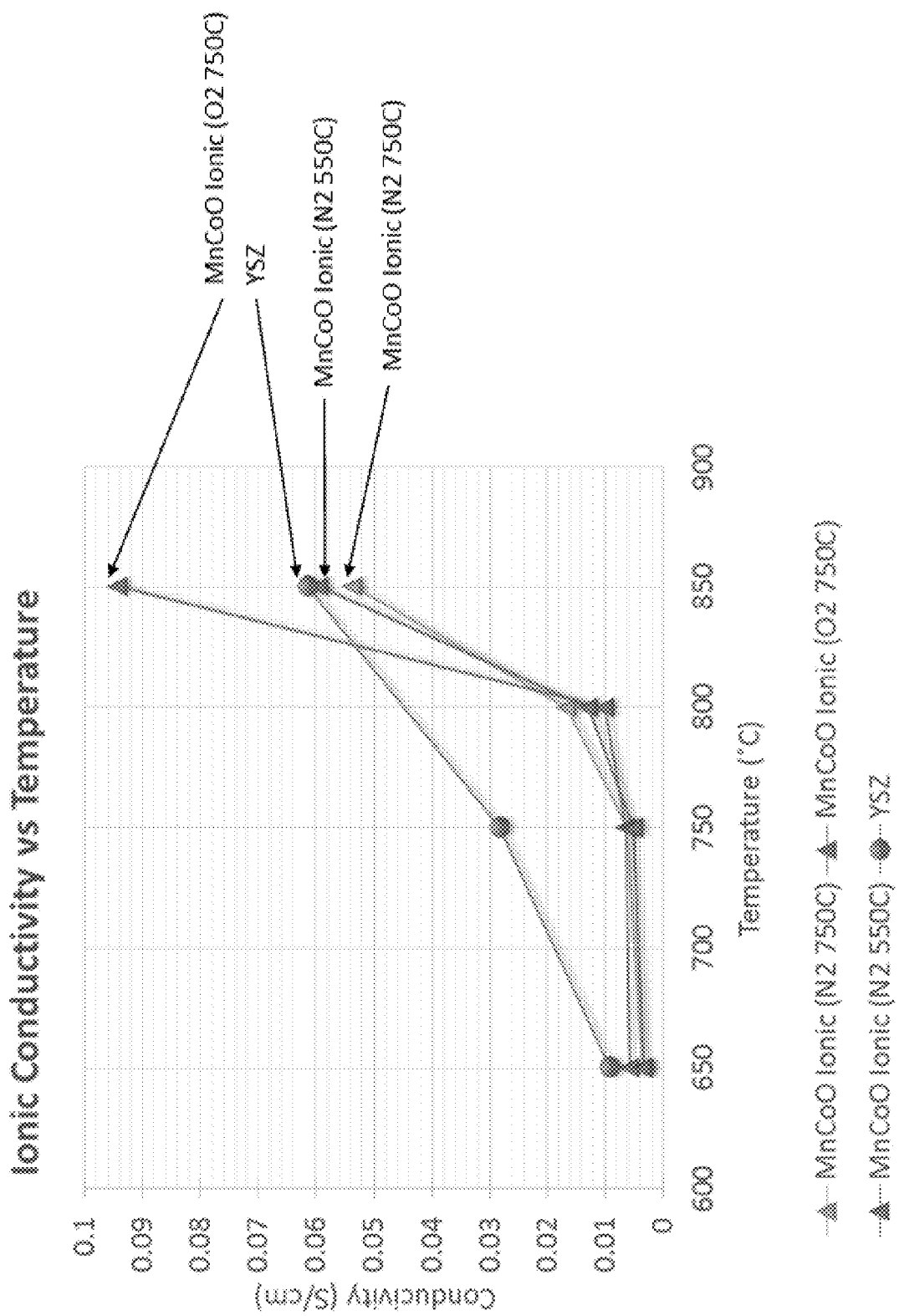

As shown in FIG. 6A-C, in Cell #3, single layered $(Mn_{0.8}Co_{0.2})_3O_4$ nano-grains with the dimension of about 10 nm were well preserved at both the YSZ and LSM grain surface after 120 h cell operation. The very small grain size of $(Mn_{0.8}Co_{0.2})_3O_4$ indicates that the electrical bias applied on the cathode surface and related oxygen partial pressure during the high-temperature operation favored the possible ion and defects migration primarily along the grain boundaries and achieved the grain retardation within $(Mn_{0.8}Co_{0.2})_3O_4$ layer. (Ref. No. 71) On the other hand, the salient feature of uniform distribution of nano-sized Pt pinned on both the LSM and YSZ grain surface revealed that effective TPBs are covering the entire internal surface of the cathode backbone in Cell #3. The formation of the possible TPBs on LSM surface is very intriguing. An additional ionic conducting path on the LSM grain surface is needed to enable the formation of the local TPBs. In Cell #3, the oxygen ions have four possible pathways for conduction on LSM surface, namely (a) through the LSM and/or $(Mn_{0.8}Co_{0.2})_3O_4$ grains, (b) along the $(Mn_{0.8}Co_{0.2})_3O_4$ intergranular grain boundaries, (c) along the $(Mn_{0.8}Co_{0.2})_3O_4$ surface boundaries, and (d) along the $(Mn_{0.8}Co_{0.2})_3O_4$/LSM interface. The ionic conductivity through the electronic conductors LSM and $(Mn_{0.8}Co_{0.2})_3O_4$ grains was negligible. The high-density surface grain boundaries exposed to air may have played an important role for enhancing the ionic conductivity and accelerating the kinetics of overall surface reactions. (Ref. Nos. 72-74) Further, there was increasing evidence indicating that the heterostructured interfaces between the oxides (i.e. $(Mn_{0.8}Co_{0.2})_3O_4$ and LSM) may also facilitate the oxygen ion transport, due to the interface strain, space charge effect, and atomic reconstruction at those interfaces. (Ref. Nos. 75-77) Referring to FIGS. 9A-9C, it was observed that, for electronic conductor $(Mn_{0.8}Co_{0.2})_3O_4$, when the bulk-scale samples are nanostructured with nano-grains, there is substantial ionic conductivity. In order to evaluate the ionic and electronic contribution to the total conductivity of the nanostructured $(Mn_{0.8}Co_{0.2})_3O_4$, the electron block t is applied during the measurement. Surprisingly, the nanostructured present substantial ionic conductivity that is even similar to that of YSZ at 800 C, as detailed in FIGS. 9A-9C. Within the singly layered $(Mn_{0.8}Co_{0.2})_3O_4$, due to the approximate 10 nm grain size, and strongly bonded grain boundaries, the superjacent $(Mn_{0.8}Co_{0.2})_3O_4$ layer formed nano-ionic network with that possessed multifunction of electronic conductivity and electrocatalytic activity. For various ceramics, there is emerging interest in the ionic conductivity of the oxide grain boundaries. Especially, nanoionics (Ref. Nos. 78-80) has become increasingly important in devices and systems related to energy conversion and storage. Nevertheless, nanoionics and nanostructured electrodes (Ref. No. 81) development has been challenging for solid oxide fuel cells (SOFCs) owing to many reasons including poor stability of the nanocrystals during fabrication of SOFCs at elevated temperatures. Previous work described $ZrO_2$ nanoionics. (Ref. No. 103) The results in this example demonstrate the formation of the stable nanoionics with the electrocatalytic for SOFC applications, which opens the new direction of establishment of nanostructured electrode for SOFC applications.

c. Accelerated Mass and Charge Transfer Mechanisms and Rapid Electrochemical Reactions Enabled by Surface Heterogeneous Architecture The superjacent single-grained $(Mn_{0.8}Co_{0.2})_3O_4$ layer with high-density grain boundaries and subjacent layer of discrete nano Pt grains nanostructure in the exemplary ALD layer on Cell #3 resulted from the $(Mn_{0.8}Co_{0.2})_3O_4$ grain growth retardation and Pt self-assembly that were driven by electrochemical operation and its related oxygen partial pressure changes. Such heterogeneous multi-layer was nano-porous allowing reaction gas traveling through the ALD layer and accessing the original backbone surface, and subsequently, lowering the ORR resistance and accelerating the oxygen ion mass and electron charge transfer on the LSM/YSZ backbone. On the YSZ backbone, electrocatalyst Pt was sandwiched between the mixed conducting YSZ surface and electrocatalytic $(Mn_{0.8}Co_{0.2})_3O_4$ nanograins. The high-density nano-catalyst dramatically lowered the ORR resistance. Once the oxygen was reduced on the gas exposed Pt and gas exposed $(Mn_{0.8}Co_{0.2})_3O_4$ grain surface, the oxygen ions could quickly diffuse along the adjacent Pt/YSZ interface, $(Mn_{0.8}Co_{0.2})_3O_4$/YSZ interface, as well as the $(Mn_{0.8}Co_{0.2})_3O_4$ surface grain boundaries, as shown in FIG. 8H. In the meantime, on the LSM surface, three kinds of electrocatalysts, i.e., LSM, $(Mn_{0.8}Co_{0.2})_3O_4$, and Pt, contribute simultaneously to accelerated ORR.

Meanwhile, there are multiple ionic conduction pathways (FIG. 8H) along the $(Mn_{0.8}Co_{0.2})_3O_4$ surface grain boundaries and LSM/$(Mn_{0.8}Co_{0.2})_3O_4$ interfaces, that are connected to the electrocatalyst and could rapidly transfer the reduced oxygen ion away. In Cell #3, on both the LSM and YSZ surface that were originally electrochemically inactive, high density newly implanted TPBs developed (FIG. 8I) creating various oxygen ion conducting pathways to maximize the charge and mass transfer and the resultant electrochemical reactions. Such analysis is fully consistent with the impedance and the related deconvolution showing that Cell #3 exhibited very active ORR and accelerated oxygen transport like that of LSCF/SDC baseline cell. In other words, the surface architecture on Cell #3 enabled high-density TPBs on both LSM and YSZ, thereby effectively shifting the mass and charge transfer to become like that of two-phase boundaries from the mixed conductor LSCF/SDC.

d. Potential Multifunctional Surface Architecture for Increasing Cell Longevity

The systematic results from Cell #2 and Cell #3 indicate that there are synergistic interaction between self-assembly of Pt nano-grains, the nanostructure preservation and electrochemical operation that regulate the local oxygen partial pressure on cathode surface. The electrochemical operation driven Pt self-assembly indicate the new opportunities of introducing the conducting interfaces to pin the nano-catalyst to the electrochemical reaction active sites and accelerate the charge and mass transfer. Furthermore, the different electrochemical performance and nanostructure between Cell #2 and Cell #3 illustrate the importance of controlling the nanostructure within the ALD layer to create the special interfaces and grain boundaries possessing special conductivities. It is worthwhile to point out that the conformal and stable ALD layer as those in Cell #3, also potentially offer multi-functionality of mitigating the grain coarsening and increase the cathode chromium-resistance. Due to the long-term operation at high temperatures, one general concern for cathode materials is their potential sintering over time, losing active surface area and thereafter activity. (Ref. Nos. 82-84) The stable ALD layer on the LSM/YSZ surface will mitigate the microstructure evolution by limiting grain coarsening induced by cation surface diffusion and Sr surface segregation. (Ref. Nos. 85-86) On the other hand, Spinel $(MnCo)_3O_4$ is an excellent interconnecting coating material to seal off the Cr vapor penetration into the cathode backbone. (Ref. No. 70) Thus, the conformal ALD coating of $(MnCo)_3O_4$ on the entire internal surface of the cathode provides the alternative approach of increasing the Cr resistance. Overall, the surface architectures presented in this example possibly provide a simple solution to simultaneously enhancing power density, and increasing reliability, robustness and endurance of SOFCs.

3. Example 2. LSM/YSZ Electrode with Multi-Layer ALD Coating

Figure 10A:
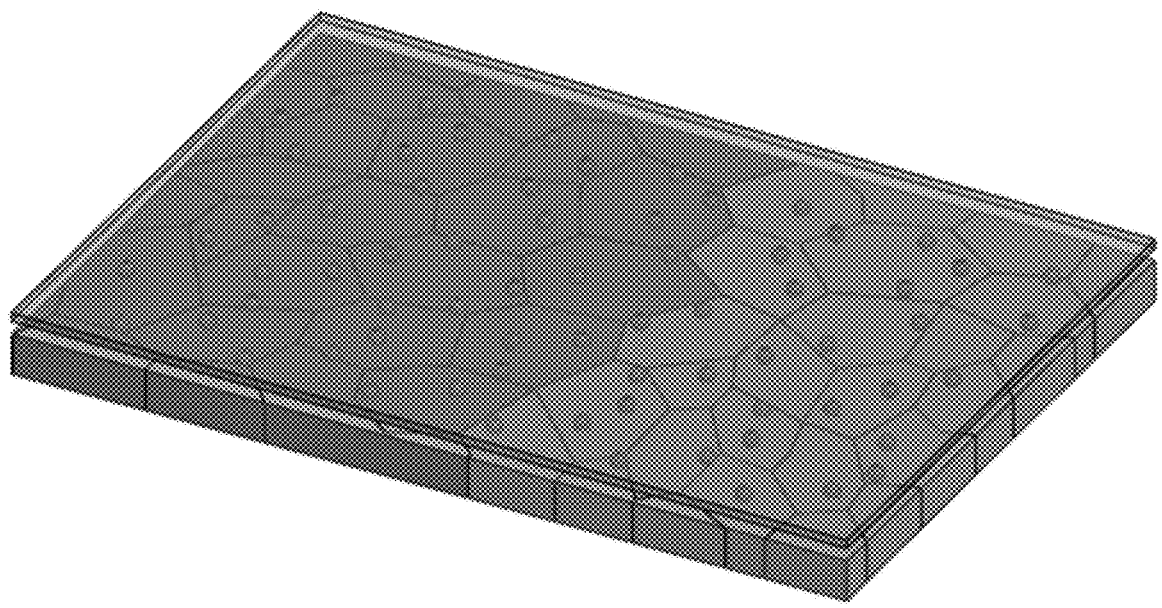
FIGS. 10A-10B shows a schematic representation of the structure of an exemplary electrode with the as-deposited ALD layer having an ultra-thin 2 nm $CoO_x$ capping layer covering the 3 nm Pt discrete Pt nanoparticles, in accordance with Example 2.
Figure 10B:
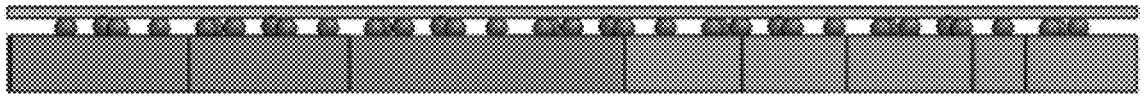

In this example, the structure and performance an exemplary ALD-coated fuel cell was evaluated and compared to a baseline (control) cell. Commercially-available anode-supported solid oxide fuel cells with LSM/YSZ cathodes (Cell #1) were provided as baseline cells. One of the commercially-available anode-supported cells with LSM/YSZ cathode was subjected to ALD coating, using methods described above. For this example, the as-deposited ALD multi-layer consisted of a subjacent Pt with discrete particles having approximately 3 nm particle size and a superjacent $Co_3O_4$ layer with thickness of approximately 2 nm (Cell #2), as schematically shown in FIG. 10. No masking or specific treatment was applied on the NiO/YSZ anode of the as-received cells before ALD processing. In practical, the thick and very dense NiO/YSZ anode prevents precursor penetration during the ALD processing and the impact of ALD coating on the Ni/YSZ anode is negligible.

a. Electrochemical Performance Results

Figure 11A:
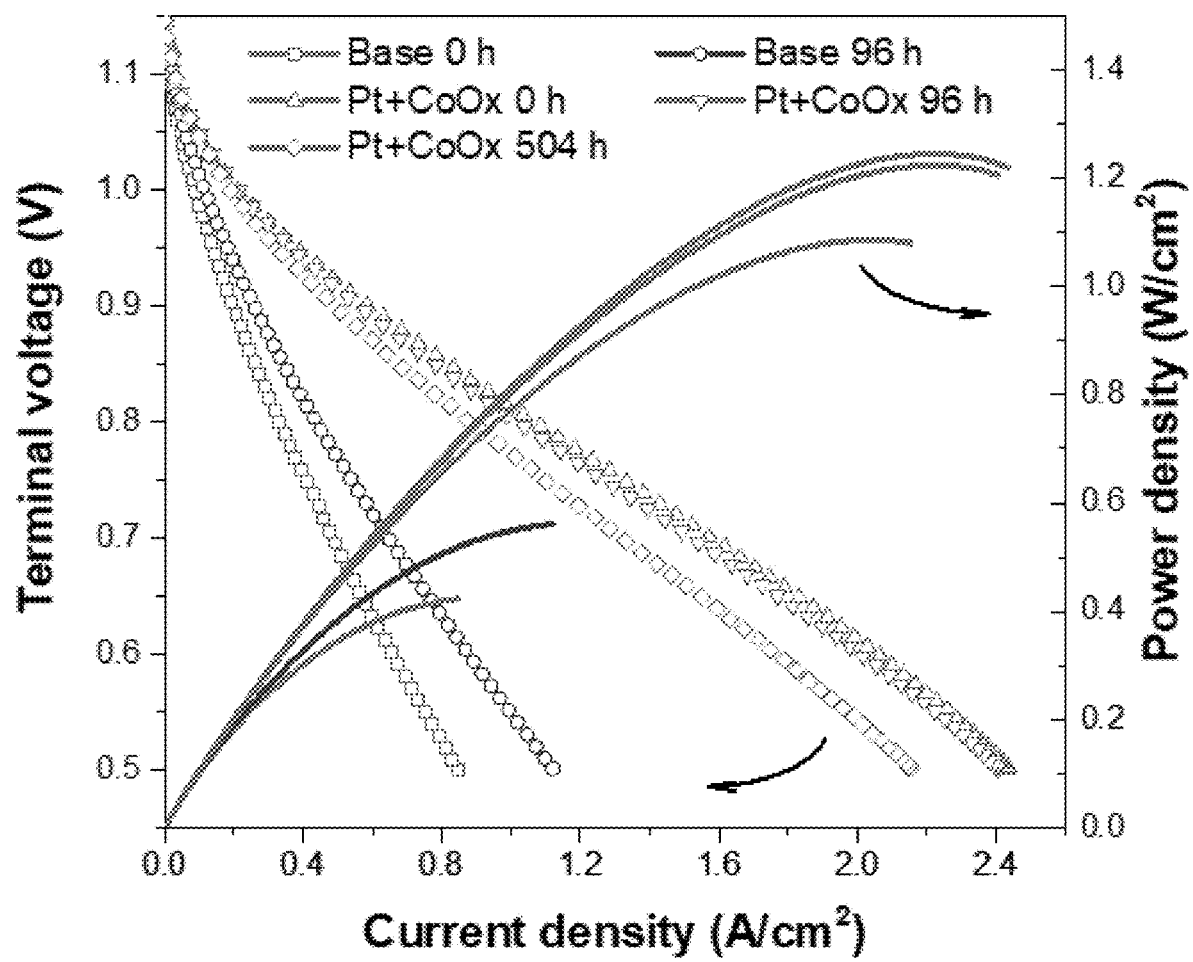
FIGS. 11A-11D show power density and impedance data for baseline Cell #1 LSM, and exemplary Cell #2 LSM cell with 3 nm discrete Pt particles capped with 2 nm $Co_3O_4$ layer, in accordance with Example 2.
Figure 11B:
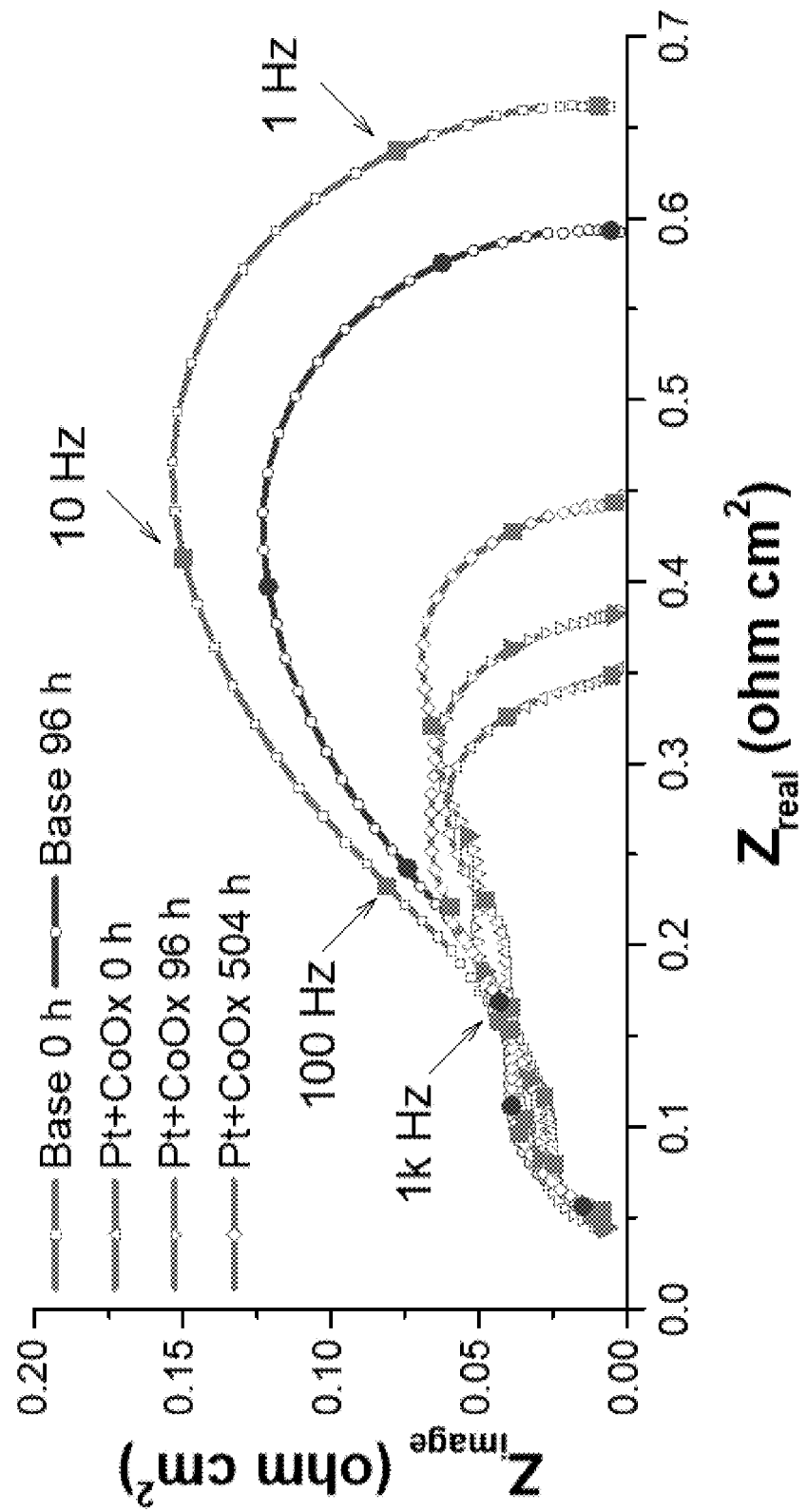
Figure 11C:
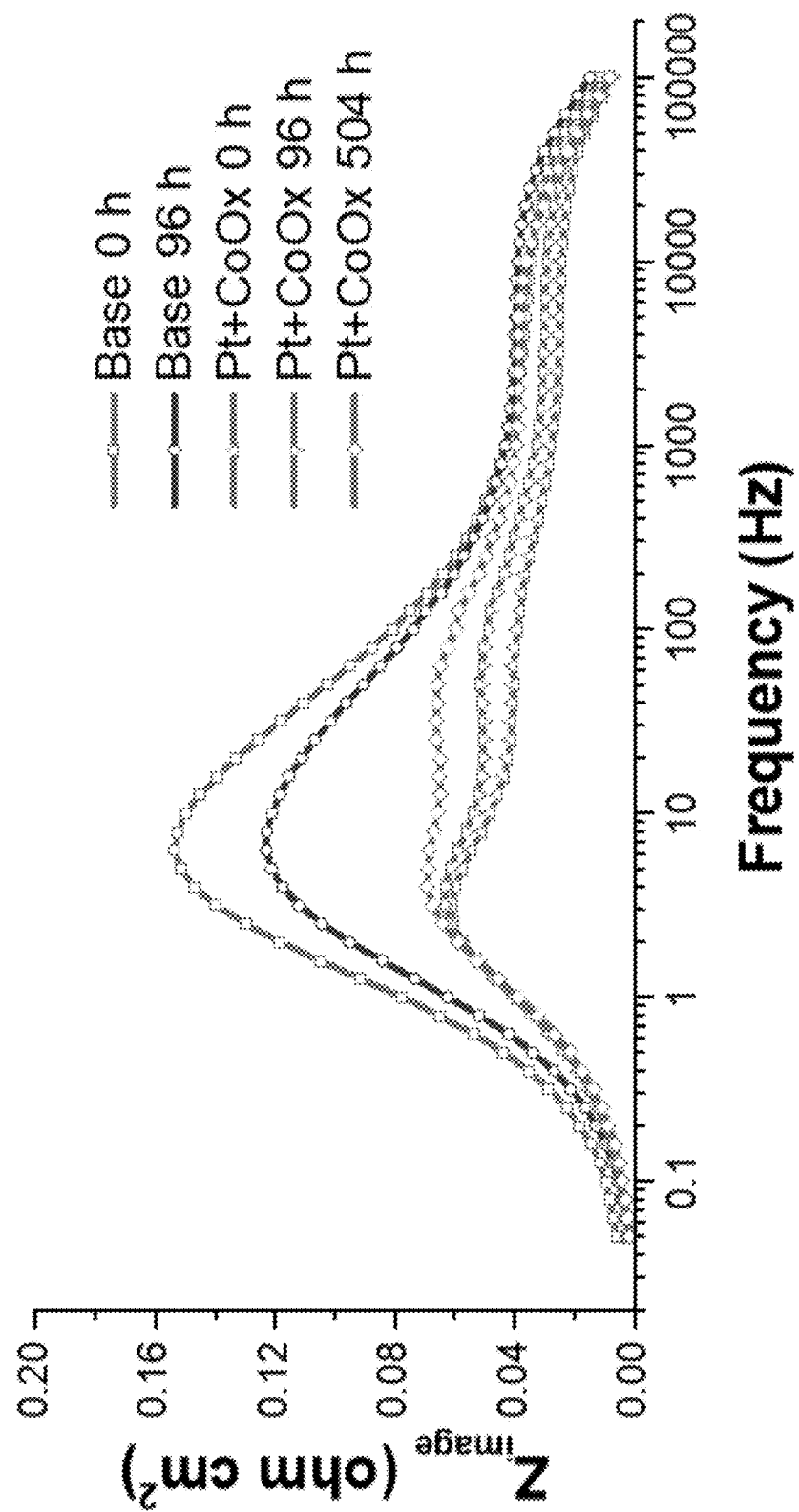

Upon the electrochemical operation at 750° C., the baseline Cell #1 experienced the activation process, (Ref. No. 125) with increased power density (FIG. 11A and Table 2-1) during initial operation. From 0 to 96 h operation, the Cell #1 shows a slight increase of the ohmic resistance $R_s$, but a decrease of the polarization resistance $R_p$, as depicted in the Nyquist and Bode plots in FIG. 11C. The baseline Cell #1 possess a peak power density of 0.556 W/cm$^2$ after the operation at 0.3 A/cm$^2$ for 96 h. By contrast, at 0 h operation, Cell #2 shows the immediate higher peak power density of 1.245 W/cm$^2$, that is 320% enhancement in comparison to that of the baseline. The power density increase is accompanied by the large reduction of $R_p$ by 52%. Further cell operation resulted in a slight increase of $R_p$ in Cell #2. After operated at 0.3 A/cm$^2$ for 504 h, the peak density of the Cell #2 is 1.09 W/cm$^2$ which remains ~200% over the Cell #1 operated for 96 h. To the best of our knowledge, this is so far the highest performance enhancement for state-of-the-art commercial cells that is achieved using various impregnation techniques. (Ref. Nos. 51-58) Due to the negligible amount of ALD materials coated onto the internal surface of the porous cathode of the as-fabricated cells, the ~200% increase is simultaneously achieved in terms of both power density and specific power.

TABLE 2-1

Power density and resistance of the baseline Cell #1 and the ALD coated Cell #2.

| Cell | Time (h) | $R_s$ ($\Omega$ cm$^2$) | $R_p$ ($\Omega$ cm$^2$) | Peak Power (W/cm$^2$) | Power at 0.8 V (W/cm$^2$) | Enhancement of Power density at 0.8 V |
|---|---|---|---|---|---|---|
| #1 | 0 | 0.034 | 0.660 | 0.420 | 0.266 | — |
| #1 | 96 | 0.037 | 0.586 | 0.556 | 0.357 | — |
| #2 | 0 | 0.041 | 0.309 | 1.245 | 0.863 | 3.2 (to Cell #1 at 0 h) |
| #2 | 96 | 0.040 | 0.345 | 1.224 | 0.826 | 2.3 (to Cell #1 at 96 h) |
| #2 | 504 | 0.050 | 0.399 | 1.090 | 0.725 | 2.0 (to Cell #1 at 96 h) |

Figure 11D:
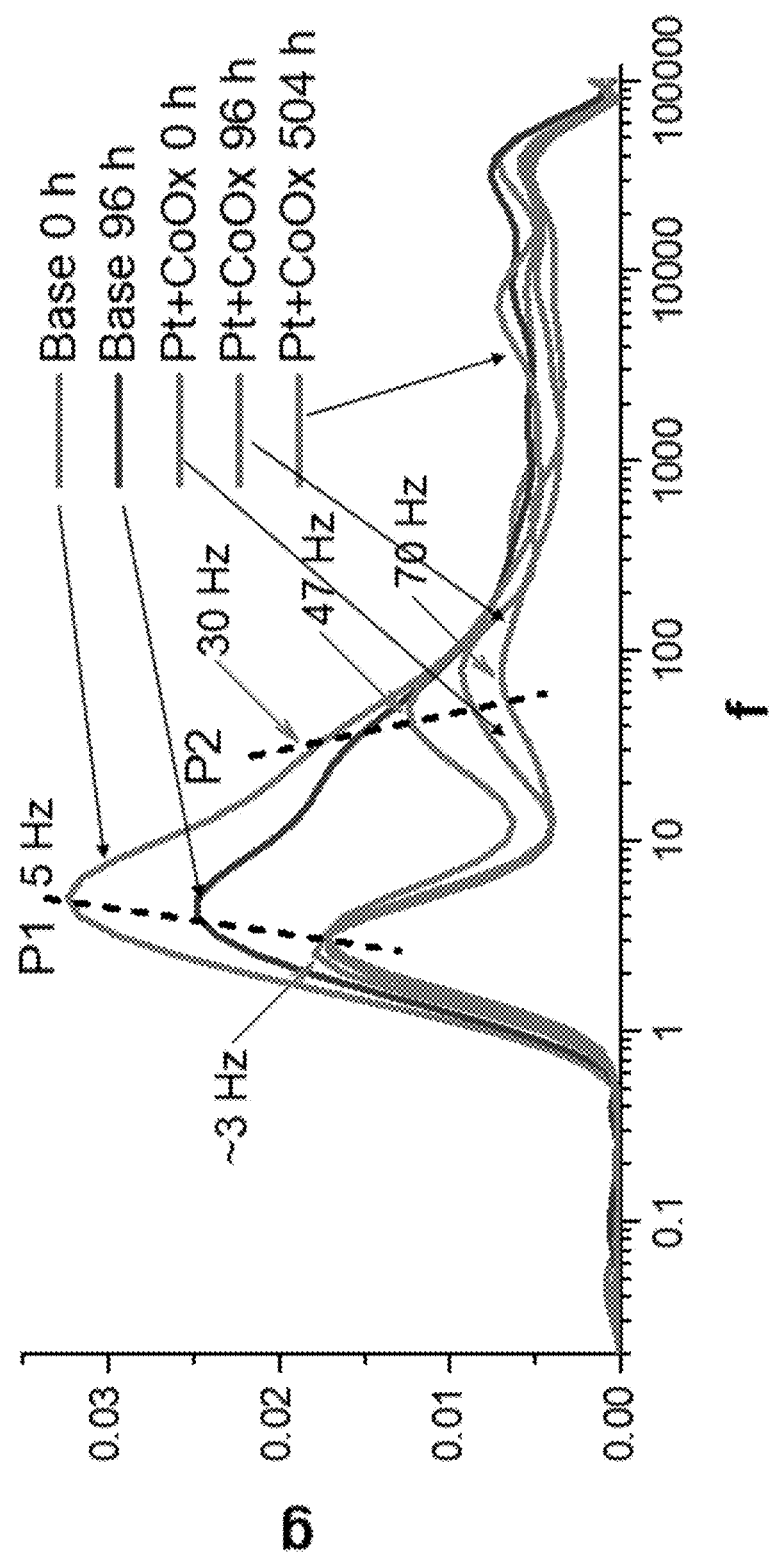
Figures 12A, 12B:
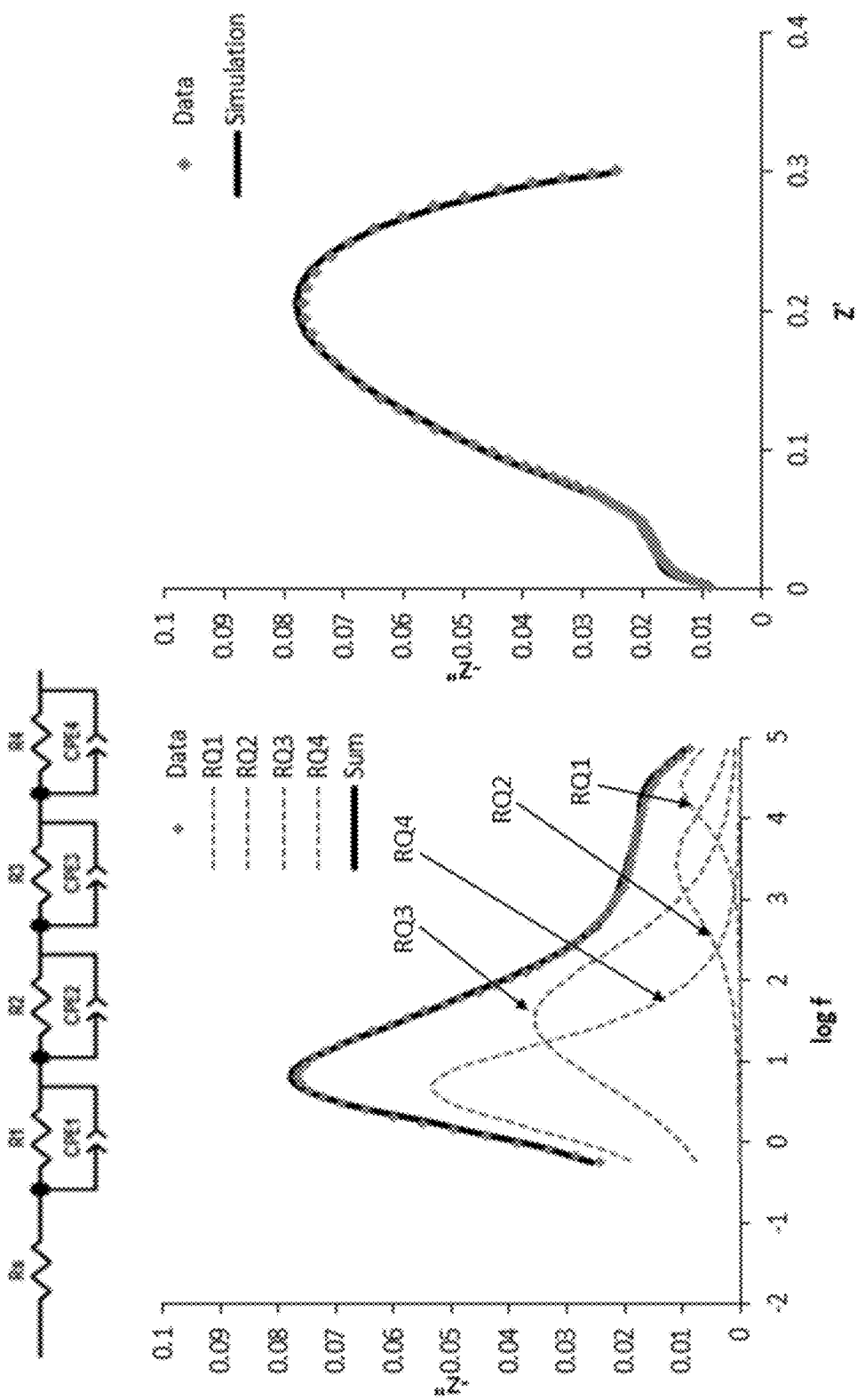
FIGS. 12A and 12B show impedance of baseline Cell #1 at 0 h, in accordance with Example 2.
Figures 13A, 13B:
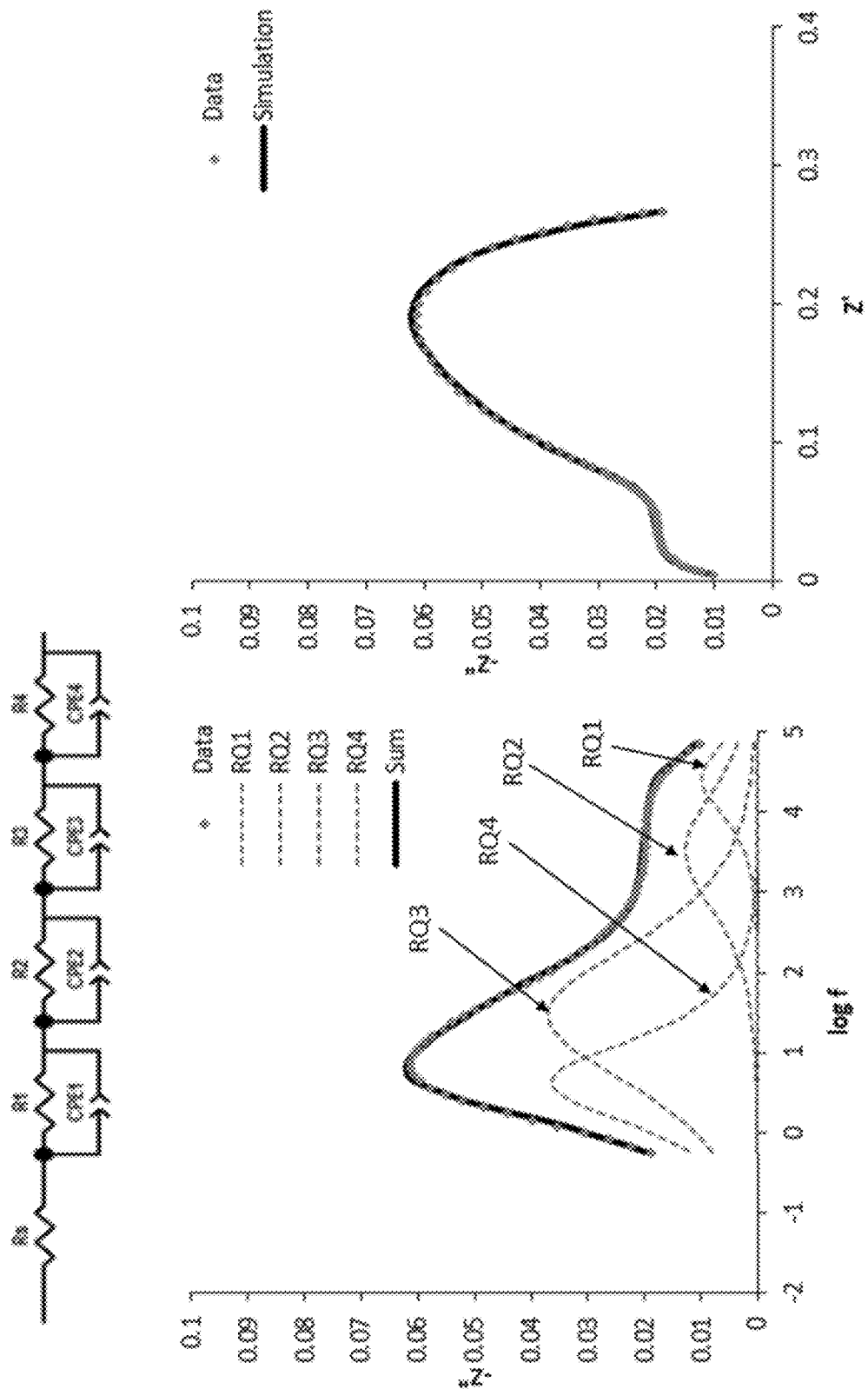
FIGS. 13A and 13B show Impedance of baseline Cell #1 at 96 h, in accordance with Example 2.
Figures 14A, 14B:
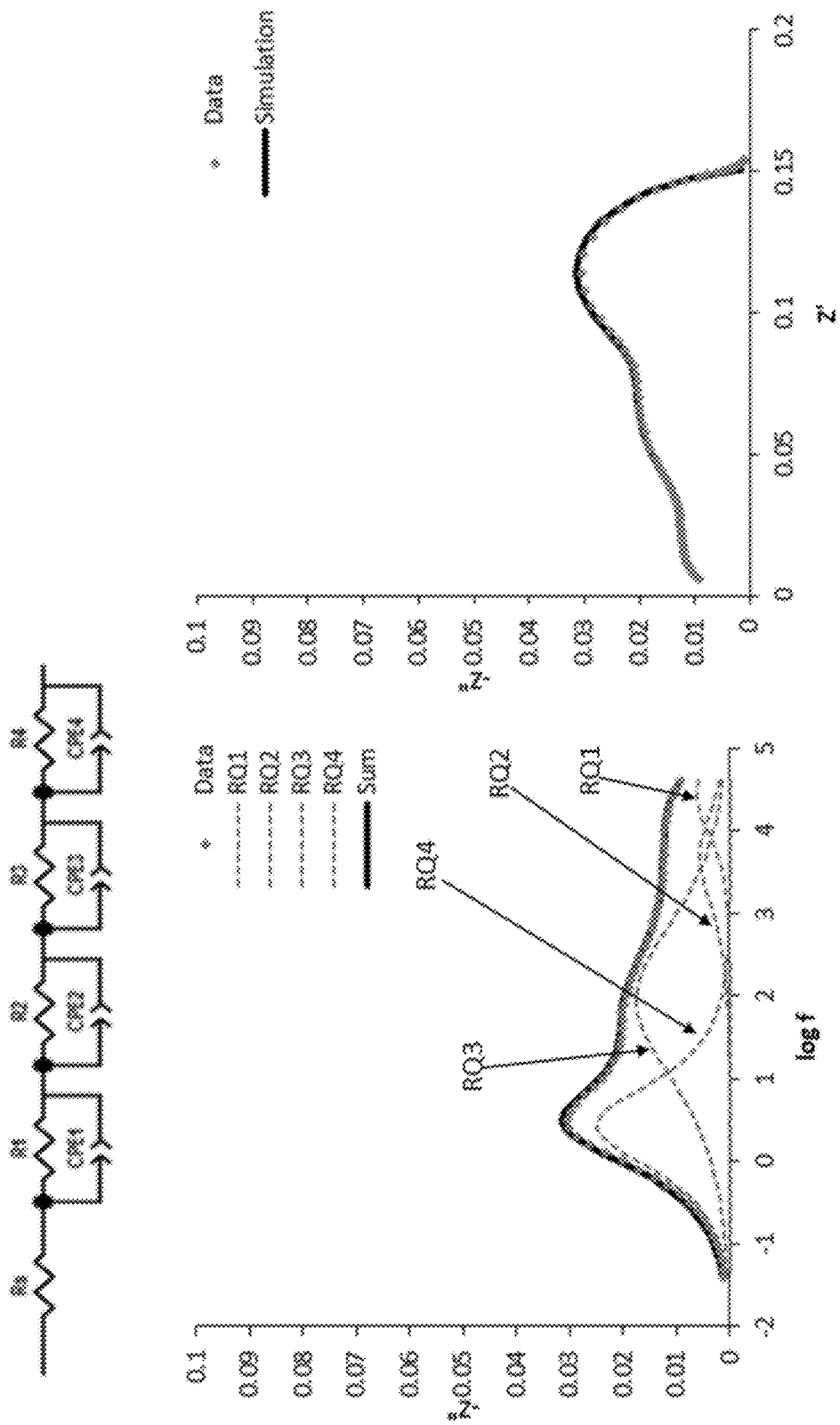
FIGS. 14A and 14B show Impedance of exemplary Cell #2 at 0 h, in accordance with Example 2.
Figures 16A, 16B:
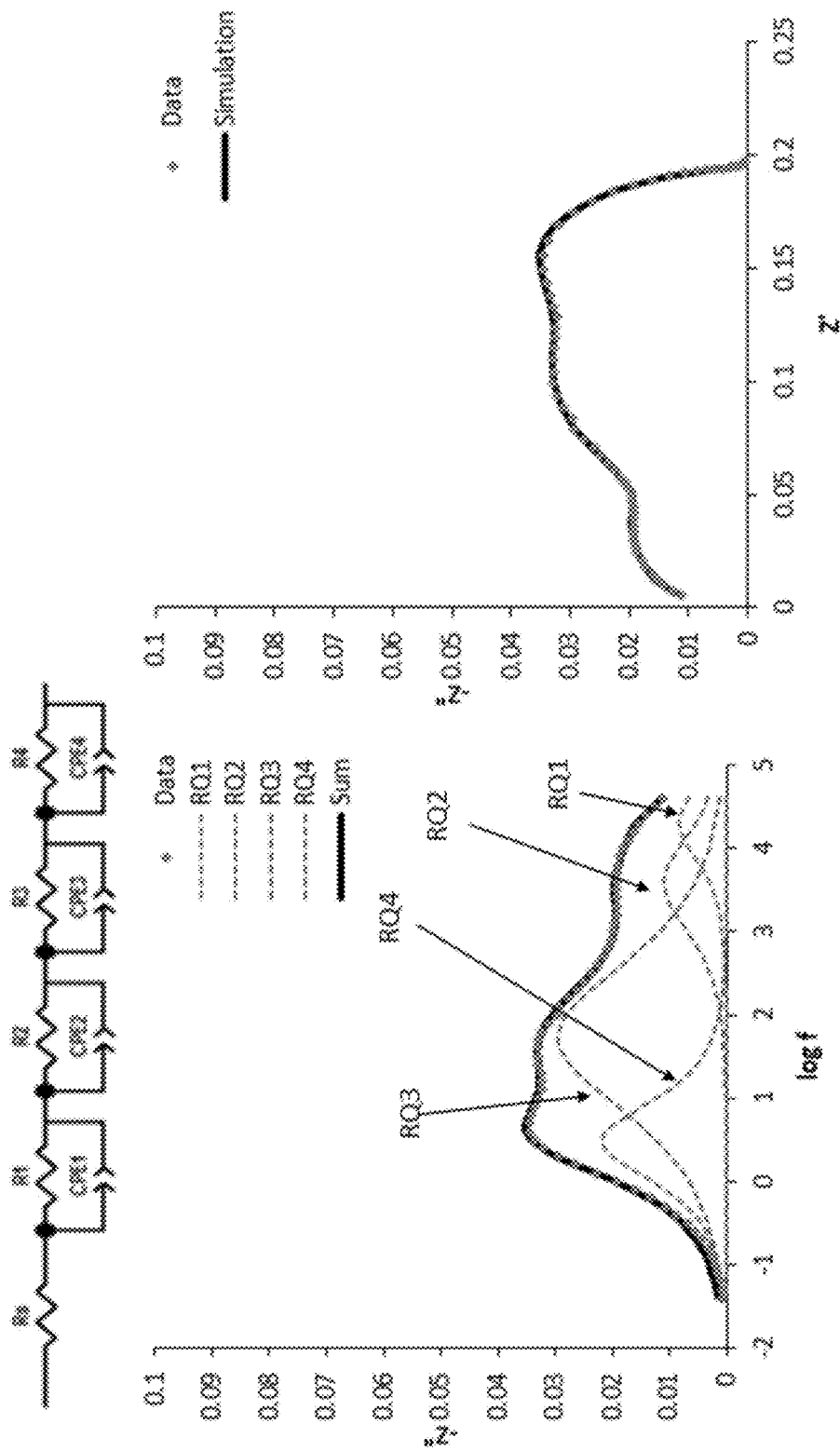
FIGS. 16A and 16B show Impedance of exemplary Cell #2 at 504 h, in accordance with Example 2.

To identify the physical origin of cell performance enhancement and resistance reduction, the dynamic constant in the impedance data was retrieved by evaluating the relaxation times and relaxation amplitude of the impedance-related processes using deconvolution shown in FIG. 11D. (Ref. Nos. 42,46, 61-63) In Cell #1, two arcs were present in the frequency range between 0.6 and 200 Hz, while arc $P_1$ contributed the highest proportion of resistance and arc $P_2$ is exhibited as a shoulder projecting from $P_1$. By contrast, Cell #2 presented two distinct peaks of $P_1$ and $P_2$ that were both significantly lower than that from Cell #1. Over 504 h operation, the amplitude of the $P_1$ in Cell #2 had little change, while the $P_2$ continually increased with the operation. Meanwhile, the $P_2$ arcs in Cell #2 continuously shifted to the lower frequency end with the increase of operation duration. Based on the impedance deconvolution, the subsequent equivalent circuit fitting and the capacitance analysis were performed on both cells, as shown in FIGS. 12-16. There was increased chemical capacitance (Ref. Nos. 89,126) revealing the possible involvement of the cathode bulk in the overall electrode reaction in the exemplary ALD coated cell.

Among the various transition metal oxides, the CoOx is selected as ALD coating layer in the present example because CoOx is considered to be another promising ORR catalyst in addition to Pt. (Ref. Nos. 122-124) Through synergetic electrochemical interactions, the Pt/(MnCo)Ox couplings were established and uniformly distributed on the entire YSZ surface, the original TPBs and at LSM/LSM surface grain boundaries. Such nanoscale Pt/(MnCo)Ox couplings are stable and dramatically accelerate the ORR. ALD coating significantly enhanced the cell peak power density by 200% over electrochemical operation of 504 h at 750° C. As described herein, for the first time in the field of SOFCs, the present work demonstrated the establishment of minute amount, but stable nano-catalyst induced by ALD coating and resultant large cell performance enhancement over extended electrochemical operations at elevated temperatures.

Based on the deconvolution spectra and the preceding considerations, the proposed equivalent circuit for Cell #1 and Cell #2 contained a series inductance, a series resistance, and two (Cell #1) or three (Cell #2) arc-generating elements (RQ). The most common RQ is a parallel combination of a charge transfer resistance (and a constant phase element CPE). The admittance Y of the CPE is dependent on two parameters, a magnitude |Q| and an exponent n (0<n≤1), $Y=|Q|(j\overline{\omega})^n$. The peak frequency of the (RQ) element was matched to peaks in the deconvolution spectrum through the equation $F_p=1/(2\pi R|Q|)^{1/n}$. For the baseline Cell #1 and ALD coated Cell #2 operated for different durations, FIGS. 12-16 show the RQ contribution plots with the equivalent circuit model used for simulation and Nyquist plots of the impedance data and the processed fitting data. The fitted parameters for the equivalent circuit to impedance data for Cell #1 and Cell #2 are listed in Table 2-2.

TABLE 2-2

Fitted parameters for the equivalent circuit to impedance data for Cell #1 and Cell #2.

| Fitting parameter | Cell #1 at 0 h | Cell #1 at 96 h | Cell #2 at 0 h | Cell #2 at 96 h | Cell #2 at 504 h |
|---|---|---|---|---|---|
| $R_s$ ($\Omega$ cm$^2$) | 0.0534 | 0.0542 | 0.0448 | 0.0434 | 0.0544 |
| f1 (Hz) | 25580.83 | 25965.09 | 26244.18 | 22425.79 | 20378.17 |
| R1 ($\Omega$ cm$^2$) | 0.040 | 0.040 | 0.025 | 0.033 | 0.033 |
| Q1 | 0.0003 | 0.0003 | 0.0005 | 0.0004 | 0.0005 |
| n1 | 1.00 | 1.00 | 1.00 | 1.00 | 1.00 |
| C (F cm$^{-2}$) | $1.54 \times 10^{-4}$ | $1.54 \times 10^{-4}$ | $2.40 \times 10^{-4}$ | $2.15 \times 10^{-4}$ | $2.36 \times 10^{-4}$ |
| f2 | 2697.66 | 3211.44 | 4600.76 | 3750.89 | 3760.63 |
| R2 ($\Omega$ cm$^2$) | 0.064 | 0.081 | 0.029 | 0.035 | 0.054 |
| Q2 | 0.0169 | 0.0199 | 0.0118 | 0.0098 | 0.0059 |
| n2 | 0.77 | 0.72 | 0.84 | 0.86 | 0.87 |
| C (F cm$^{-2}$) | $9.27 \times 10^{-4}$ | $6.13 \times 10^{-4}$ | $1.19 \times 10^{-3}$ | $1.22 \times 10^{-3}$ | $7.8 \times 10^{-4}$ |
| f3 | 32.57 | 29.15 | 88.11 | 74.96 | 53.18 |
| R3 ($\Omega$ cm$^2$) | 0.258 | 0.265 | 0.141 | 0.169 | 0.216 |
| Q3 | 0.2523 | 0.2537 | 0.3366 | 0.2468 | 0.2299 |
| n3 | 0.64 | 0.6514 | 0.59 | 0.63 | 0.64 |
| C (F cm$^{-2}$) | $1.9 \times 10^{-2}$ | $2.06 \times 10^{-2}$ | $1.28 \times 10^{-2}$ | $1.25 \times 10^{-2}$ | $1.39 \times 10^{-2}$ |
| f4 | 4.77 | 4.23 | 2.66 | 2.78 | 3.03 |
| R4 ($\Omega$ cm$^2$) | 0.260 | 0.165 | 0.107 | 0.101 | 0.087 |
| Q4 | 0.3899 | 0.5842 | 1.2420 | 1.1990 | 1.2000 |
| n4 | 0.87 | 0.93 | 0.96 | 0.98 | 1.00 |
| | $1.28 \times 10^{-1}$ | $2.29 \times 10^{-1}$ | $5.6 \times 10^{-1}$ | $5.7 \times 10^{-1}$ | $6.00 \times 10^{-1}$ |
| $R_p$ total ($\Omega$ cm$^2$) | 0.622 | 0.550 | 0.302 | 0.338 | 0.391 |

In Table 2-2, Q (constant phase element) represents a non-ideal capacitor and the associated n parameter indicates the Q's similarity to a true capacitor, for which n=1. R is the resistance of the component. The true capacitance (C) was thus estimated from CPE using the relationship (Ref. Nos. 87-88)

$$C = R^{(\frac{1-n}{n})}Q^{(\frac{1}{n})}$$

For the P1 shown in FIG. 11D, the electrode process corresponded to the (R4Q4) with the equivalent capacitance of $6\times10^{-1}$ F cm$^{-1}$, and the relaxation frequencies of 1-10 Hz. For the P$_2$ shown in FIG. 11D, the electrode process corresponded to the (R3Q3) with the equivalent capacitance of $1.3\times10^{-2}$ F cm$^{-2}$, and the relaxation frequencies of 50-100 Hz.

The above analyzed equivalent capacitance and relaxation frequencies provided characteristic parameters to identify the pertinent electrode process changes introduced by ALD coating in Cell #2. At 0 h operation, in comparison with Cell #1, the Cell #2 had increased capacitance (R4Q4) from $1.28\times10^{-1}$ F cm$^{-2}$ to $5.60\times10^{-1}$ F cm$^{-2}$, revealing the increased chemical capacitance (Ref. No. 89) due to the extended active surface area and involvement of the cathode bulk in the overall electrode in the ALD coated cell.

b. Strongly Coupled Pt/(MnCo)Ox Pairs on the Cathode Surface

The above deconvolution analysis revealed that the ORR kinetics were significantly altered in Cell #2, likely induced by ALD coating. For SOFC, the ORR and oxygen ion transport kinetics are largely affected by the nanostructure of electrode active surfaces that are directly interacting with the reactant gas species. The nanostructure and chemistry from the cathode internal surface of the ALD coated Cell #2 were thus subjected to the TEM imaging and analysis.

Figure 17B:
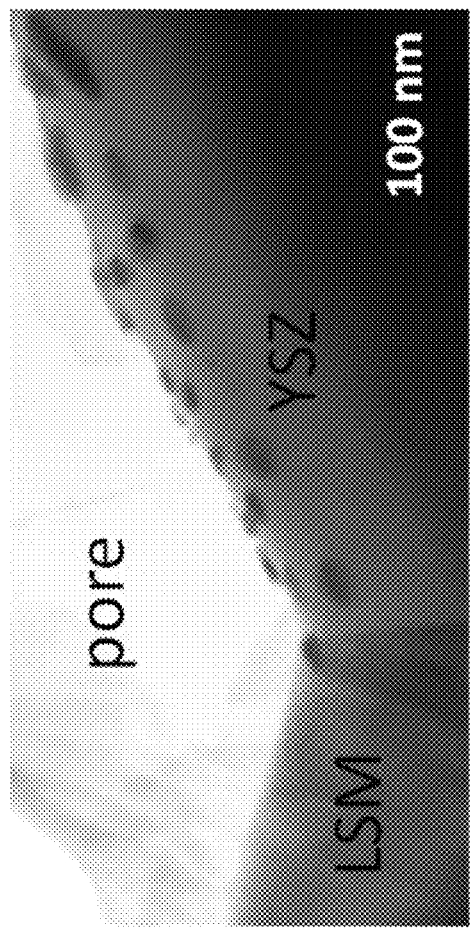
FIGS. 17A-17D show representative TEM images from exemplary Cell #2 LSM cell after 504 h operation, in accordance with Example 2.
Figure 17A:
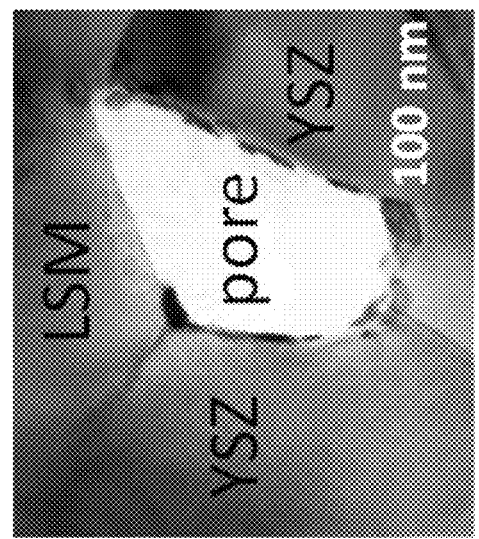
Figure 17D:
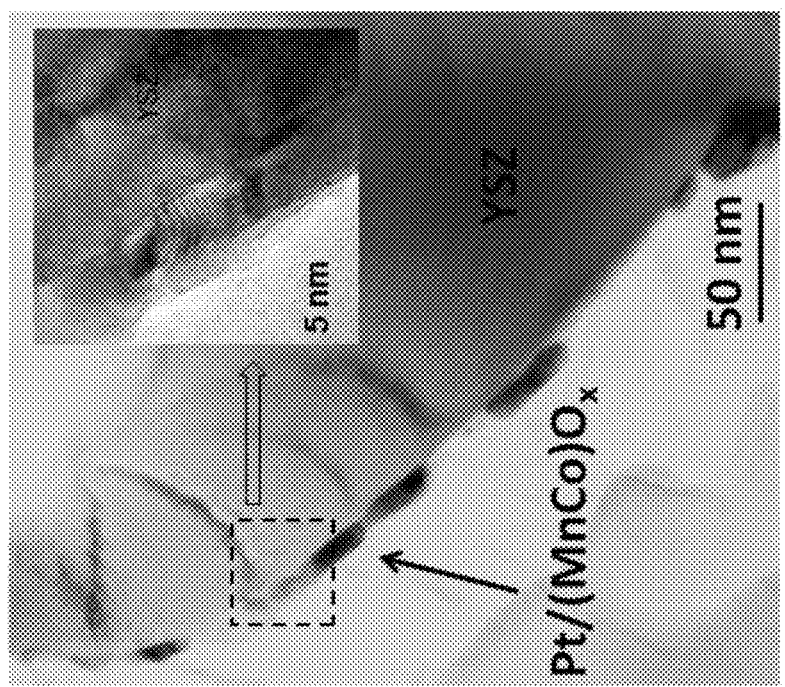
Figure 17C:
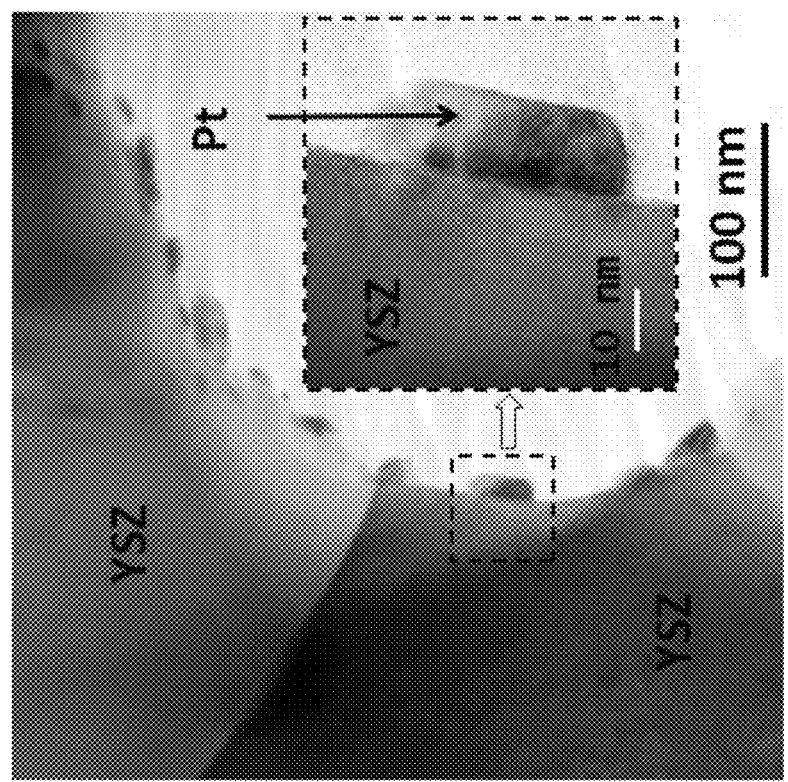
Figure 18:
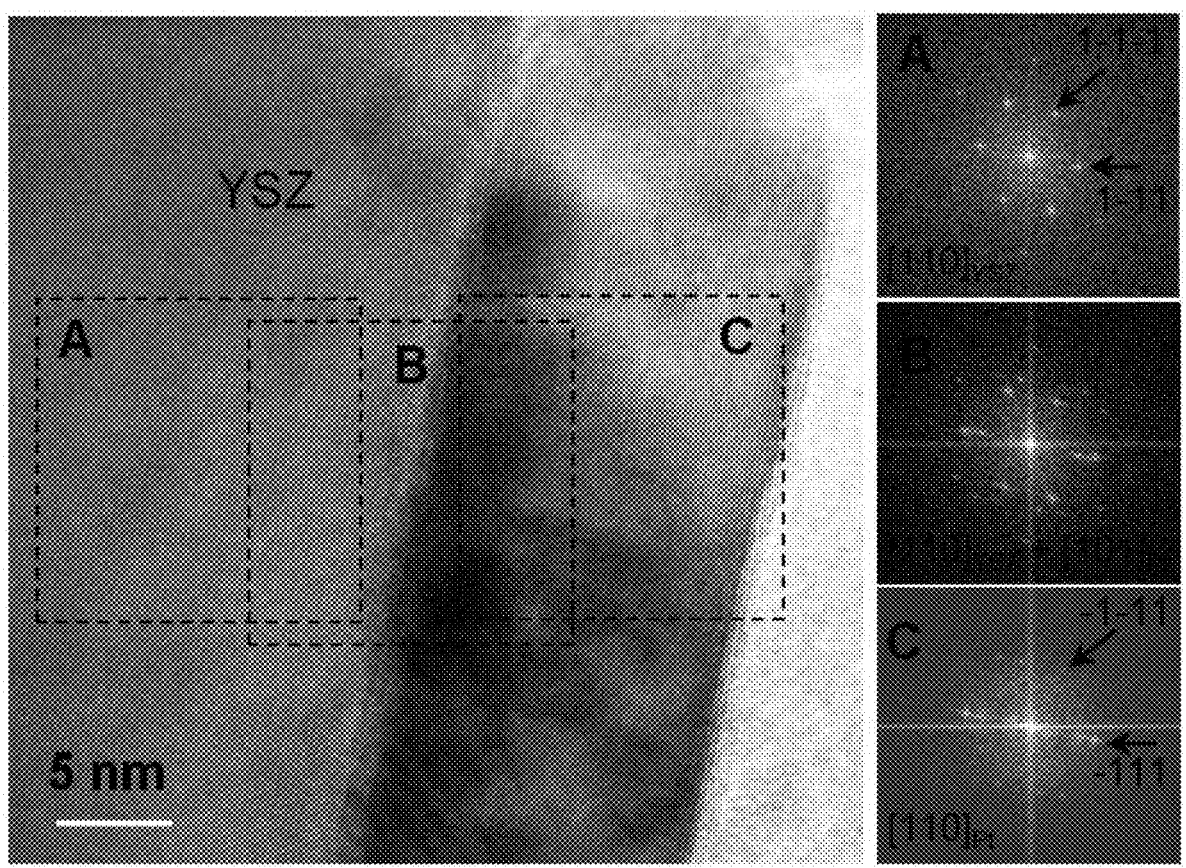
FIG. 18 shows electron diffraction patterns across an electrode surface (A, B, and C) having ALD coated Pt remained to be pristine Pt without alloying other elements; and Pt nano-grains keep well-defined orientation relationship with YSZ.
Figure 19A:
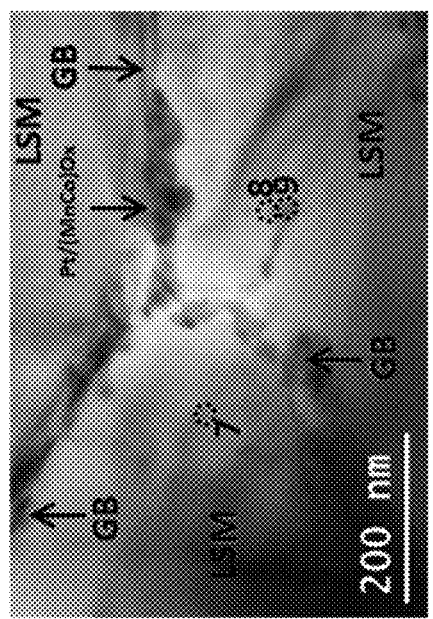
FIGS. 19A-19C show representative TEM images of an exemplary LSM cell, in accordance with Example 2, with local points 1-17 identified in the images that were subjected to EDS analysis, reported in Table 2-3. A local region of EDS analysis, and the overlapping of nanoparticles along the electron beam directions.
Figure 19B:
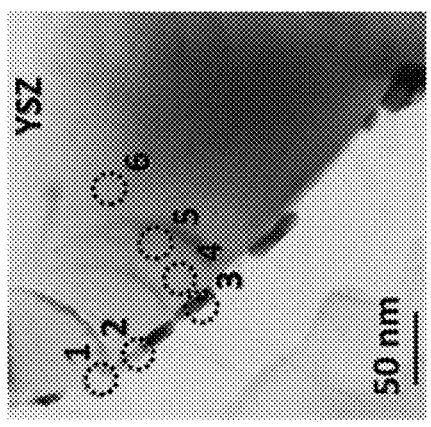
Figure 19C:
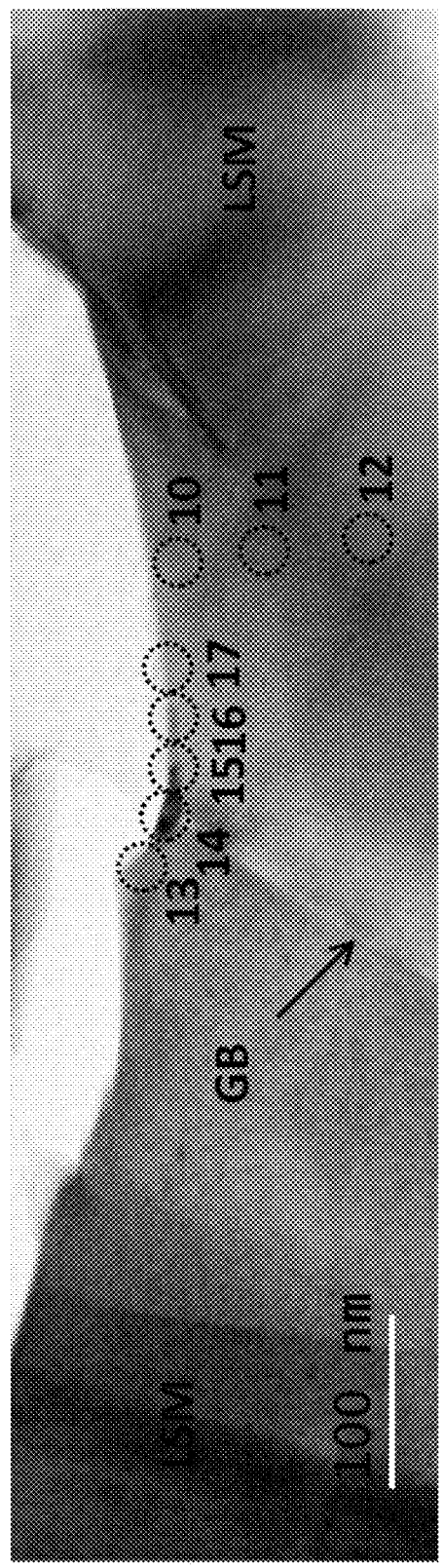

Referring to FIG. 17A, after 504 hours of operation, in Cell #2, Pt particles with the size of about 50 nm were found to populate at LSM/YSZ/air interfaces or the original triple phase boundary (TPB) regions. The formation of Pt particles at TPBs is consistent with previous studies. (Ref. No. 48) The as-deposited ALD Pt nano-particles having about 3 nm in dimension may have been oxidized and vaporized as Pt—O gas species (dominant in PtO$_2$) when the cell was heated to high temperatures in air. However, upon electrochemical operation under current load, oxygen partial pressure was sharply reduced locally at TPBs. PtO$_2$ were thus subsequently reduced to metallic Pt and re-assembled preferentially at the electrochemical reactive sites of TPBs, in areas where the oxygen partial pressure is the lowest on cathode internal surface. (Ref. No. 64) In the cell with unary Pt ALD coating, the Pt re-deposition was merely taking place at the TPBs, and both the YSZ and the LSM surfaces were free of Pt nano-grains. (Ref. Nos. 48,65) However, referring to FIG. 17B-17C, for exemplary Cell #2, in which the two catalysts Pt and Co were applied using ALD, much smaller Pt particles of approximately 10 nm in thickness were uniformly and densely distributed on all YSZ grain surface. Some of Pt possessed well-defined crystal orientation relationship with the YSZ backbone, indicating re-assembly of Pt on the YSZ surface. Referring to FIG. 18, the electron diffraction pattern indicates that Pt nano-grains remained a metallic single phase. Furthermore, Pt grains were found not to solely exist on the YSZ surface. Rather, the Pt grains were consistently coupled with elongated (MnCo)O$_x$ nano-grains. Referring to FIG. 17D, the TEM images, along the electron beam imaging direction, show that the (MnCo)O$_x$ nano-grains were largely overlapping with Pt grains. Referring to FIG. 19, the (MnCo)O$_x$ grains were about 10 nm in thickness and appeared to have various Mn:Co ratios, but always Mn-enriched according to the EDS (see also Table 2-3). Away from the surface grain boundaries regions, the LSM surface was substantially without Pt, and there is very little variation of Co concentration from the LSM grain surface to the grain interior.

Underneath the ALD layer, the YSZ grains did not present detectable Co signals, implying Co does not dope YSZ at all. Nevertheless, the backbone YSZ grains were alloying with a minor amount of Mn and La, with a fixed level of about 3% of Mn/(Zr+Mn+Y+La). Cations Mn and La in YSZ are believed to have migrated from the neighboring LSM, and Mn saturates in the YSZ during the cathode fabrication processing. (Ref. No. 67) Since only CoO$_x$ and Pt were deposited using ALD, it is believed that the formation of Mn-enriched (MnCo)O$_x$ grains were caused by the Mn—Co cation exchanges. Such cation exchange is presumably along the YSZ surface because Co was not observed to alloy with YSZ and Mn saturated with limited solubility in YSZ.

Figure 20A:
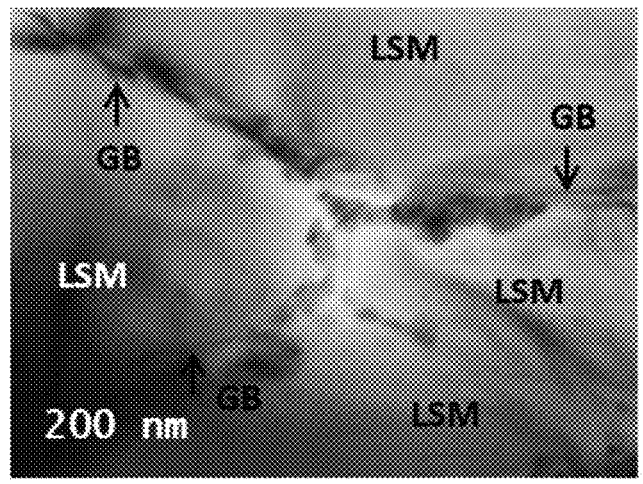
FIGS. 20A-20C show representative TEM images from the Cell #2 LSM cell after 504 h operation, in accordance with Example 2.
Figure 20C:
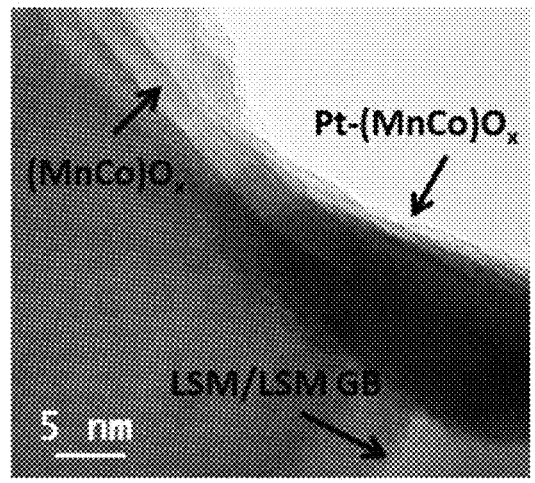
Figure 20B:
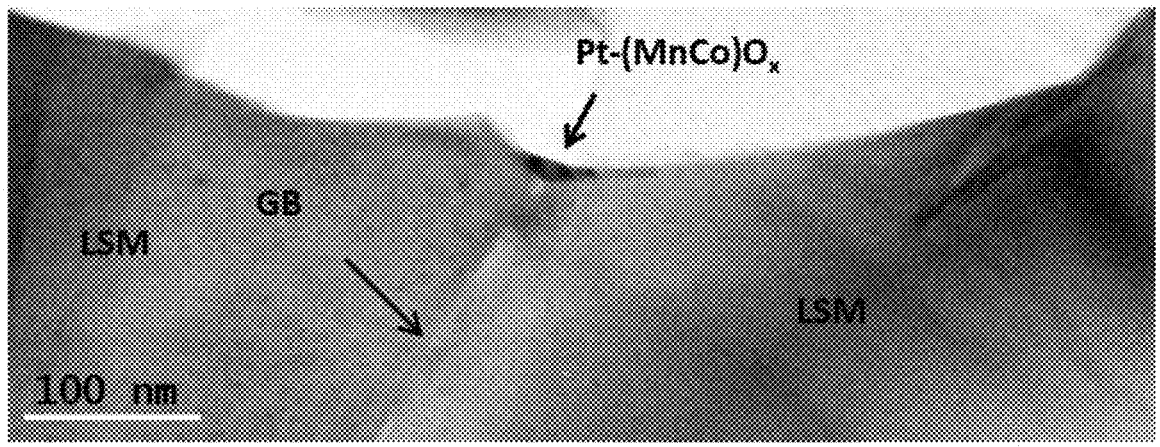

In contrast to the YSZ surfaces, which were decorated by the dense Pt/(MnCo)O$_x$ nano-couplings, in Cell #2, in the regions that are away from the TPBs and grain boundaries, LSM grain surface was substantially free of nanoparticles (shown in FIG. 17A-17B). Interestingly, the Pt/(MnCo)O$_x$ couplings were also observed to be populating along the LSM/LSM surface grain boundaries, as shown in FIG. 20A. The cross-sectional view images of FIG. 20B-20C show that the Pt at LSM/LSM grain boundary region was strip-like and elongated for about 50 nm along the LSM grain surface. Coupling the strip-like Pt, Co appears to concentrate locally at the LSM surface grain boundary region as well (shown in Table 2-2). Directly underneath the Pt/(MnCo)O$_x$ coupling, LSM grains had a constant level of 2% of Co/(Co+Mn), which was the same as the LSM grain interior. Away from the grain boundary/air interface, there was no Mn or Co enrichment on the LSM grain surface.

Figure 22:
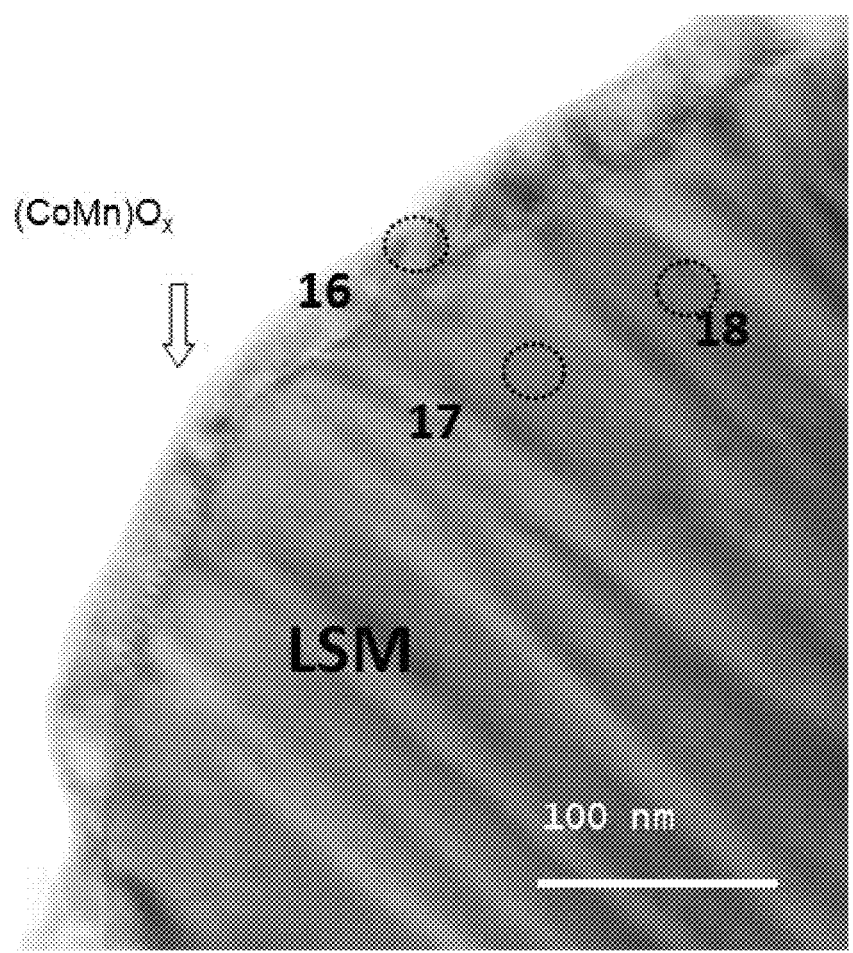
FIG. 22 shows a TEM image of a LSM/YSZ cathode coated with a thicker~40 nm $Co_3O_4$ layer, in accordance with Example 2. Points 18, 19, and 20 identified in the image were subjected to EDS analysis, with results reported in Table 2-3.

The distribution of stable Pt—Co multi catalysts in Cell #2 after extended operation for 504 h at 750° C. is schematized in FIG. 21. The Pt/(MnCo)O$_x$ coupling are densely and uniformly distributed on the YSZ surface, populated at the original TPBs, and dispersed at LSM/LSM surface grain boundaries.

c. Synergetic Interaction of Multi Catalysts, and Evidence of the Ionic Conductivity from Co-Doped LSM Surface Grain Boundaries As mentioned previously, immediately upon electrochemical operation, a comparative ALD coating of approximately 3 nm Pt particles generally experiences acute Pt agglomeration, resulting in agglomerated particles having a size greater than about 70 nm which are reassembled at TPBs. (Ref. No. 48) In contrast, even after 504 h operation, in the exemplary ALD-coated Cell #2, the 10 nm Pt/(MnCo)O$_x$ nano coupling was densely distributed on the YSZ surface. It is theorized that Pt stabilization on the YSZ surface resulted from the ALD coating of Pt with CoO$_x$ together. In the Cell #2, the deposited CoO$_x$ layer on YSZ surfaces incorporated the Mn diffused from the adjacent LSM grains. The incorporation of Mn in the CoO$_x$ ALD layer took place when the cell was heated up to 750° C., as shown in FIG. 22, and Table 2-3. The post TEM indicates that the Co$_3$O$_4$ ALD layer immediately became Mn-doped Co$_3$O$_4$ layer with the nominal chemistry of (Co$_{0.9}$Mn$_{0.1}$)O$_x$ after thermally aged in a box furnace at 750° C. for 2 h. Thus, Mn cation was readily available in the ALD layer, YSZ grain surface was populated with Mn species and possessed certain electrical conductivity. (Ref. No. 125) Meanwhile, since $(MnCo)O_x$ is also an active catalyst, (Ref. No. 70) ORR easily and firstly took place on/adjacent to the $(MnCo)O_x$/YSZ interface, and the reduced oxygen ions could be promptly transported away through the ionic conducting YSZ grains. Such ORR and the associated reduced oxygen partial pressure could further induce the reduction of Pt—O and the sequential local re-assembly of nano-Pt right at the $(CoMn)O_x$/YSZ interface. Consequently, the $(CoMn)O_x$ thus served as incubating catalyst for stabilizing Pt that is much active for ORR over the prolonged electrochemical operation. Overall, electrochemical operation on the backbone surface promoted the synergetic coupling between two catalysts of Pt and $(MnCo)Ox$, and facilitated the formation of $Pt/(MnCo)O_x$ nano-coupling.

of newly implanted effective TPBs. On the other hand, due to the engineered percolating network for the electronic conductor LSM in the LSM/YSZ composite electrode, the grain boundaries on the LSM surface were expected to be percolating over the entire cathode surface thus add active pathways to the oxide ion transport. Therefore, the $Pt/(MnCo)O_x$ couplings at LSM/LSM surface grain boundaries provide active sites and effective TPBs contributing to the ORR as well.

Overall, for the baseline cell in which the kinetics of LSM cathode was surface controlled, the ORR was restricted to the TPBs. In comparison, for the ALD coated cell, active sites extended from original TPBs to YSZ grain surfaces, and grain boundaries of Co-doped LSM. Consequently, there was substantial and active involvement of the cathode bulk in the overall electrode reaction, as evidenced by the

TABLE 2-3

Chemistry analyzed using EDS from the selected points in the FIGS. 19 and 22.

| EDS Spot | Atomic % | | | | | | | | Normalized Formula |
|---|---|---|---|---|---|---|---|---|---|
| | O | La | Sr | Mn | Co | Zr | Y | Pt | |
| 1 | 31.90 | — | — | 56.50 | 0.29 | 5.49 | — | 5.83 | — |
| 2 | 33.04 | — | — | 53.46 | 0.64 | 2.45 | — | 10.40 | — |
| 3 | 15.56 | — | — | 5.81 | 1.26 | 7.52 | — | 69.85 | — |
| 4 | 44.32 | 1.06 | — | 2.41 | — | 44.22 | 7.99 | — | $(Y_{0.14}Mn_{0.04}La_{0.02}Zr_{0.79})O_x$ |
| 5 | 49.87 | 0.87 | — | 2.21 | — | 39.66 | 7.39 | — | $(Y_{0.15}Mn_{0.04}La_{0.02}Zr_{0.79})O_x$ |
| 6 | 57.40 | 0.65 | — | 1.64 | — | 33.99 | 6.32 | — | $(Y_{0.15}Mn_{0.04}La_{0.02}Zr_{0.80})O_x$ |
| 7 | 69.11 | 11.80 | 2.70 | 16.19 | 0.20 | — | — | — | $(La_{0.81}Sr_{0.19})_{0.9}(Mn_{0.99}Co_{0.01})O_x$ |
| 8 | 73.27 | 8.07 | 1.83 | 15.25 | 0.36 | — | — | 1.22 | $(La_{0.82}Sr_{0.18})_{0.63}(Mn_{0.98}Co_{0.02})O_x$ + Pt |
| 9 | 70.45 | 9.00 | 1.92 | 12.67 | 0.44 | 1.15 | — | 4.36 | $(La_{0.82}Sr_{0.18})_{0.83}(Mn_{0.97}Co_{0.03})O_x$ + Pt + Zr |
| 10 | 64.03 | 13.43 | 3.19 | 18.87 | 0.48 | — | — | — | $(La_{0.81}Sr_{0.19})_{0.86}(Mn_{0.98}Co_{0.02})O_x$ |
| 11 | 65.39 | 13.15 | 2.97 | 17.87 | 0.63 | — | — | — | $(La_{0.82}Sr_{0.18})_{0.87}(Mn_{0.97}Co_{0.03})O_x$ |
| 12 | 67.37 | 11.98 | 2.99 | 17.21 | 0.45 | — | — | — | $(La_{0.80}Sr_{0.20})_{0.85}(Mn_{0.97}Co_{0.03})O_x$ |
| 13 | 63.21 | 10.53 | — | 23.37 | — | — | — | 2.89 | — |
| 14 | 44.53 | 4.94 | — | 16.95 | 2.85 | — | — | 30.73 | — |
| 15 | 56.12 | 6.17 | 1.16 | 17.43 | 1.64 | — | — | 17.47 | — |
| 16 | 64.89 | 9.26 | 2.23 | 16.60 | 0.86 | — | — | 6.16 | $(La_{0.81}Sr_{0.19})_{0.66}(Mn_{0.95}Co_{0.05})O_x$ + Pt |
| 17 | 69.35 | 11.45 | 2.42 | 16.10 | 0.22 | 0.47 | — | — | $(La_{0.83}Sr_{0.17})_{0.85}(Mn_{0.99}Co_{0.01})O_x$ |
| 18 | 76.41 | — | — | 2.69 | 20.90 | — | — | — | $(Co_{0.89}Mn_{0.11})O_x$ |
| 19 | 66.00 | 12.55 | 3.50 | 17.95 | — | — | — | — | $(La_{0.78}Sr_{0.22})_{0.89}MnO_x$ |
| 20 | 68.79 | 11.16 | 3.01 | 17.03 | — | — | — | — | $(La_{0.79}Sr_{0.21})_{0.83}MnO_x$ |

In the meantime, it was observed that on LSM backbone, the Pt/Co—Mn—O pairs populated along the LSM/LSM surface grain boundaries. Since Pt only re-assembles at the ORR active sites with lower oxygen partial pressure, the distribution of Pt grains revealed the existence of effective TPBs at the LSM/LSM surface grain boundaries. In general, the LSM is an excellent electronic conductor and has negligible intragranular ionic conductivity. The existence of nano Pt suggests that the Co-doped LSM surface grain boundaries possessed ionic conductivity, as represented schematically in FIG. 21E. The results are consistent with the density function calculation (Ref. No. 74) and provides the first experimental evidence showing that the grain boundaries from electrical conducting LSM could possess substantial ionic conductivity.

d. Nanostructure Origin of Resistance Reduction and the Accelerated ORR

In Cell #2, the $Pt/(MnCo)O_x$ couplings at the original TPB regions have introduced more active catalyst Pt for accelerated ORR. It was observed that on the YSZ surface, the spacing of the neighboring $Pt/(MnCo)O_x$ multi catalysts coupling was approximately 10 nm, which is less than where the active TPB could be extended to through polarization. (Ref. No. 23) Accordingly, for the YSZ surface that was originally electrochemically inactive, there was high density apparent changes in chemical capacitance (Ref. Nos. 89,126) introduced by ALD coating as shown in FIGS. 12-16 and Table 2-2.

In term of the catalysts, more active nano Pt catalyst added to the original TPBs, the newly implanted catalysts and TPBs on the YSZ grain surfaces and the LSM grain surface dramatically accelerated the ORR, promoted the additional oxygen surface diffusion and subsequent dissociative adsorption of oxygen molecules. (Ref. No. 62) Such accelerated ORR was illustrated with the reduced cell impedance as retrieved by the associated deconvolution spectrum. As shown in FIG. 11D, there was a significant reduction of $P_1$ and $P_2$ in the deconvolution spectrum from Cell #2, in comparison with that of the baseline cell. The further electrochemical operation had little effect on $P_1$, implying $Pt/(MnCo)O_x$ couplings are stable. Referring to FIG. 11D, it is especially noted that the peak $P_2$ at 40-80 Hz. $P_2$ in Cell #2 is dramatically lower than that in Cell #1 at 0 h operation. Nevertheless, the amplitude of the $P_2$ in Cell #2 increases and shifts to the lower frequency range with the increase of the operation time. In general, $P_2$ is believed to be associated with the oxygen incorporation, and oxygen ion transport within the cathode, and it strongly depends on the cathode structure and composition. (Ref. No. 46) The shift of $P_2$ arcs in Cell #2 indicates a continuous change in the chemistry of cathode with the increase of operation. As mentioned previously, the as-deposited ALD consisted of the superjacent $CoO_x$ layer, and Co populated on the LSM surface layer. The Co-doped LSM possesses substantial ionic conductivity thus created additional pathways for oxygen transport and extended the TPB length on the LSM surface. There is also evidence showing that the amount of Co level in $La_{0.8}Sr_{0.2}Mn_{1-x}Co_xO_3$ perovskites which results in the maximum oxygen transport was about 25%. (Ref. No. 125) Upon operation, Co from ALD layer diffused into the interior of the bulk LSM, but the supply of Co was very limit due to the thinness of the ALD capping layer. The diminishing Co in the surface layer could have impacted the ionic conductivity of LSM, resulting in the $P_2$ increase. However, referring to FIG. 19A-19C, after 504 h operations at 750° C., it is believed that Co concentration in the LSM reached the equilibrium as evidenced by the very little variation of Co concentration between the LSM surface layer and grain interior. Based on the results, both the $Pt/(MnCo)O_x$ catalytic nano-coupling and enhanced cell performance are expected to prolong upon further electrochemical operations at elevated temperatures.

4. Example 3. Conformal Electrocatalytic Nanoionic Structure

Figure 23A:
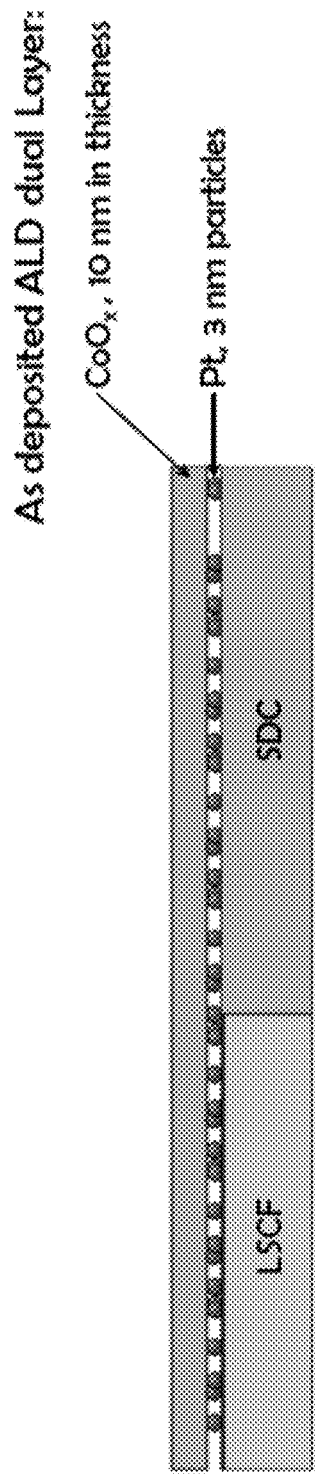
FIGS. 23A-23B shows schematic showing the structure of the as-deposited ALD layer with a thicker CoOx capping layer (10 nm), covering the 3 nm Pt discrete Pt nanoparticles, in accordance with Example 3. The coating is shown as-deposited.
Figure 23B:
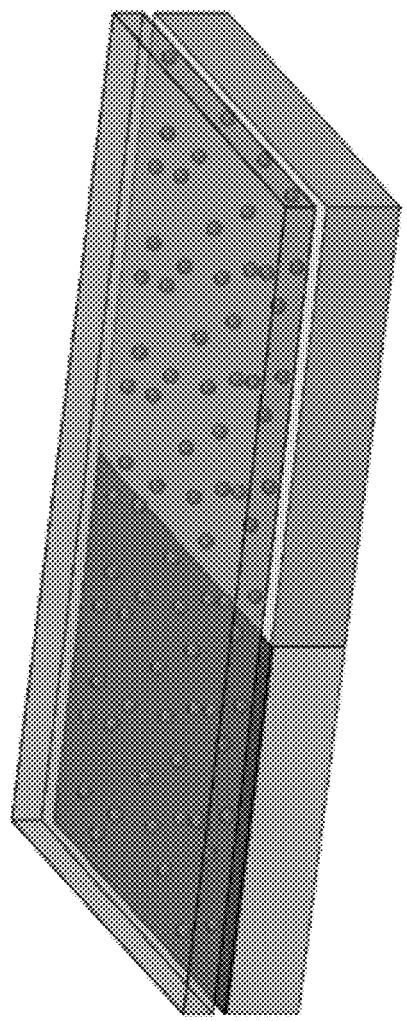
Figure 24:
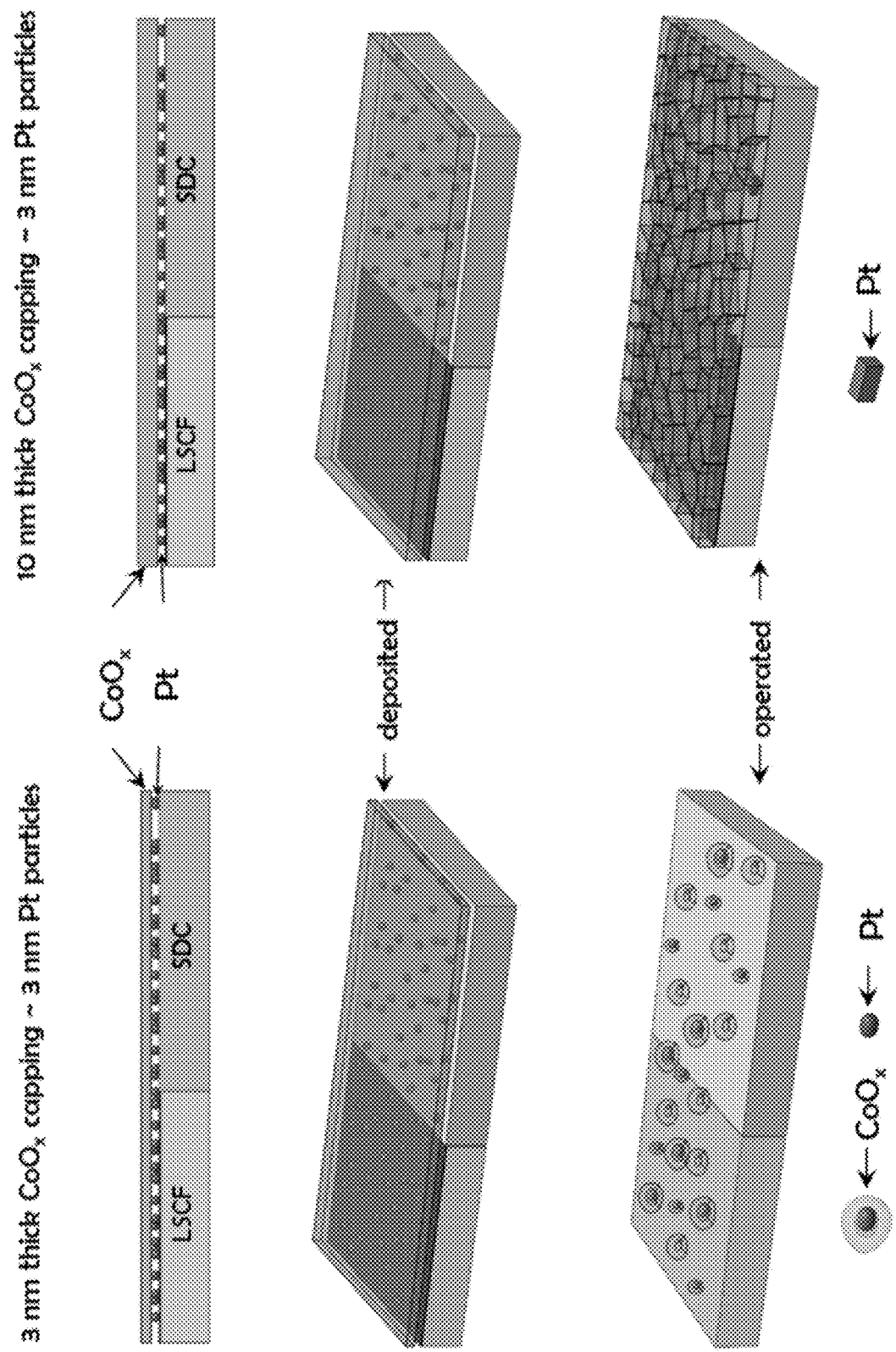
FIG. 24 shows a schematic representation of an exemplary ALD layer and core-shell structure as-deposited (top 2 row) and after cell operation (bottom row) of two different layer thicknesses: (a) a thinner CoOx capping layer as-deposited (top 2 schematics of the left column) and after cell operation (bottom schematic of left column); and (b) a thicker CoOx capping layer as-deposited (top 2 schematics of the right column) and after cell operation (bottom schematic of right column).

In this example, an exemplary ALD-coated fuel cell with a conformal nanoionic structure was prepared, and evaluated and compared to a baseline control cell. Commercially-available anode-supported solid oxide fuel cells with LSCF/SDC cathodes (Cell #1) were provided as baseline control cells. Exemplary Cell #2 and Cell #3 were prepared by subjecting the commercially-available cells to ALD coating, using methods described above. For this example, the as-deposited ALD multi-layer consisted of a subjacent Pt layer comprising a minute amount of Pt providing an ultra-thin layer (approximately 1 nm particles), where the electrochemical reactions were typically taking place. On the top of Pt, a superjacent Co-Oxide layer was deposited as the outmost surface layer. The superjacent layer of CoOx was controlled to be continuous layer of $Co_3O_4$ with uniform thickness of approximately 10 nm schematically shown in FIG. 23.

Figure 25:
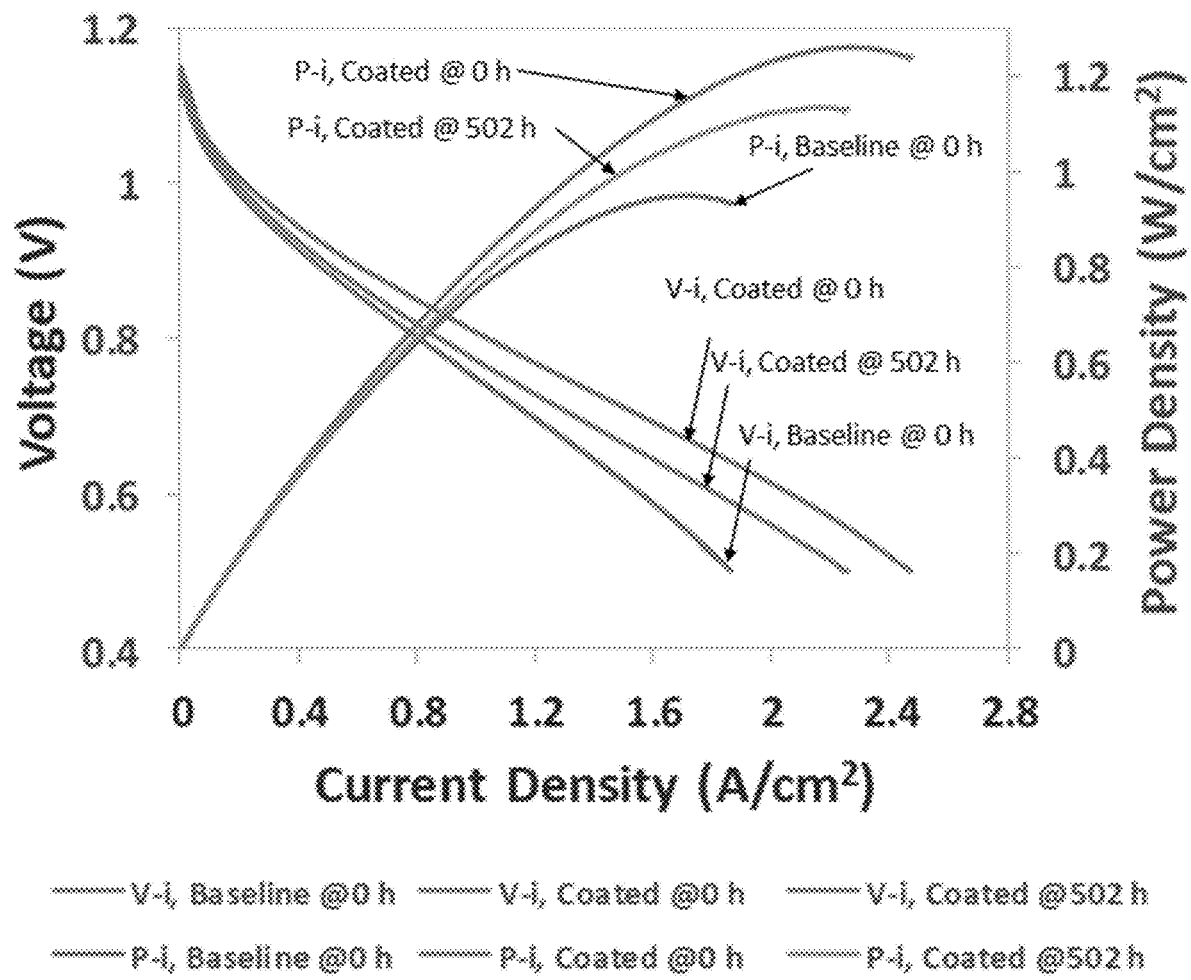
FIG. 25 shows data electrochemical performance and impedance data for Cell #1 LSCF/SDC baseline cell, Cell #2 LSCF/SDC cell with Pt and 10 nm $Co_3O_4$ layer and operated at 750 C, Cell #3 LSCF/SDC cell with Pt and 10 nm $Co_3O_4$ layer and operated at 650° C., in accordance with Example 3.

Electrochemical performance and impedance were observed for Cells #1, #2, and #3, operating at 650° C. and 750° C. The results are summarized in FIG. 25 and Table 3-1.

in Table 3-1, the coating decreased both Rs & Rp, as compared to the baseline, with the largest reduction in ohmic resistance of Rs.

Figure 26B:
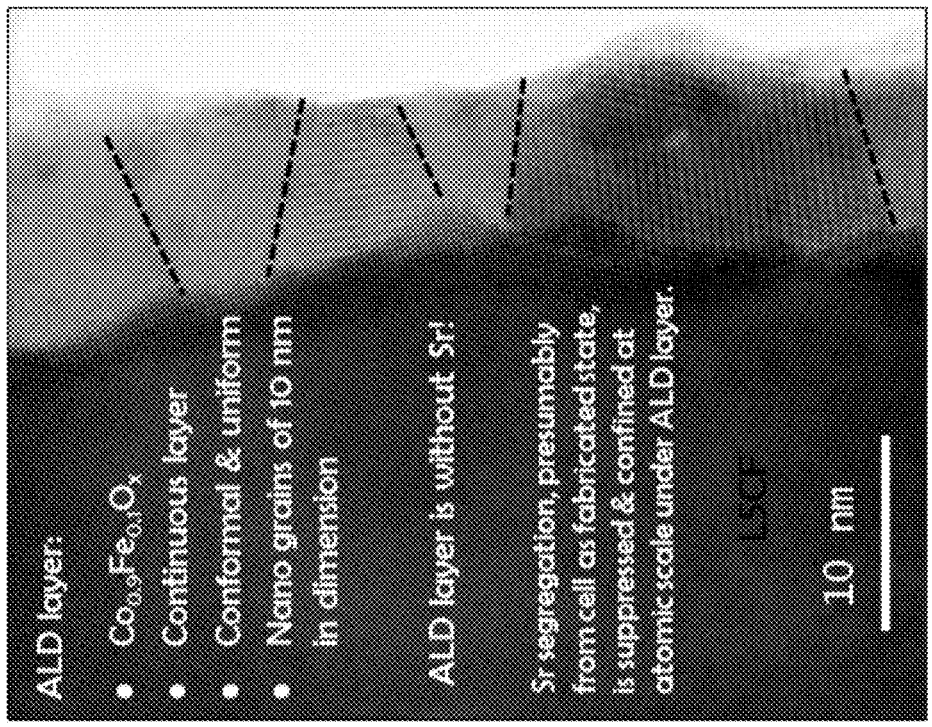
FIGS. 26A and 26B show TEM images of an exemplary cell with LSCF/SDC cathode ALD coated with ultra-thin layer of Pt, and superjacent CoOx layer, shown after electrochemical operation for 500 hours, in accordance with Example 3. The images show uniform coating, with continuous multi-layer structure, on internal surface of LSCF, after 500 hours operation.
Figure 26A:
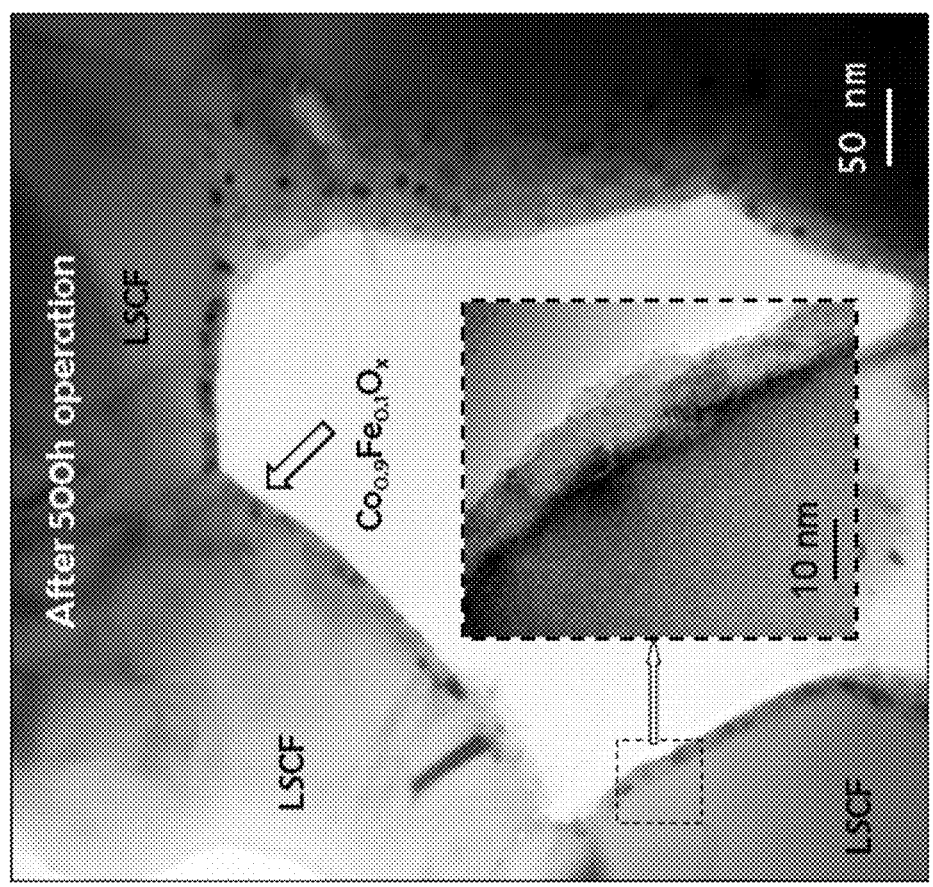

Referring to FIG. 26A-26B, TEM images of the internal surface of the cell taken after 500 hours of operation show that the multi-layer nanostructure was stable after 500 hours operation. Upon operation, the superjacent CoOx was nanograined with approximately 10 nm in dimension and possessed high angle grain boundaries. In other words, there was formation of CoOx nanoionics on the LSCF surface and the high density of grain boundaries accelerating the oxygen ion transport that largely decrease the series resistance as evidence in the reduced series resistance shown in FIG. 25.

It was also observed that the superjacent layer of nano-grained continuous was inherently Cr tolerant. The interaction between the LSCF and Fe—Cr alloy mainly results in the formation of $SrCrO_4$. (Ref. No. 90), In this example, no $Co_{3-x}Cr_xO_4$ spinels were observed on LSCF cathodes in contact with Fe—Cr alloy interconnect (Ref. Nos. 91-92) This demonstrates that the CoOx nanoionics are Cr-tolerant, and could act as physical barrier for preventing Cr diffusion into the cathode backbone, so as to mitigate the Cr poisoning on the cathode.

Except for Cr contamination, an additional source of SOFC performance degradation is rooted from the surface segregation of Sr species in Sr containing perovskite cathodes. For example, formation of a 35-75 nm thick SrO layer has been observed on LSCF after cell operation at 750° C. for 500 h. (Ref. No. 93) While the phenomenon of surface Sr enrichment has been actively and systematically studied during the past decade, a means of alleviating such a detrimental result is proven to be very challenge to develop and the effective method to prevent the Sr surface segregation is currently lacking.

Figure 27B:
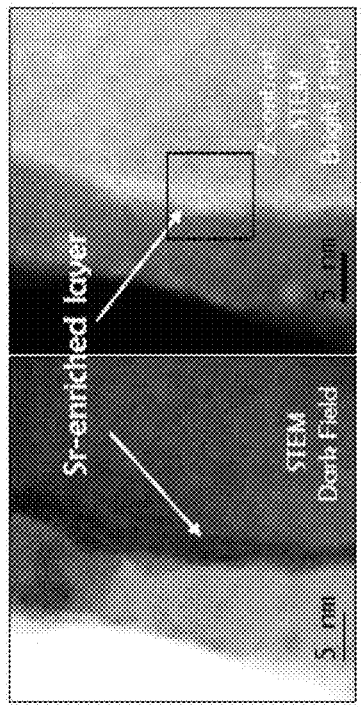
FIGS. 27A-27C show TEM images of an exemplary cell with LSCF/SDC cathode ALD coated with ultra-thin layer of Pt, and superjacent CoOx layer, shown after electrochemical operation for 500 hours, in accordance with Example 3.
Figure 27C:
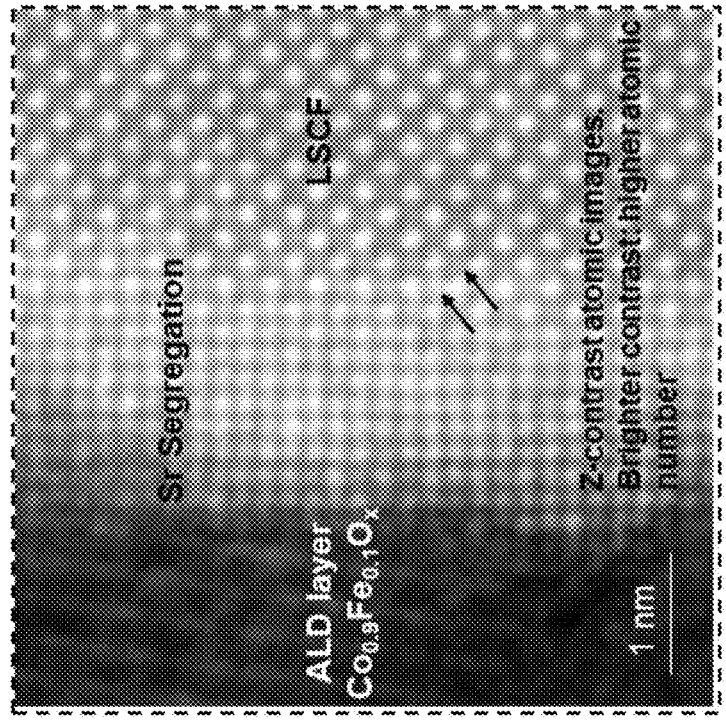
Figure 27A:
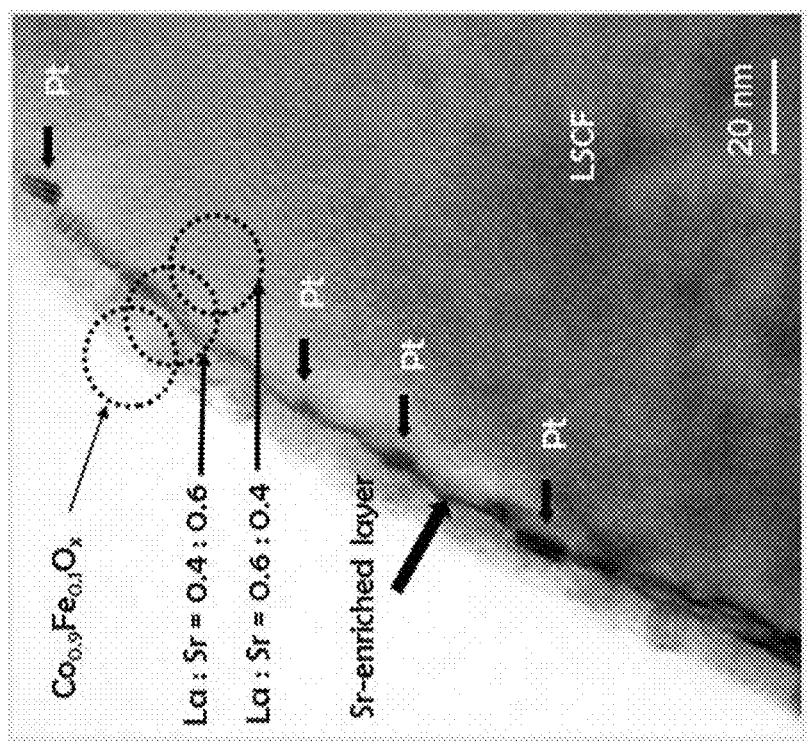
Figure 28:
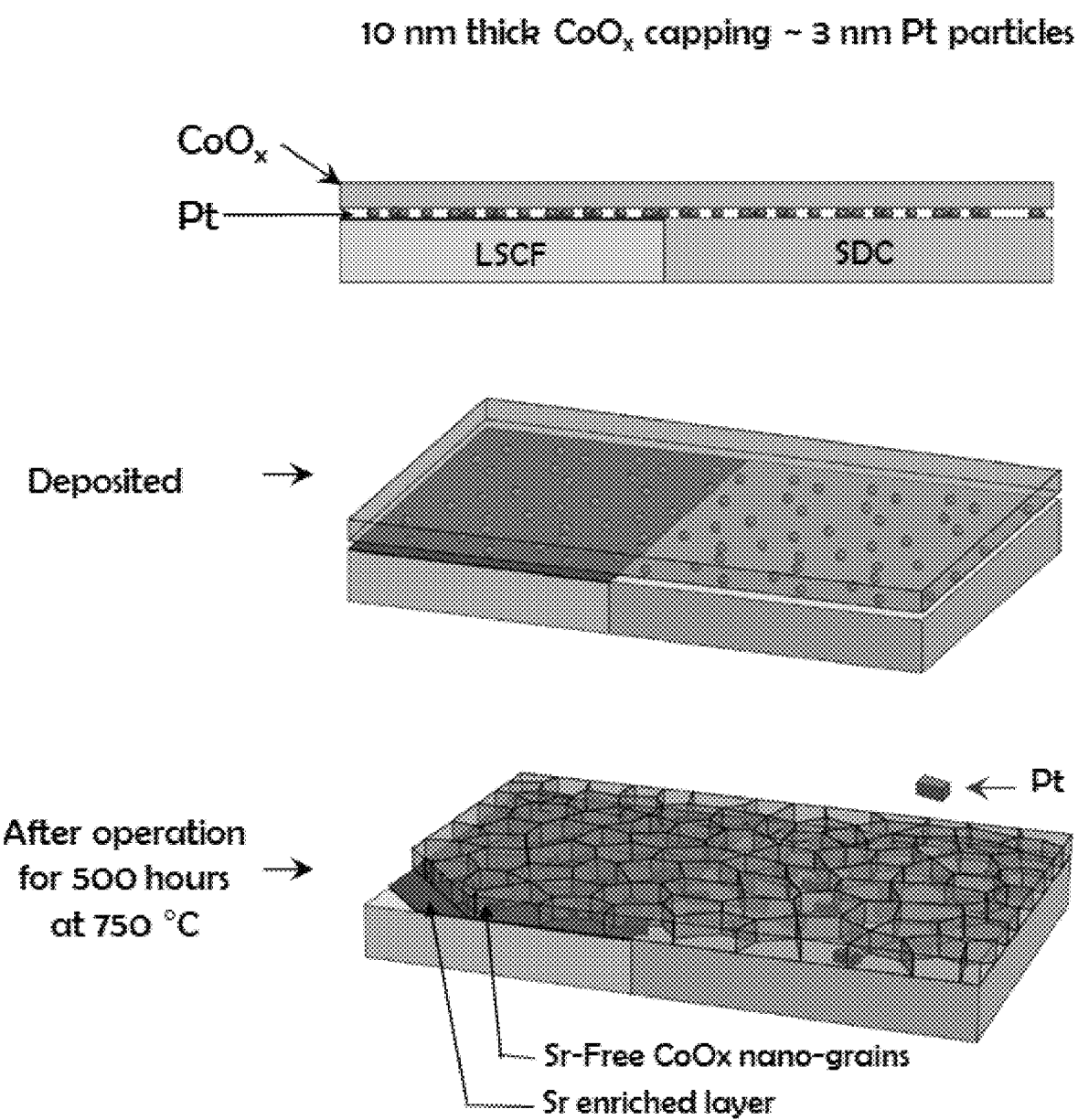
FIG. 28 shows a schematic representation of the nano-structure of an exemplary LSCF/SDC cathode ALD-coated with a layer of Pt, and superjacent CoOx layer, shown in as-deposited state (top 2) and after operation for 500 hours at 750° C. (bottom), in accordance with Example 3.

In this example, it was also observed that the superjacent layer of electrocatalytic $CoO_x$ nanoionics also suppressed the Sr surface segregation. Referring to FIG. 27, TEM images of the internal surface of the cell taken after 500 hours continuous electrochemical operation at 750° C., show that the ALD layer of CoOx nanoionics were free from Sr. Meanwhile, the Sr-enriched surface layer, that is presumably from the as-made state of the cathode backbone, was confined at the interface between the LSCF and CoOx nanoionics having a thickness of about 1 nm, as shown in the TEM images of FIGS. 27A-27C and represented schematically in FIG. 28.

TABLE 3-1

Electrochemical performance and impedance data for Cell #1 LSCF/SDC baseline cell, Cell #2 LSCF/SDC cell with Pt and 10 nm $Co_3O_4$ layer and operated at 750° C., Cell #3 LSCF/SDC cell with Pt and 10 nm $Co_3O_4$ layer and operated at 650° C.

| LSCF/SDC Cell | Surface architecture | Temperature | hour | Rs/Ω $cm^2$ | Rp/Ω $cm^2$ | Peak power | Performance enhancement |
|---|---|---|---|---|---|---|---|
| #1 | Baseline | 750 | 0 | 0.082 | 0.259 | 0.949 | / |
|  |  | 650 | 0 | 0.209 | 0.468 | 0.462 | / |
| #2 | ALD Coated | 750 | 0 | 0.068 | 0.274 | 1.259 | 1.33 |
|  |  |  | 502 | 0.083 | 0.322 | 1.134 | 1.2 |
| #3 | ALD coated | 650 | 0 | 0.176 | 0.415 | 0.617 | 1.34 |

The results demonstrate that as compared to the baseline cell, the ALD coating resulted in a 130% enhancement in cell power density at 650 & 750° C. operating temperatures, and 120% enhancement in cell power density after 500 h @ 750° C. In addition, the ALD coating provided a significant reduction of the series and polarization resistance. As shown

5. Example 4. Discrete Nano Core-Shell Structured Electrocatalyst

Figure 29B:
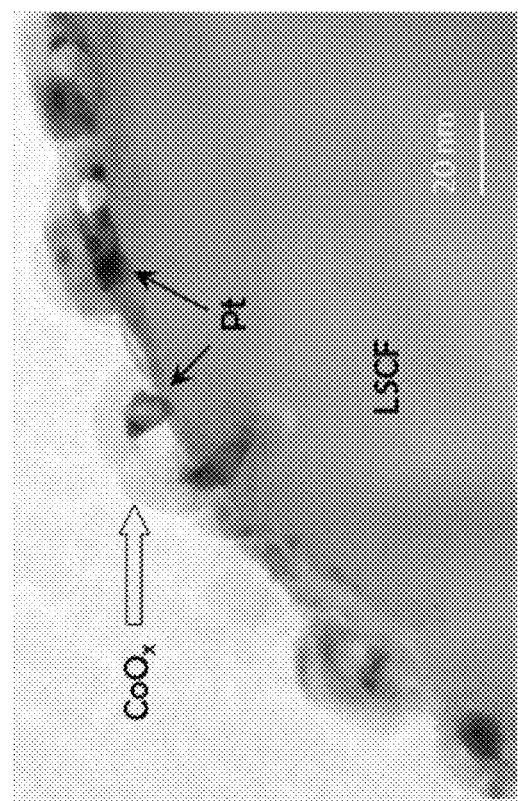
FIG. 29B shows TEM images showing the core-shell structures implanted on LSCF/SDC backbone after cell operation, in accordance with Example 4.
Figure 29A:
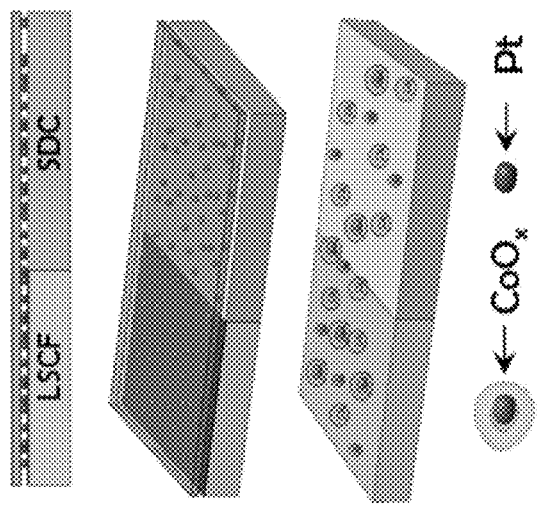
FIG. 29A shows schematic representation of ALD layer and core-shell structure as-deposited (top 2) and after cell operation (bottom)

In this example, cell samples were prepared to demonstrate that the ALD nanoionics can be controlled to provide discrete core-shell structures when the thickness of superjacent CoOx is reduced. In this Example, commercially-available anode-supported solid oxide fuel cells with LSCF/SDC cathodes were provided. A layer of Pt was applied onto a LSCF/SDC internal surface of the cell, providing a layer of Pt particles having about 3 nm diameter. On the top of Pt, a superjacent layer of Co-Oxide was deposited, having a thickness of approximately 3 nm. A schematic of the as-deposited ALD layers is schematically shown in FIG. 29A.

Figure 30C:
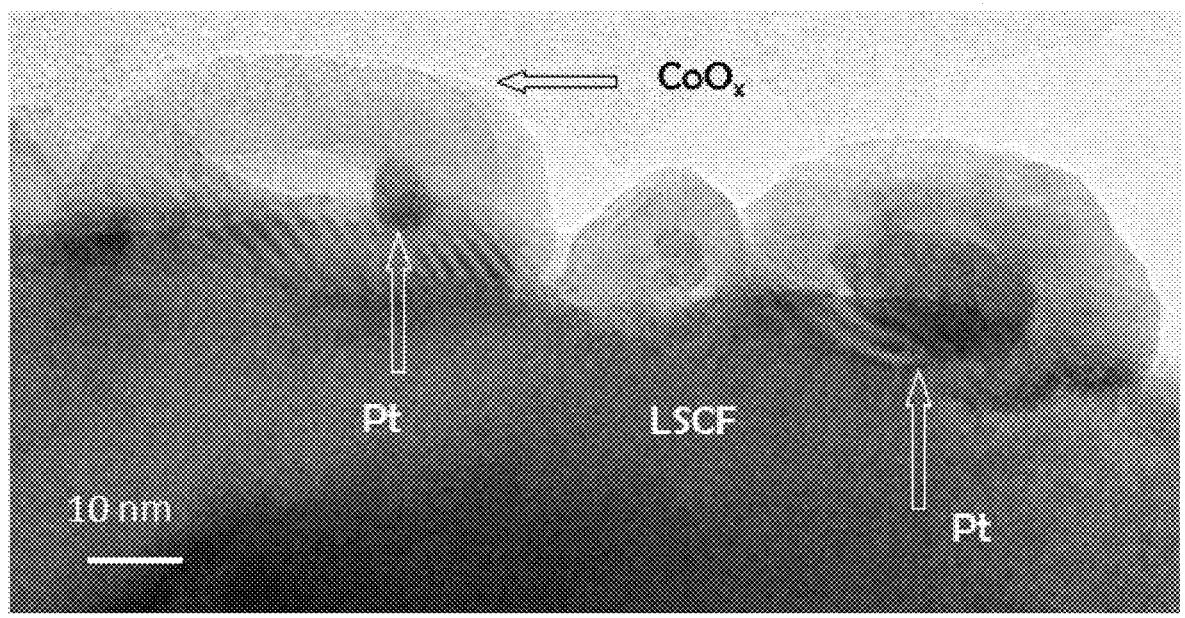

After electrochemical operation, nanostructure analysis of the cathode indicates that during operation, a core-shell structure formed on the cathode surface, the core-shell structure having an overall thickness of about 20 nm, with CoOx as shell and Pt as core. Such core-shell structures appear to be uniformly coated on the internal surface of LSCF/SDC, with the core of Pt of about 5 nm, and shell of Shell of CoOx of about 8 nm in thickness, as shown in the TEM image in FIG. 29B, and represented schematically in FIG. 29A. Referring to FIG. 30A-30C, further TEM images of the internal surface of the cell show that the core-shell structure was relatively uniform across the entire surface of cathode backbone.

Such core-shell structured multi electrocatalyst demonstrated similar function to that layered nanoionics with discrete Pt as shown in previous examples. The core-shell structures implanted on LSCF/SDC surface demonstrated multifunction of improving the catalytic activity, increasing the conductivity, intrinsically being Cr tolerant and simultaneously suppressing the Sr surface segregation. Such multifunction increased the electrode and cell power density and longevity.

It will be apparent to those skilled in the art that various modifications and variations can be made in the present disclosure without departing from the scope or spirit of the disclosure. Other embodiments of the disclosure will be apparent to those skilled in the art from consideration of the specification and practice of the disclosure disclosed herein. It is intended that the specification and examples be considered as exemplary only, with a true scope and spirit of the disclosure being indicated by the following claims.

What is claimed is:

1. A method of forming an electrocatalyst structure on an electrode, comprising:
    depositing a first layer on the electrode using atomic layer deposition (ALD), wherein the first layer comprises a plurality of discrete nanoparticles of a first electrocatalyst; and
    depositing one or more of a second layer on the first layer and the electrode using ALD, wherein the each of the one or more second layers independently comprises a second electrocatalyst; and
    wherein the first layer and the one or more second layers collectively form a deposited electrocatalyst structure on the electrode;
    subjecting the electrode to electrochemical operation at a temperature equal to or greater than about 650° C., thereby transforming deposited electrocatalyst structure to an operated electrocatalyst structure.

2. The method of claim 1, wherein the first electrocatalyst comprises a noble metal.

3. The method of claim 2, wherein the first electrocatalyst comprises platinum (Pt).

4. The method of claim 1, wherein the discrete nanoparticles of the deposited electrocatalyst structure have an average particle size of less than about 200 nanometers in the largest dimension.

5. The method of claim 1, wherein the second electrocatalyst comprises an electronically conducting material that has catalytic activity for ORR.

6. The method of claim 1, wherein the second electrocatalyst comprises a metal oxide comprising one or more transition metals.

7. The method of claim 1, wherein the second electrocatalyst comprises a metal oxide comprising manganese, cobalt, or both, having the formula $(Mn_{1-y}Co_y)_3O_4$, wherein y has a value from 0.0 to 1.0.

8. The method of claim 1, wherein each of the one or more second layers of the deposited electrocatalyst structure, independently, has a thickness of from about 1 nanometers to about 200 nanometers.

9. The method of claim 1, wherein the subjecting the electrode to electrochemical operation results in a plurality of pores or fissures extending through a thickness of the second layer.

10. The method of claim 1, wherein the subjecting the electrode to electrochemical operation results in the formation of a plurality of discrete nanograins of the second electrocatalyst separated by intergranular grain boundaries.

11. The method of claim 1, wherein the subjecting the electrode to electrochemical operation results in the formation of a plurality of triple phase boundaries at intergranular grain boundaries.

12. The method of claim 1, wherein the subjecting the electrode to electrochemical operation results in at least a portion of the plurality of the nanoparticles of the first electrocatalyst populating adjacent one or more of triple phase boundaries at intergranular grain boundaries.

13. The method of claim 1, wherein the subjecting the electrode to electrochemical operation results in the formation of a plurality of coupled grains comprising one of the plurality of nanoparticles of the first electrocatalyst, and a nanograin of the second electrocatalyst.

14. The method of claim 1, wherein the subjecting the electrode to electrochemical operation results in the formation of a plurality of core-shell nanostructures, each core-shell nanostructure comprising a core comprising a nanoparticle of the first electrocatalyst, that is at least partially covered by a shell comprising the second electrocatalyst.

* * * * *